United States Patent
Tsuji et al.

(10) Patent No.: US 10,308,735 B2
(45) Date of Patent: Jun. 4, 2019

(54) MATERIAL FOR ORGANIC LIGHT-EMITTING DEVICE AND ORGANIC LIGHT-EMITTING DEVICE INCLUDING THE SAME

(71) Applicant: Samsung Electronics Co., Ltd., Suwon-si, Gyeonggi-do (KR)

(72) Inventors: Masashi Tsuji, Kanagawa (JP); Koji Hasegawa, Kanagawa (JP); Makoto Taguchi, Kanagawa (JP)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 442 days.

(21) Appl. No.: 14/972,853

(22) Filed: Dec. 17, 2015

(65) Prior Publication Data

US 2016/0181535 A1 Jun. 23, 2016

(30) Foreign Application Priority Data

Dec. 18, 2014 (JP) ................... 2014-256674
Oct. 5, 2015 (KR) .............. 10-2015-0139993

(51) Int. Cl.
  *H01L 51/00* (2006.01)
  *C08F 32/00* (2006.01)
  *H01L 51/50* (2006.01)

(52) U.S. Cl.
  CPC ............ *C08F 32/00* (2013.01); *H01L 51/004* (2013.01); *H01L 51/0043* (2013.01);
  (Continued)

(58) Field of Classification Search
  CPC ............. H01L 51/0035; H01L 51/0043; H01L 51/5056; C08F 26/00; C08F 32/00
  See application file for complete search history.

(56) References Cited

U.S. PATENT DOCUMENTS 6,777,111 B1    8/2004   Tanaka et al.
7,425,375 B2 *    9/2008   Shirai ................... C09K 11/06
                                                              257/40

(Continued)

FOREIGN PATENT DOCUMENTS

JP    2001-110572 A    4/2001
JP    2003-026615 A    1/2003
(Continued)

OTHER PUBLICATIONS

Guliev "Ultraviolet Absorption Spectra of 2-Substituted-1-(p-Vinylphenyl) Cyclopropanes", Journal of Structural Chemistry. vol. 50, No. 4, pp. 693-695, 2009.*

(Continued)

*Primary Examiner* — Devina Pillay
(74) *Attorney, Agent, or Firm* — Cantor Colburn LLP

(57) ABSTRACT

A material for an organic light-emitting device, the material including a repeating unit represented by Formula 1:

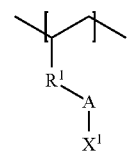

Formula 1 wherein, in Formula 1, $R^1$, A, and $X^1$ are the same as described in the specification.

17 Claims, 1 Drawing Sheet

(52) U.S. Cl.
CPC ...... *H01L 51/0059* (2013.01); *H01L 51/0067* (2013.01); *H01L 51/0072* (2013.01); *H01L 51/0085* (2013.01); *H01L 51/5056* (2013.01)

(56) References Cited

U.S. PATENT DOCUMENTS

| | | | |
|---|---|---|---|
| 7,691,493 B2 * | 4/2010 | Kamatani | C08G 61/02 257/40 |
| 8,562,870 B2 | 10/2013 | McCulloch et al. | |
| 8,785,007 B2 | 7/2014 | Nagai et al. | |
| 8,795,852 B2 | 8/2014 | Asari et al. | |
| 2006/0151782 A1 | 7/2006 | Holmes et al. | |
| 2007/0255003 A1 * | 11/2007 | Watanabe | C07C 13/615 524/553 |
| 2008/0154005 A1 | 6/2008 | Suzuki et al. | |
| 2016/0223723 A1 | 8/2016 | Han et al. | |
| 2016/0225998 A1 | 8/2016 | Kato et al. | |
| 2017/0168324 A1 | 6/2017 | Kim et al. | |
| 2018/0059444 A1 | 3/2018 | Lee et al. | |

FOREIGN PATENT DOCUMENTS

| | | | | |
|---|---|---|---|---|
| JP | 2003-026617 A | | 1/2003 | |
| JP | 2005-285381 | * | 10/2005 | ............ H05B 33/14 |
| JP | 2006-237592 A | | 9/2006 | |
| JP | 2006-249229 | * | 9/2006 | ............ C08G 61/02 |
| JP | 2007-246440 A | | 9/2007 | |
| JP | 2011-026515 A | | 2/2011 | |
| JP | 2012-182228 A | | 9/2012 | |
| JP | 2013-209300 A | | 10/2013 | |
| WO | 2010-098246 A1 | | 9/2010 | |
| WO | 2011-033753 A1 | | 3/2011 | |

OTHER PUBLICATIONS

Funyu, JP2006-249229, Machine Translation, Sep. 2006.*
JP2005-285381, Watanabe, Machine Translation, Oct. 2005.*

* cited by examiner

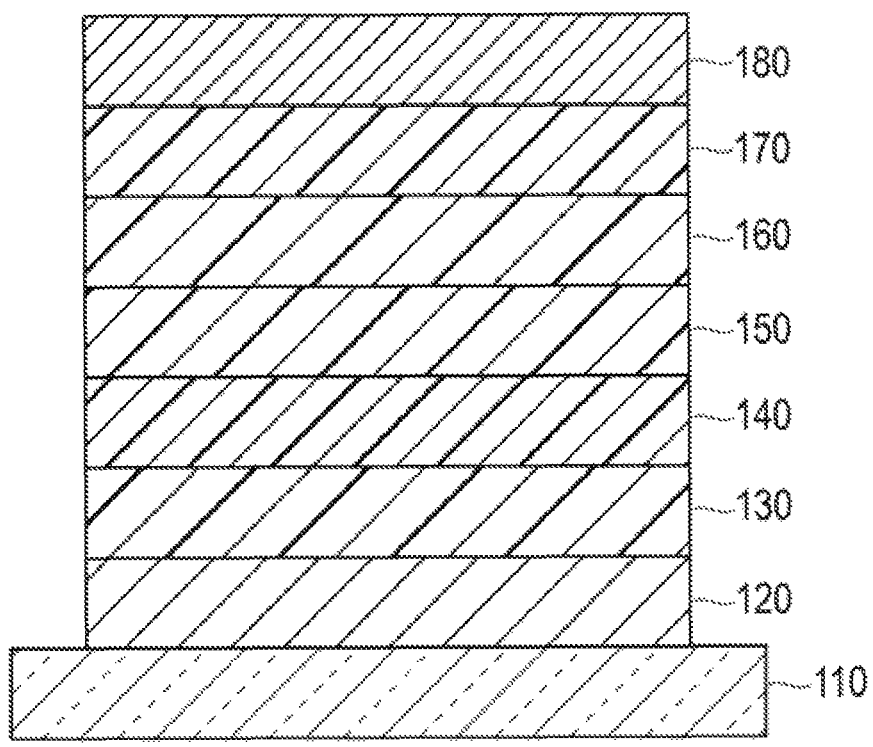

MATERIAL FOR ORGANIC LIGHT-EMITTING DEVICE AND ORGANIC LIGHT-EMITTING DEVICE INCLUDING THE SAME

CROSS-REFERENCE TO RELATED APPLICATIONS

This application claims priority to and the benefits of Japanese Patent Application No. 2014-256674, filed on Dec. 18, 2014, in the Japanese Intellectual Property Office, and Korean Patent Application No. 10-2015-0139993, filed on Oct. 5, 2015, in the Korean Intellectual Property Office, the content of which are incorporated herein in their entirety by reference.

BACKGROUND

1. Field

The present disclosure relates to a material for an organic light-emitting device and an organic light-emitting device including the same.

2. Description of the Related Art

Organic light emitting devices are self-emission devices that have wide viewing angles, high contrast ratios, and short response times. In addition, the OLEDs have excellent brightness, driving voltage, and response speed characteristics, and produce full-color images.

In an example, an organic light-emitting device includes an anode, a cathode, and an organic layer that is disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. Carriers, such as holes and electrons, recombine in the emission layer to produce excitons. These excitons change from an excited state to a ground state, thereby generating light.

Various types of organic light emitting devices are known. However, there still remains a need in OLEDs having low driving voltage, high efficiency, high brightness, and long lifespan.

SUMMARY

Provided are a material for an organic light-emitting device and an organic light-emitting device including the same. The material for an organic light-emitting device includes an ethylene skeleton as a main chain and a charge transport unit as a side chain.

Additional aspects will be set forth in part in the description which follows and, in part, will be apparent from the description, or may be learned by practice of the presented exemplary embodiments.

According to an aspect of an exemplary embodiment, a material for an organic light-emitting device includes a repeating unit represented by Formula 1:

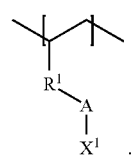

Formula 1

In Formula 1, $R^1$ is selected from a single bond, a phenylene group, and a group represented by one of Formulae a1 to a9:

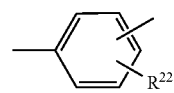

a1

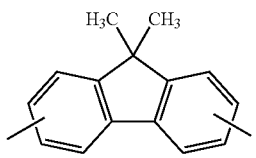

a2 a3

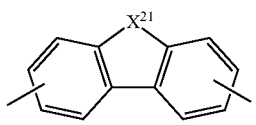

a4

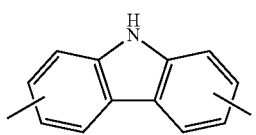

a5

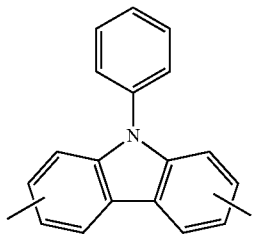

a6 a7

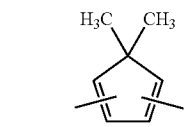

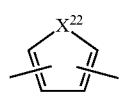

a8

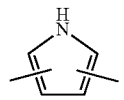

-continued

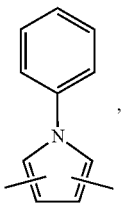

a9 wherein, in Formulae a1 to a9, $R^{22}$ is a $C_1$-$C_6$ alkyl group, $X^{21}$ and $X^{22}$ are each independently selected from an oxygen atom and a sulfur atom;

A is a divalent saturated aliphatic cyclic group; and $X^1$ is a charge transport unit.

According to an aspect of another exemplary embodiment, an organic light-emitting device includes:

a first electrode;

a second electrode; and an organic layer between the first electrode and the second electrode, wherein the organic layer includes the material for an organic light-emitting device represented by Formula 1.

BRIEF DESCRIPTION OF THE DRAWING

These and/or other aspects will become apparent and more readily appreciated from the following description of the exemplary embodiments, taken in conjunction with FIG. 1 which is an illustration of a cross-sectional view of an organic light-emitting device according to an example embodiment.

DETAILED DESCRIPTION

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims. In the drawings, like reference numerals denote like elements throughout, and thus redundant description thereof will be omitted.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." As used herein, the terms such as "comprising", "including", "having", or the like are intended to indicate the existence of the features regions, integers, steps, operations, components, and/or elements disclosed in the specification, and are not intended to preclude the possibility that one or more other features or elements may exist or may be added.

It will also be understood that when an element such as a layer, a region or a component is referred to as being "on" another layer or element, it can be directly on the other layer or element, or intervening layers, regions, or components may also be present. In contrast, when an element is referred to as being "directly on" another element, there are no intervening elements present.

In the drawings, the sizes of elements are exaggerated or reduced for ease of description. The size or thickness of each element shown in the drawings are arbitrarily illustrated for better understanding or ease of description, and thus the present disclosure is not limited thereto.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

The expression "X to Y" as used herein means "X or more and Y or less", if the expression indicates a numeral range.

Unless described otherwise, performing processes and measuring physical properties are considered as being performed at a temperature of 20 to 25° C. and at a humidity of 40 to 50%.

An organic light-emitting device may use various materials which are designed for use in an organic light-emitting device, including a charge transport material, such as a hole transport material. The charge transport material may not only transport a charge to an emission layer, but also prevent excitons, which are formed by recombining holes and electrons, from permeating into at least one region of a hole transport region and an electron transport region. Also, it is considered that when a hole transport material has high charge mobility and high triplet energy, the hole transport material may provide highly-efficient green and blue organic light-emitting devices.

A method of manufacturing an organic light-emitting device for a coating process may use, in a process aspect, a charge transport material having a polymer structure. From among charge transport materials having a polymer structure, a charge transport material that has an ethylene skeleton as a main chain and a charge transport unit as a side chain is called a side chain-type polymer material. For example, Japanese Patent Publication No. 2006-237592 discloses a hole transport side chain-type polymer material including a hole transport unit as a side chain. Regarding the side chain-type polymer material, charge transport units are separated from each other via bonds, thereby having high triplet energy. Also, since charge transport units are arranged in a pendant shape around the main chain, the charge transport units may easily interact, and may have a high charge transport capability. In this aspect, the side chain-type polymer material may be suitable for use as a charge transport material for green and blue organic light-emitting devices.

The material for the organic light-emitting device may include a repeating unit (1) represented by Formula 1. The material for the organic light-emitting device may be a side chain-type polymer material:

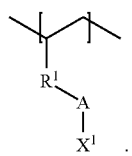

Formula 1

In Formula 1,
R$^1$ is selected from a single bond, a phenylene group, and a group represented by one of Formulae a1 to a9:

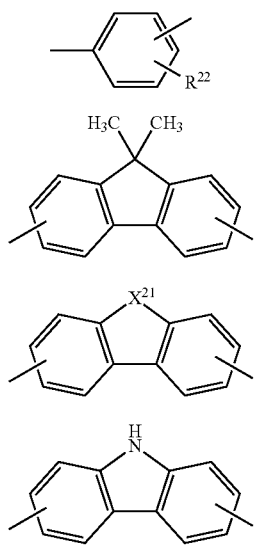

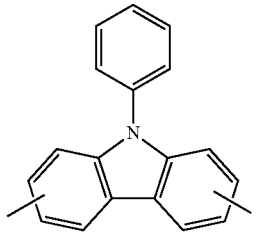

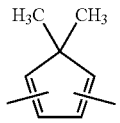

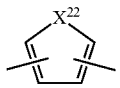

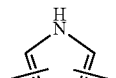

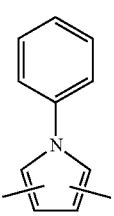

In Formulae a1 to a9,
R$^{22}$ is a C$_1$-C$_8$ alkyl group, and
X$^{21}$ and X$^{22}$ are each independently selected from an oxygen atom and a sulfur atom;
A is a divalent saturated aliphatic cyclic group; and
X$^1$ is a charge transport unit.

An organic light-emitting device may generate heat due to internal resistance when driven. The generated heat may damage materials constituting the organic light-emitting device, and accordingly, may lead to a decrease in a lifespan of the organic light-emitting device. To embody a long lifespan organic light-emitting device, materials for an organic light-emitting device, including a charge transport material, need to have high resistance to heat. However, conventional materials for an organic light-emitting device, in particular, a side chain-type polymer material have insufficient resistance to heat.

In addition, materials for an organic light-emitting device, including a charge transport material, may affect efficiency of the organic light-emitting device. An organic light-emitting device using conventional materials for an organic light-emitting device may not provide sufficient luminescent efficiency.

A material for an organic light-emitting device, the material including a repeating unit (1) represented by Formula 1, may provide an organic light-emitting device having a high resistance to heat and high efficiency. While not wishing to be bound by a theory, it is believed that the high resistance and high efficiency of the organic light-emitting device may be due to the following mechanism. However, the scope of the present invention is not limited thereto. That is, a side chain-type polymer material including the repeating unit (1)

represented by Formula 1 includes a saturated aliphatic cyclic group A, such as an adamantylene group, as a side chain. The saturated aliphatic cyclic group A, such as an adamantylene group, provides a rigid structure, leading to a high resistance to heat. Accordingly, it is expected that a material for an organic light-emitting device including the saturated aliphatic cyclic group A, such as an adamantylene group, has a high decomposition temperature (Td) and a high resistance to heat. It is also expected that the material for an organic light-emitting device including the saturated aliphatic cyclic group A, such as an adamantylene group, has a relatively high glass transition temperature (Tg) and a high resistance to heat. Accordingly, an organic light-emitting device including such a material may suppress the deformation of (or change in) at least one of a material and an organic film due to heat that occurs by driving, thereby making a long lifespan of the organic light-emitting device longer.

$R^1$ in Formula 1 may be selected from a single bond, a phenylene group, and a group represented by one of Formulae a1 to a9:

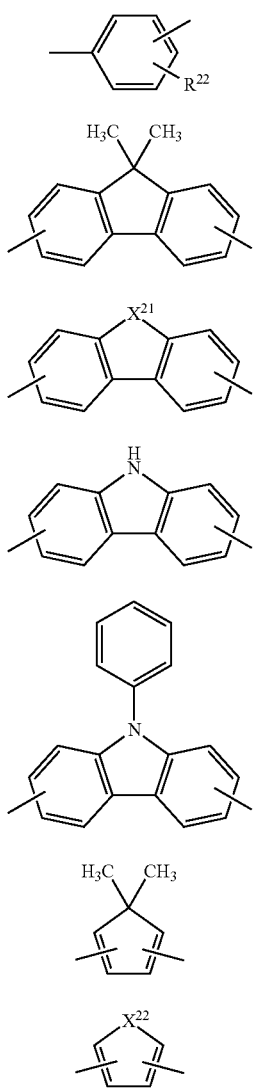
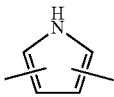
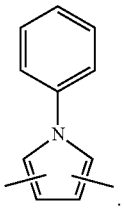

In Formulae a1 to a9,
$R^{22}$ is a $C_1$-$C_6$ alkyl group, and
$X^{21}$ and $X^{22}$ are each independently selected from an oxygen atom and a sulfur atom.

For example, $R^1$ in Formula 1 may be selected from a phenylene group and a group represented by one of Formulae a1 to a9, but is not limited thereto.

In some embodiments, $R^1$ in Formula 1 may be selected from a phenylene group and the group represented by Formula a1, but is not limited thereto.

In some embodiments, $R^1$ in Formula 1 may be a phenylene group, but is not limited thereto. When $R^1$ in Formula 1 is a phenylene group, a radical polymerization may readily occur.

For example, $R^{22}$ in Formula a1 may be a $C_1$-$C_3$ alkyl group, but is not limited thereto.

A in Formula 1 may be a divalent saturated aliphatic cyclic group.

For example, A in Formula 1 may be selected from an adamantylene group, a diadamantylene group, a triadamantylene group, a tetraadamantylene group, a cyclopropylene group, a cyclobutylene group, a cyclopentylene group, a cyclohexylene group, a bicyclo[2.1.0]pentyl group, a bicyclo[3.1.0]hexyl group, a bicyclo[2.1.1]hexyl group, a bicyclo[4.1.0]heptyl group, a bicyclo[2.2.1]heptyl group, and a cubanyl group (a pentacyclo [4.2.0.0$^{2,5}$.0$^{3,8}$.0$^{4,7}$]octanyl group), but is not limited thereto.

In some embodiments, A in Formula 1 may be selected from an adamantylene group, a diadamantylene group, a triadamantylene group, and a tetraadamantylene group, but is not limited thereto. When A in Formula 1 is selected from an adamantylene group, a diadamantylene group, a triadamantylene group, and a tetraadamantylene group, the material may provide a high resistance to heat.

In some embodiments, A in Formula 1 may be an adamantylene group, but is not limited thereto.

$X^1$ in Formula 1 may be a charge transport unit. A material for an organic light-emitting device according to an embodiment has a high resistance to heat and high luminescent efficiency. Accordingly, the material may be suitable for use as at least one material selected from a hole transport material, a hole injection material, an electron transport material, and an electron injection material. Although the charge transport unit can be a hole transport unit or an electron transport unit, the material for an organic light-emitting device according to an embodiment may be suitable for use in a hole injection layer or a hole transport layer when ionization potential and charge mobility are taken into consideration. Accordingly, $X^1$ in Formula 1 may be a hole transport unit.

The material for an organic light-emitting device has a high resistance to heat and high luminescent efficiency, and may be used as a hole transport or injection material or an electron transport or injection material. So, in this aspect, the charge transport unit used herein may be used as a hole transport unit or an electron transport unit. However, the material for an organic light-emitting device according to an embodiment may also be suitable for use in a hole injection layer or a hole transport layer when ionization potential and charge mobility are taken into consideration. So, $X^1$ may be a hole transport unit.

For example, $X^1$ in Formula 1 may be selected from a hole transport unit, such as an arylamine moiety, a fluorene moiety, a carbazole moiety, a dibenzofurane moiety, a dibenzothiophene moiety, each optionally forming a fused ring system or a spiro ring system; and an electron transport unit, such as a fluorenone moiety, a quinone moiety, an anthraquinone moiety, a diphenylquinone moiety, a thiopyrandioxide moiety, an oxazole moiety, an oxadiazole moiety, a triazole moiety, an imidazole moiety, an anthrone moiety, a bipyridine moiety, and a phenanthroline moiety, but is not limited thereto.

In some embodiments, $X^1$ in Formula 1 may be a group represented by one of Formulae b1 to b13, but is not limited thereto:

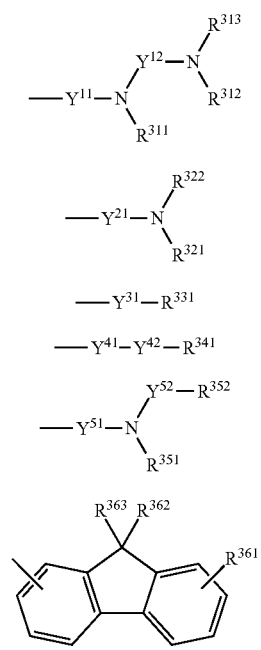

b1 b2 b3 b4 b5 b6 b7 b8

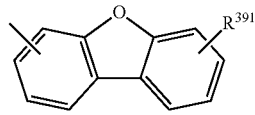

b9

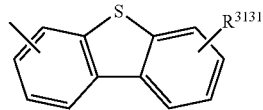

b10

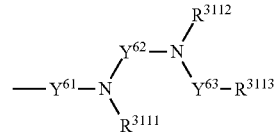

b11

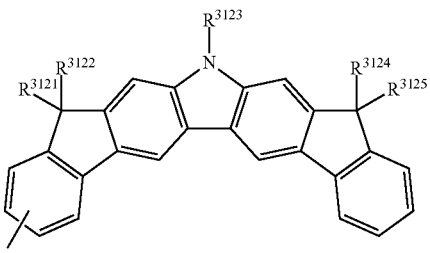

b12 b13

In Formulae b1 to b13, $R^{311}$, $R^{312}$, $R^{313}$, $R^{321}$, $R^{322}$, $R^{331}$, $R^{341}$, $R^{351}$, $R^{352}$, $R^{361}$, $R^{362}$, $R^{363}$, $R^{371}$, $R^{372}$, $R^{381}$, $R^{391}$, $R^{3101}$, $R^{3111}$, $R^{3112}$, $R^{3113}$, $R^{3121}$, $R^{3122}$, $R^{3123}$, $R^{3124}$, $R^{3125}$, $R^{3131}$, and $R^{3132}$ may be each independently selected from a hydrogen atom, a $C_1$-$C_6$ alkyl group, and a group represented by one of Formulae c1 to c16:

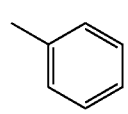

c1

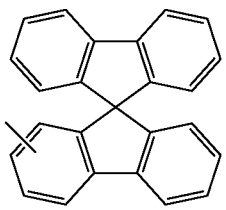

c2

-continued
c3 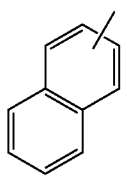
c4 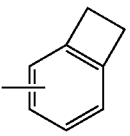
c5 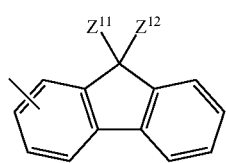
c6 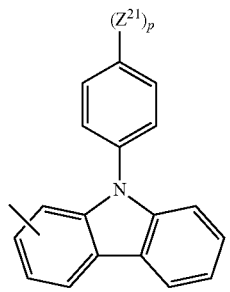
c7 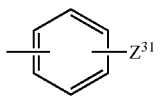
c8 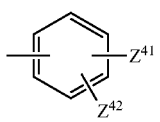
c9 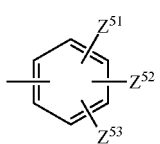
c10 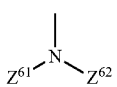
c11 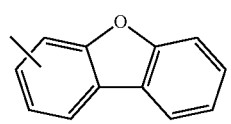
c12 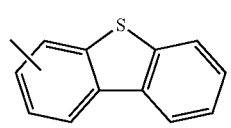
-continued
c13 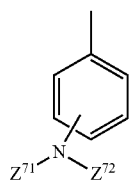
c14 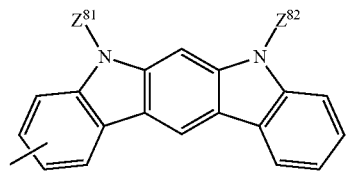
c15 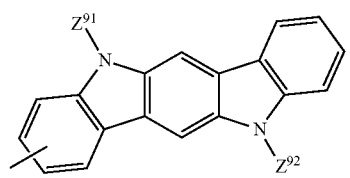
c16 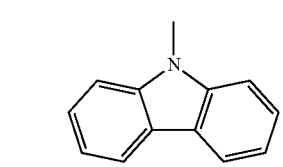
In Formulae c1 to c16,
p is 0 or 1; and
$Z^{11}$, $Z^{12}$, $Z^{21}$, $Z^{31}$, $Z^{41}$, $Z^{42}$, $Z^{51}$, $Z^{52}$, $Z^{53}$, $Z^{61}$, $Z^{62}$, $Z^{71}$, $Z^{72}$, $Z^{81}$, $Z^{82}$, $Z^{91}$, and $Z^{92}$ may be each independently selected from a $C_1$-$C_6$ alkyl group, a methoxy group, and a group represented by one of Formulae d1 to d7:
d1 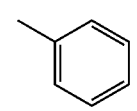
d2 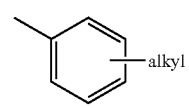
d3 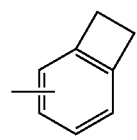
d4 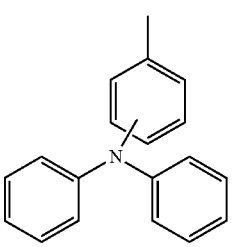

-continued

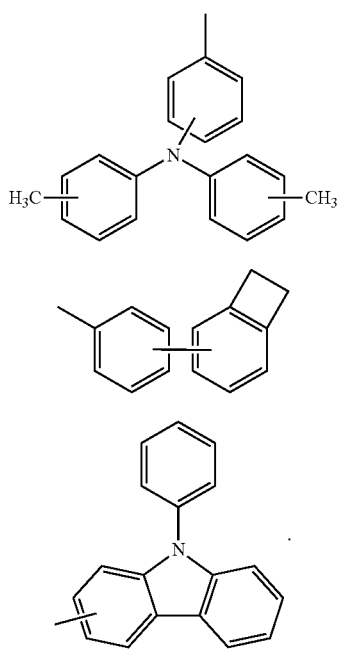

d5 d6 d7

In Formulae d1 to d7,
alkyl is a $C_1$-$C_6$ alkyl group; and
$Y^{11}$, $Y^{12}$, $Y^{21}$, $Y^{31}$, $Y^{41}$, $Y^{42}$, $Y^{51}$, $Y^{52}$, $Y^{61}$, $Y^{62}$ and $Y^{63}$ are each independently a group represented by one of Formulae e1 to e11:

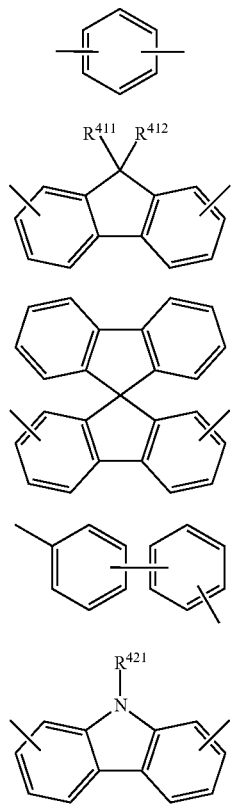

e1 e2 e3 e4 e5

-continued

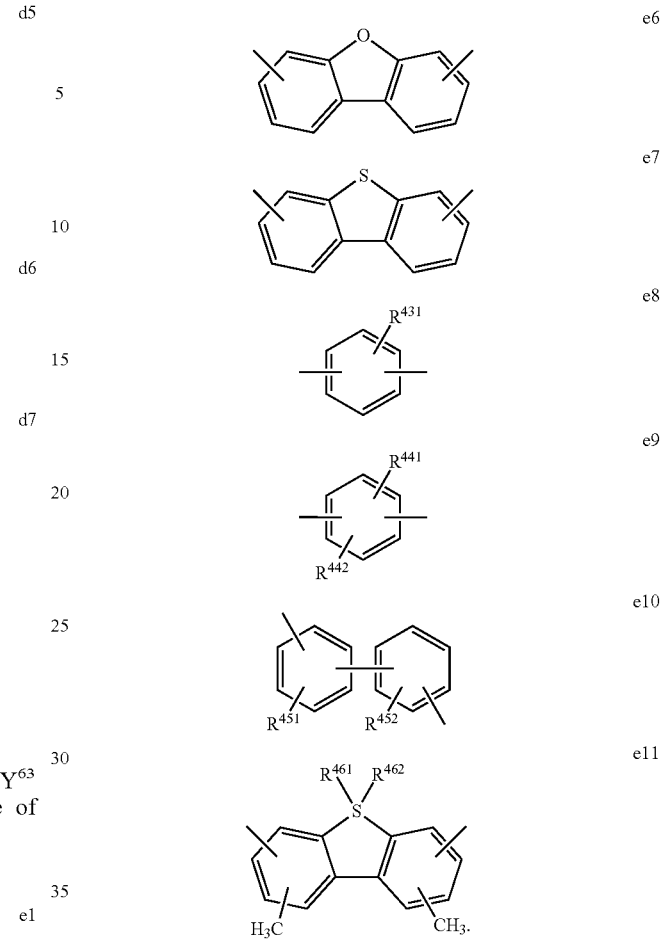

e6 e7 e8 e9 e10 e11

In Formulae e1 to e11,
$R^{411}$, $R^{412}$, $R^{421}$, $R^{431}$, $R^{441}$, $R^{442}$, $R^{451}$, $R^{452}$, $R^{461}$, and $R^{462}$ may be each independently selected from a hydrogen atom, a $C_1$-$C_6$ alkyl group, a phenyl group, and a tolyl group.

In some embodiments, $X^1$ in Formula 1 may be represented by one of Formulae b1 to b5, b8, and b11, but is not limited thereto.

In some embodiments, $X^1$ in Formula 1 may be represented by one of Formulae b1 and b11, but is not limited thereto.

For example, Formula b6 may be represented by Formula b6-1, Formula b7 may be represented by Formulae b7-1 or b7-2, Formula b8 may be represented by Formulae b8-1 or b8-2, Formula b9 may be represented by Formula b9-1, Formula b10 may be represented by Formula b10-1, Formula b12 may be represented by Formula b12-1, and Formula b13 may be represented by Formula b13-1:

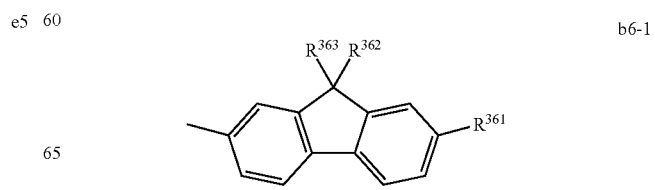

b6-1 b7-1

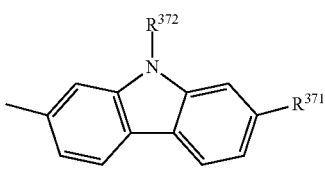

b7-2

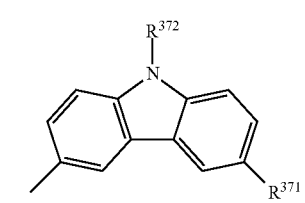

b8-1

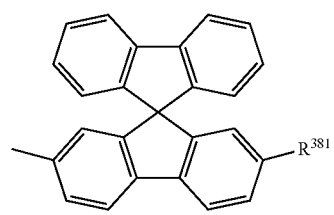

b8-2

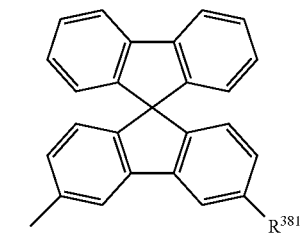

b9-1

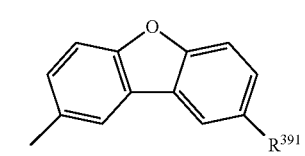

b10-1

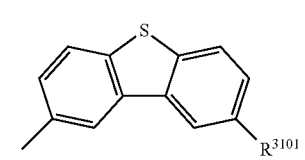

b12-1

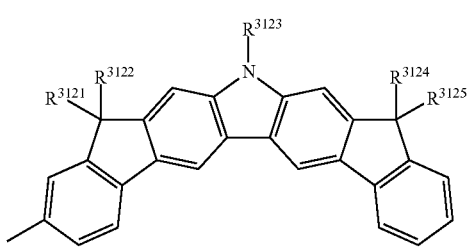

b13-1

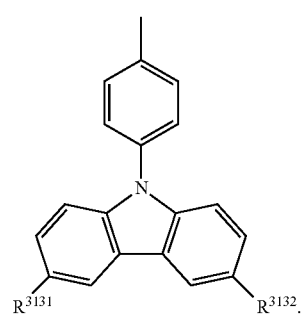

For example, Formula c2 may be represented by Formulae c2-1 or c2-2, Formula c3 may be represented by Formula c3-1, Formula c4 may be represented by Formula c4-1, Formula c5 may be represented by Formulae c5-1 or c5-2, Formula c6 may be represented by Formulae c6-1 or c6-2, Formula c7 may be represented by Formulae c7-1 or c7-2, Formula c8 may be represented by Formula c8-1, Formula c9 may be represented by Formula c9-1, Formula c11 may be represented by Formulae c11-1 or c11-2, Formula c12 may be represented by Formulae c12-1 or c12-2, Formula c13 may be represented by Formula c13-1, Formula c14 may be represented by Formula c14-1, and Formula c15 may be represented by Formula c15-1:

c2-1

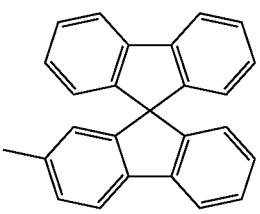

c2-2

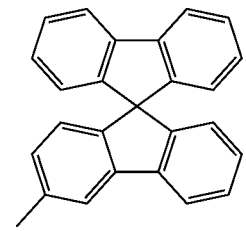

C3-1

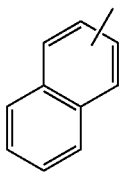

C4-1

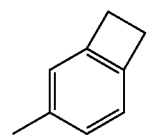

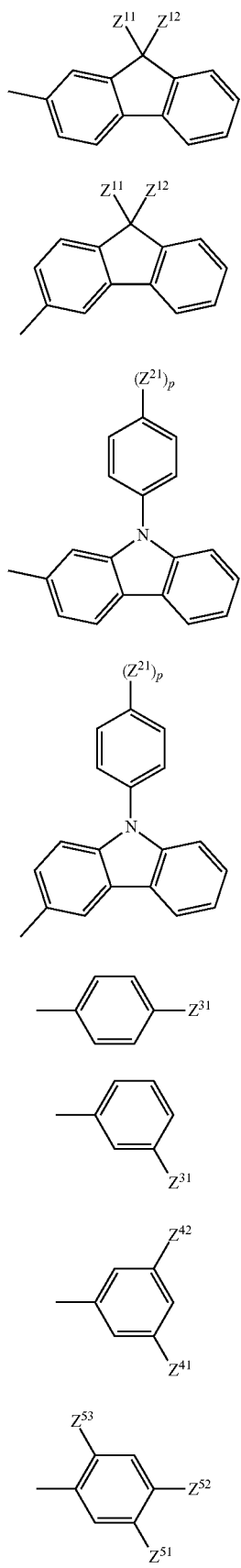

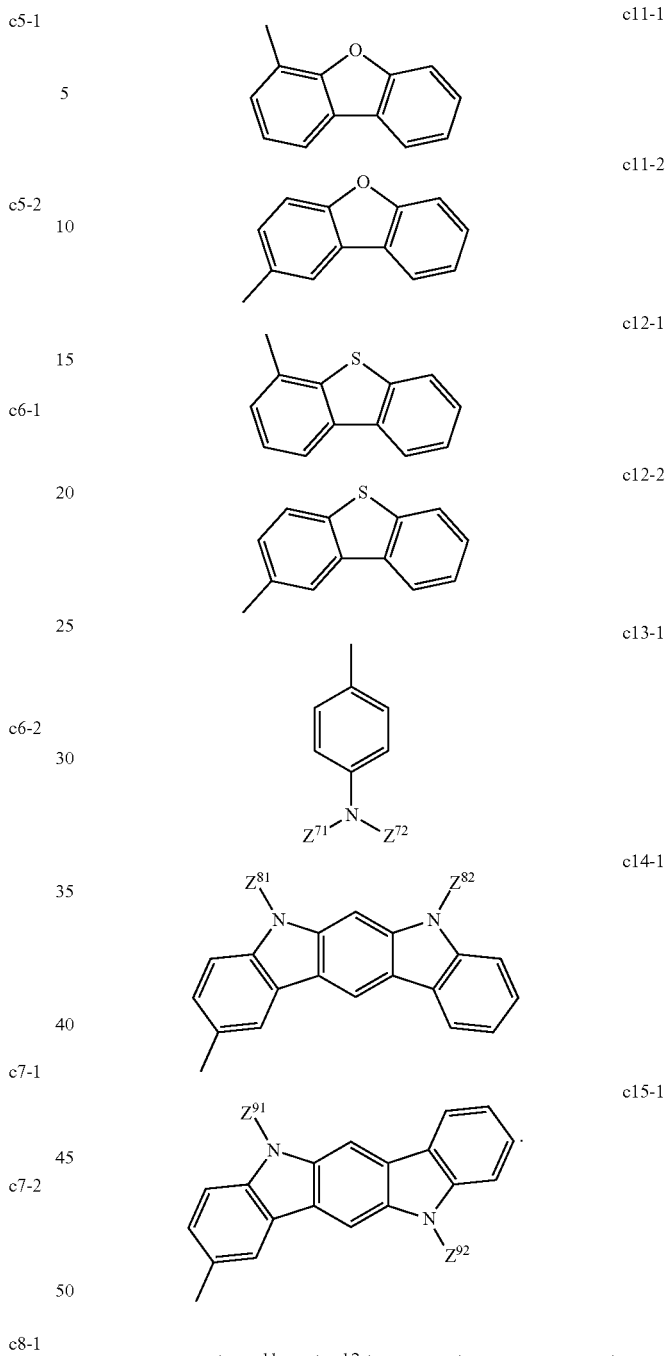

For example, $Z^{11}$ and $Z^{12}$ in Formulae c5, c5-1, and c5-2 may be each independently a $C_1$-$C_6$ alkyl group, but they are not limited thereto.

For example, $Z^{21}$ in Formulae c6, c6-1, and c6-2 may be represented by a group represented by one of Formulae d1 to d3, but is not limited thereto.

For example, $Z^{31}$, $Z^{41}$, $Z^{42}$, $Z^{51}$, $Z^{52}$, and $Z^{53}$ in Formulae c7 to c9, c7-1, c7-2, c8-1, and c9-1 may be each independently selected from a $C_1$-$C_6$ alkyl group, a methoxy group, and a group represented by one of Formulae d1 and d2, but they are not limited thereto.

For example, $Z^{71}$ and $Z^{72}$ in Formulae c13 and c13-1 may be each independently selected from groups represented by Formulae d1 to d5, but they are not limited thereto.

For example, $Z^{81}$, $Z^{82}$, $Z^{91}$, and $Z^{92}$ in Formulae c14, c15, c14-1, and c15-1 may be each independently a group represented by Formulae d1 or d6, but are not limited thereto.

For example, Formula d2 may be represented by Formulae d2-1 or d2-2, Formula d3 may be represented by Formula d3-1, Formula d4 may be represented by Formula d4-1, Formula d5 may be represented by Formula d5-1, Formula d6 may be represented by Formula d6-1, and Formula d7 may be represented by Formula d7-1:

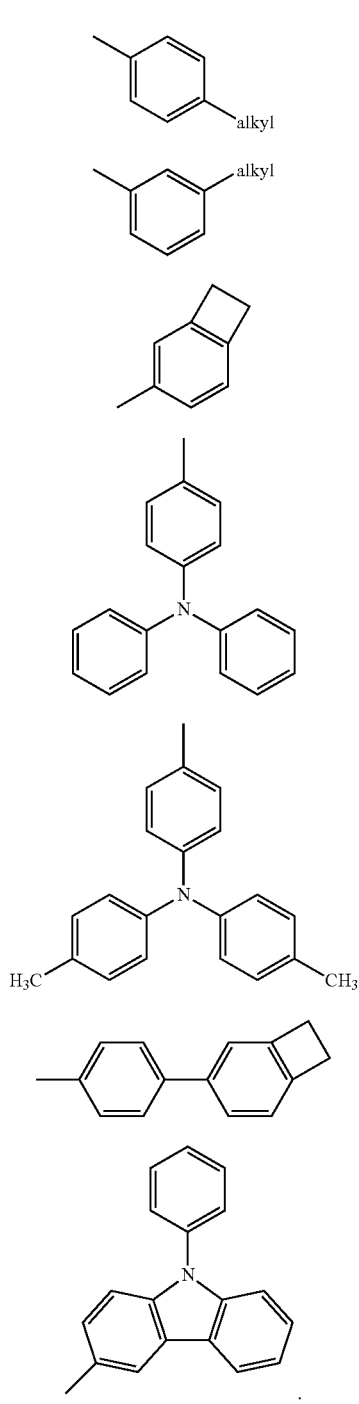

For example, Formula e1 may be represented by Formula e1-1, Formula e2 may be represented by Formulae e2-1 or e2-2, Formula e3 may be represented by Formula e3-1, Formula e4 may be represented by Formula e4-1, Formula e5 may be represented by Formula e5-1, Formula e6 may be represented by Formula e6-1, Formula e7 may be represented by Formula e7-1, Formula e8 may be represented by Formula e8-1, Formula e9 may be represented by Formula e9-1, Formula e10 may be represented by Formula e10-1, and Formula e11 may be represented by Formula e11-1:

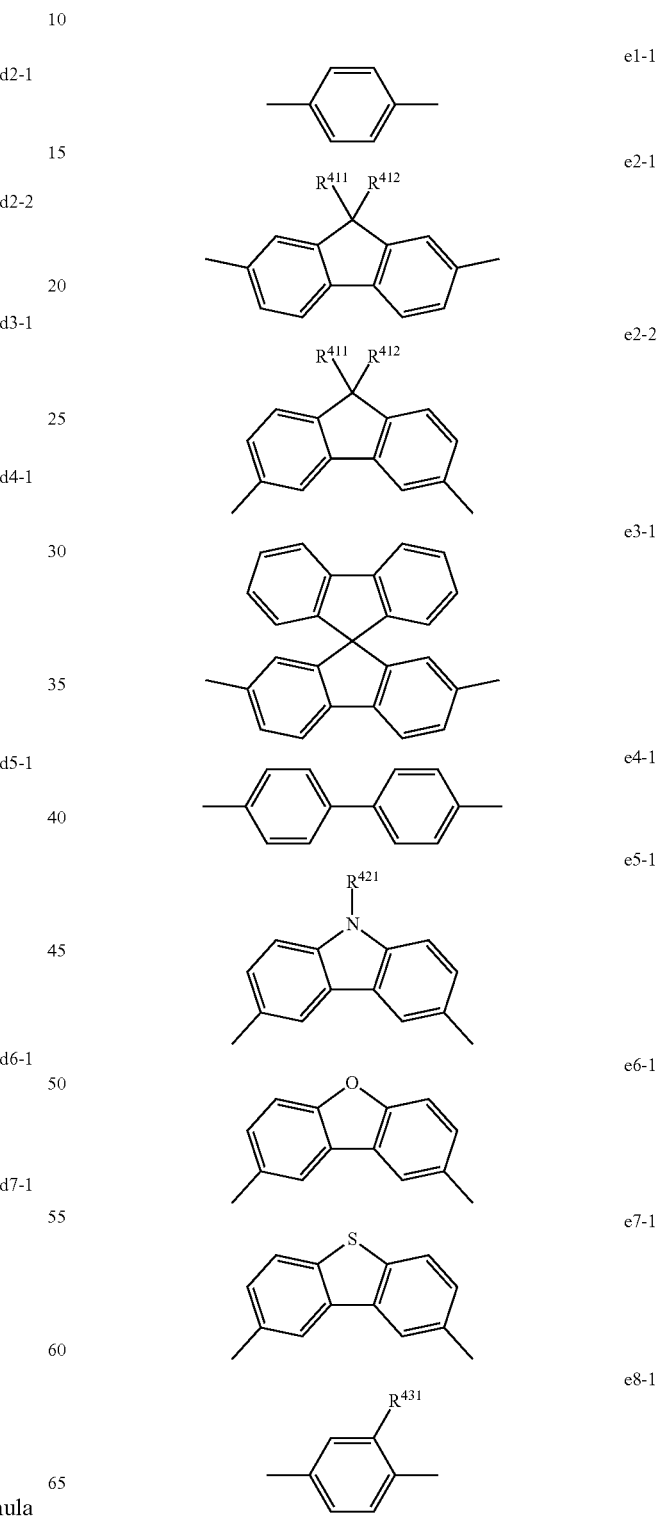

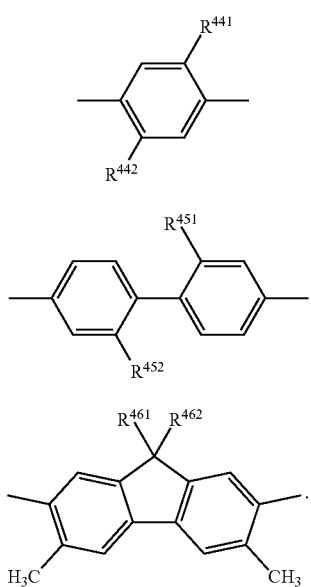

e9-1 e10-1 e11-1

For example, $R^{411}$, $R^{412}$, $R^{421}$, $R^{431}$, $R^{441}$, $R^{442}$, $R^{451}$, $R^{452}$, $R^{461}$, and $R^{462}$ in Formulae e1 to e11, e1-1, e2-1, e2-2, e3-1, e4-1, e5-1, e6-1, e7-1, e8-1, e9-1, e10-1, and e11-1 may be each independently selected from a hydrogen atom, a $C_1$-$C_6$ alkyl group, a phenyl group, and a tolyl group, but is not limited thereto.

In some embodiments, $R^{411}$ and $R^{412}$ in Formulae e2, e2-1, and e2-2 may be each independently a $C_1$-$C_6$ alkyl group, but is not limited thereto.

In some embodiments, $R^{421}$ in Formulae e5 and e5-1 may be selected from a phenyl group, and a tolyl group, but is not limited thereto.

In some embodiments, $R^{431}$, $R^{441}$, $R^{442}$, $R^{451}$, $R^{452}$, $R^{461}$, and $R^{462}$ in Formulae e8 to e11, e8-1, e9-1, e10-1, and e11-1 may be each independently a $C_1$-$C_6$ alkyl group, but they are not limited thereto.

For example, in Formulae b1 to b13, $R^{311}$, $R^{312}$, $R^{313}$, $R^{321}$, $R^{322}$, $R^{331}$, $R^{341}$, $R^{351}$, $R^{352}$, $R^{361}$, $R^{362}$, $R^{363}$, $R^{371}$, $R^{372}$, $R^{381}$, $R^{391}$, $R^{3101}$, $R^{3111}$, $R^{3112}$, $R^{3113}$, $R^{3121}$, $R^{3122}$, $R^{3123}$, $R^{3124}$, $R^{3125}$, $R^{3131}$, and $R^{3132}$ may be each independently a group represented by one of Formula c1 to c16; $Z^{11}$, $Z^{12}$, $Z^{21}$, $Z^{31}$, $Z^{41}$, $Z^{42}$, $Z^{51}$, $Z^{52}$, $Z^{53}$, $Z^{61}$, $Z^{62}$, $Z^{71}$, $Z^{72}$, $Z^{81}$, $Z^{82}$, $Z^{91}$, and $Z^{92}$ may be each independently selected from a hydrogen atom, a $C_1$-$C_6$ alkyl group, a methoxy group, and a group represented by Formulae d1 to d7; $Y^{11}$, $Y^{12}$, $Y^{21}$, $Y^{31}$, $Y^{41}$, $Y^{42}$, $Y^{51}$, $Y^{52}$, $Y^{61}$, $Y^{62}$, and $Y^{63}$ may be a phenylene group, but they are not limited thereto.

In some embodiments, in Formula 1, $R^1$ may be a phenylene group or a group represented by Formula a1; A may be selected from an adamantylene group, a diadamantylene group, a triadamantylene group, and a tetraadamantylene group; and $X^1$ may be a group represented by one of Formulae b1 to b5, b8, and b11, but is not limited thereto.

In some embodiments, in Formula 1, $R^1$ may be a phenylene group, and A may be an adamantylene group, but they are not limited thereto.

In some embodiments, the repeating unit (1) represented by Formula 1 may be represented by Formula 1a, but is not limited thereto:

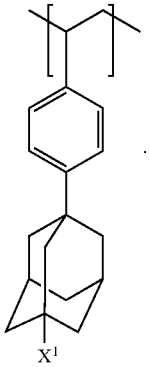

Formula 1a

In Formula 1a, $X^1$ may be understood by referring to the description provided in connection with Formula 1 above.

The material for the organic light-emitting device may include the repeating unit (1) represented by Formula 1 in the number of n.

In some embodiments, a material for an organic light-emitting device, the material including the repeating unit (1) represented by Formula 1 in the number of n, may be represented by Formula 1-1, but is not limited thereto:

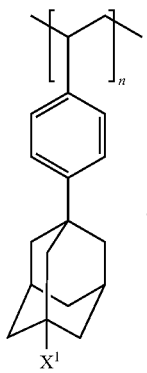

Formula 1-1 n in Formula 1-1 may be an integer of 20 to 500. While not wishing to be bound by theory, it is understood that when n is less than 20, a film-forming property of the material may deteriorate. When n is greater than 500, the material may embrittle.

For example, n in Formula 1-1 may be an integer of 100 to 300, but is not limited thereto.

For example, the number of total repeating units in the material for the organic light-emitting device may be in a range of 20 to 500, but is not limited thereto.

For example, the material for the organic light-emitting device may include the repeating unit (1) represented by Formula 1 in the amount of 10 to 100 mole percent (mol %) of total constituting units, but is not limited thereto. While not wishing to be bound by theory, it is understood that when the repeating unit (1) represented by Formula 1 is included in the amount of 10 mol % or greater of total constituting units, the heat resistance of the material may be increased.

In some embodiments, the material for the organic light-emitting device may include the repeating unit (1) represented by Formula 1 in the amount of 30 to 100 mol % of total constituting units, but is not limited thereto. Within this range, Td and Tg of the material for an organic light-emitting device may be improved.

In some embodiments, the material for the organic light-emitting device may include the repeating unit (1) represented by Formula 1 in the amount of 60 to 100 mol % of total constituting units, but is not limited thereto.

When the repeating unit (1) represented by Formula 1 is included in the amount of less than 100 mol % of total constituting units in the material for an organic light-emitting device, that is, when the material for an organic light-emitting device is a copolymer of the repeating unit (1) represented by Formula 1 and a repeating unit derived from a different ethylenically unsaturated monomer (hereinafter, the "repeating unit derived from a different ethylenically unsaturated monomer" will be referred to as "the remaining repeating unit."), the remaining repeating unit may be derived from any ethylenically unsaturated monomer.

A ratio of repeating units may be adjusted by changing a ratio of monomers used to prepare the material for an organic light-emitting device by polymerization. From among total constituting units, the ratio of repeating units may be measured by NMR.

For example, the remaining repeating unit may be a repeating unit (2) represented by Formula 2, but is not limited thereto. The material for an organic light-emitting device according to an embodiment may be a copolymer including the repeating unit (1) represented by Formula 1 and the repeating unit (2) represented by Formula 2, but is not limited thereto:

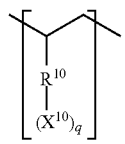

Formula 2

In Formula 2, $R^{10}$ may be understood by referring to the description of $R^1$ of Formula 1;

$X^{10}$ may be understood by referring to the description of $X^1$ of Formula 1; and q may be 0 or 1.

For example, when q in Formula 2 is 0, $(X^{10})_q$ may indicate a hydrogen atom.

For example, the different ethylenically unsaturated monomer may be selected from an aromatic vinyl compound, such as styrene, methyl styrene, methoxy styrene, ethyl styrene, butyl styrene, hexyl styrene, octyl styrene, chloro styrene, phenyl styrene, vinyl toluene, or vinyl benzyl methyl ether; an acryl group-containing compound and a derivative thereof, such as (meth)acrylic acid, methyl(meth)acrylate, ethyl(meth)acrylate, butyl(meth)acrylate, 2-hydroxyethyl(meth)acrylate, 2-hydroxybutyl(meth)acrylate, benzyl(meth)acrylate, cyclohexyl(meth)acrylate, phenyl(meth)acrylate, 2-aminoethyl(meth)acrylate, 2-dimethylaminoethyl(meth)acrylate, glycidyl(meth)acrylate(meth)acryl amide; a carboxylic acid vinyl ester compound, such as an acetic acid vinyl, a propionic acid vinyl, or a benzoic acid vinyl; a cyanated vinyl compound, such as (meth)acrylonitrile; a vinyl ether compound, such as vinyl methyl ether, vinyl ethyl ether, vinyl isobutyl ether, or vinyl phenyl ether, and an olefin compound, such as ethylene, propylene, iso butylene, 1-butene, 1-pentene, 4-methyl-1-pentene, butadiene, isoprene, or chloroprene, but is not limited thereto.

The different ethylenically unsaturated monomer may include identical monomers or two or more different monomers, but is not limited thereto.

When the material for an organic light-emitting device is a copolymer, a bonding manner of the copolymer is not limited. For example, the material for the organic light-emitting device may include a copolymer selected from a random copolymer, an alternating copolymer, a periodic copolymer, and a block copolymer, but is not limited thereto.

In some embodiments, the material for an organic light-emitting device may be represented by Formula 3, but is not limited thereto:

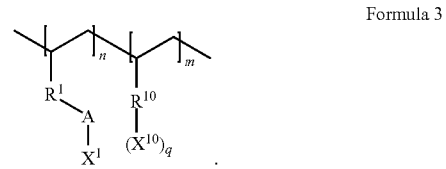

Formula 3

In Formula 3, $R^1$ and $R^{10}$ are each independently understood by referring to the description of $R^1$ in Formula 1;

A is understood by referring to the description of A in Formula 1;

$X^1$ and $X^{10}$ are each independently understood by referring to the description of $X^1$ in Formula 1;

q is understood by referring to the description of q in Formula 2;

n is an integer of 20 to 500; and m is an integer of 1 to 180.

For example, when q in Formula 3 is 0, $(X^{10})_q$ indicates a hydrogen atom. For example, q in Formula 3 may be 1, but is not limited thereto. While not wishing to be bound by theory, it is understood that when q in Formula 3 is 1, luminescent efficiency of a manufactured organic light-emitting device may be improved.

For example, n and m in Formula 3 may satisfy the condition of $0.1 \leq n/(n+m) \leq 1$, but they are not limited thereto. That is, the material for an organic light-emitting device represented by Formula 3 may include the repeating unit (1) in the amount of 10 to 100 mol % of total constituting units and the balance of the repeating unit (2).

In some embodiments, n and m in Formula 3 may satisfy the condition of $0.3 \leq n/(n+m) \leq 1$, but is not limited thereto. That is, the material for an organic light-emitting device represented by Formula 3 may include the repeating unit (1) in the amount of 30 to 100 mol % of total constituting units and the balance of the repeating unit (2). While not wishing to be bound by theory, it is understood that when the above condition is satisfied, Td and Tg of the material for the organic light-emitting device may be improved.

In some embodiments, n and m in Formula 3 may satisfy the condition of $0.6 \leq n/(n+m) \leq 1$, but they are not limited thereto. For example, the material for an organic light-emitting device represented by Formula 3 may include the repeating unit (1) in the amount of 60 to 100 mol % of total constituting units and the balance of the repeating unit (2).

For example, n and m in Formula 3 may satisfy the condition of $20 \leq n+m \leq 500$, but they are not limited thereto.

An end of the material for the organic light-emitting device is not limited, and may be appropriately selected. In general, the end of the material may be a hydrogen atom.

Repeating units included in the material for the organic light-emitting device may have identical or different structures.

A number average molecular weight (Mn) of the material for the organic light-emitting device is not limited, and may be, for example, in a range of 5,000 to 1,000,000. For example, the number average molecular weight (Mn) of the material may be in a range of 6,000 to 100,000. While not wishing to be bound by theory, it is understood that when the number average molecular weight (Mn) of the material is 5,000 or greater, a film that is formed by using such a material may not embrittle. When the number average molecular weight (Mn) of the material is 1,000,000 or less, when a film is formed by using such a material, it is believed that the material for an organic light-emitting device may not embrittle.

The number average molecular amount and a degree of dispersion (Mw/Mn) were measured by using size exclusion chromatography using polystyrene as a standard material.

The material for the organic light-emitting device has a high resistance to heat, and the high heat-resistance to heat was evaluated by referring to 5% weight decrease temperature (decomposition temperature Td)(° C.) measured by using the method described in Example. Td of the material for an organic light-emitting device is 410° C. or greater, for example, 420° C. or greater, for example, 430° C. or greater. While not wishing to be bound by theory, it is understood that when Td of the material is less than 410° C., due to at least one of decomposition and deterioration of the material, the organic light-emitting device may not be driven for a long period of time. An upper limit of Td is not limited, but, for example, may be 550° C.

The material for the organic light-emitting device may have high luminescent efficiency. A glass transition temperature (Tg)(° C.) of the material for an organic light-emitting device may be 145° C. or greater, for example, 155° C., when luminescent efficiency increase effects of an organic light-emitting device are taken into consideration. However, Tg of the material is not limited thereto. Although an upper limit of Tg is not limited, the upper limit may be, for example, 230° C. Tg may be measured by using methods described in the following examples.

When Tg and Td satisfy these ranges, a manufactured organic light-emitting device may have high resistance to heat and high efficiency.

The material for the organic light-emitting device may provide high charge mobility. The charge mobility may be $1 \times 10^{-6}$ square centimeters per volt (cm$^2$/V) or greater, for example, $1 \times 10^{-4}$ square centimeters per volt (cm$^2$/V) or greater, when measured by impedance spectroscopy.

The material for an organic light-emitting device including the repeating unit (1) represented by Formula 1 may be prepared by polymerizing an ethylenically unsaturated monomer represented by Formula I:

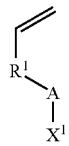

Formula I

In some embodiments, in preparing the material for the organic light-emitting device, a styrene derivative represented by Formula Ia may be used, but is not limited thereto:

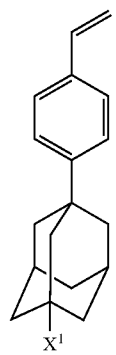

Formula Ia

In Formulae I and Ia, $R^1$, A, and X may be understood by referring to the description provided in connection with Formula 1.

The styrene derivative used in preparing the material for the organic light-emitting device may be one of example monomers 1 to 170, but is not limited thereto:

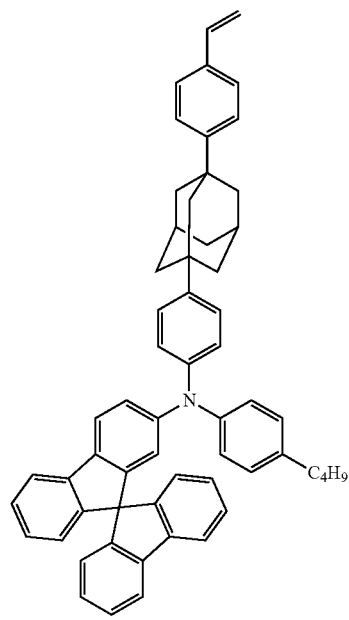

1

27
-continued
2
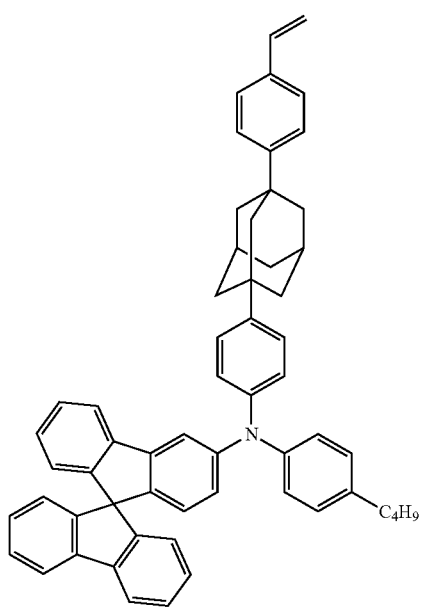
28
-continued
4
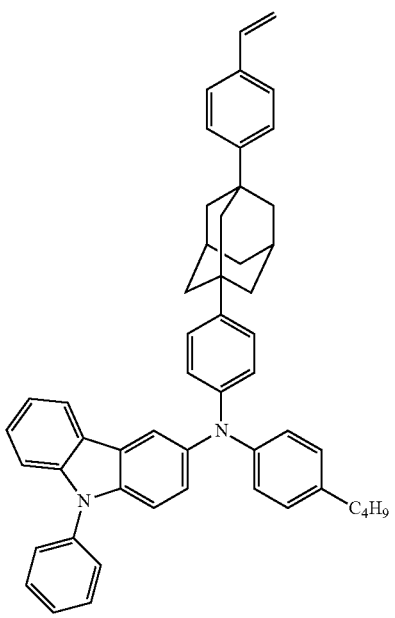
3
5
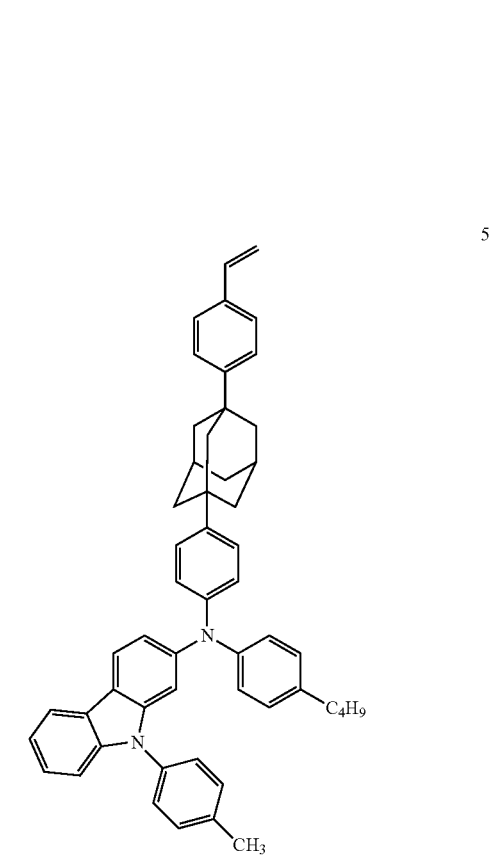

6
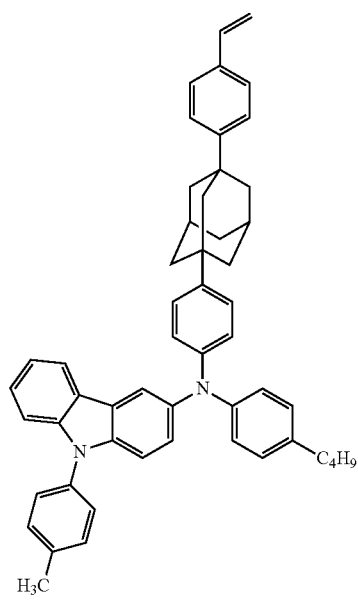
7
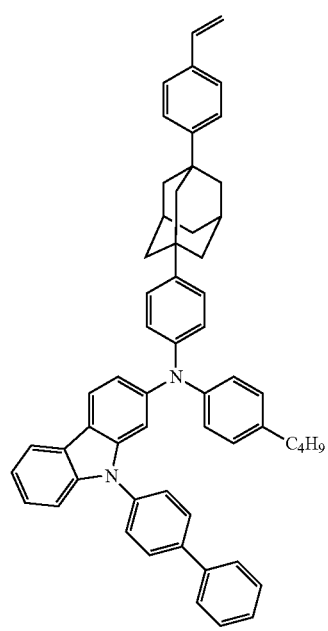
8
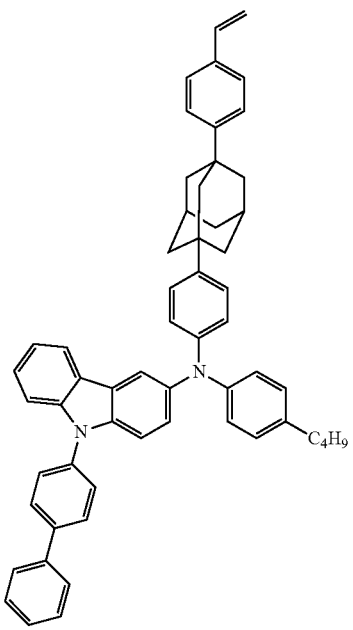
9
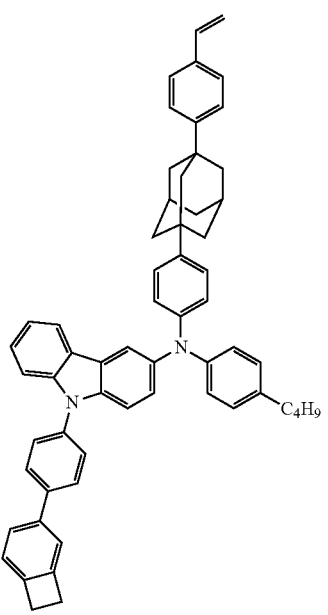

31
-continued
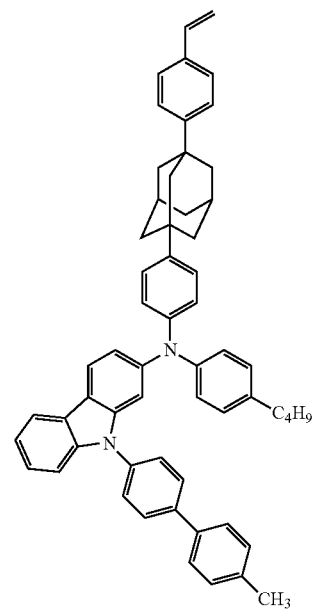
10
32
-continued
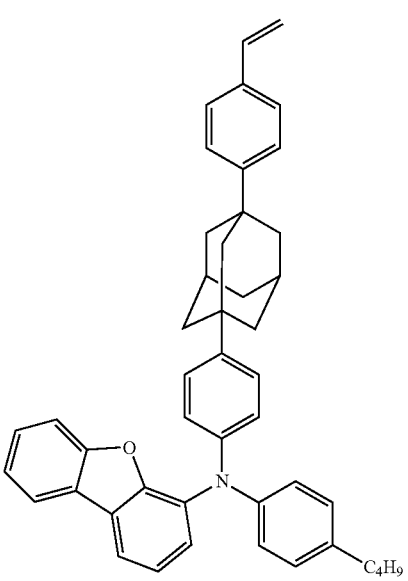
12
11
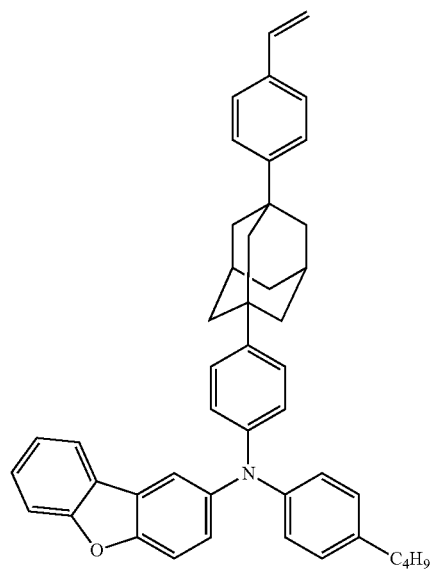
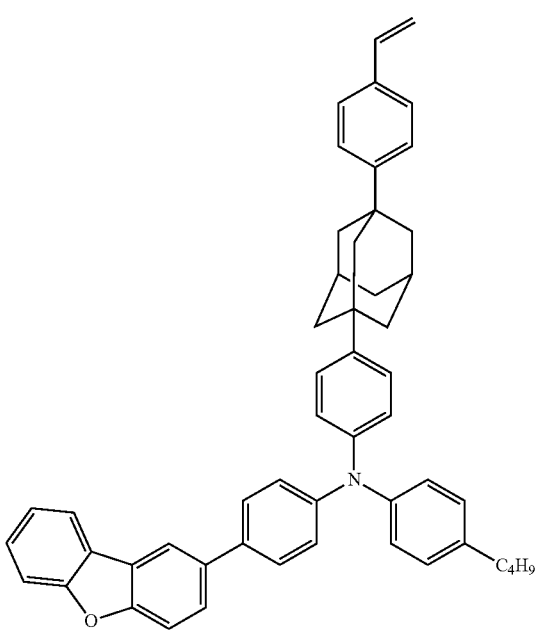
13

14
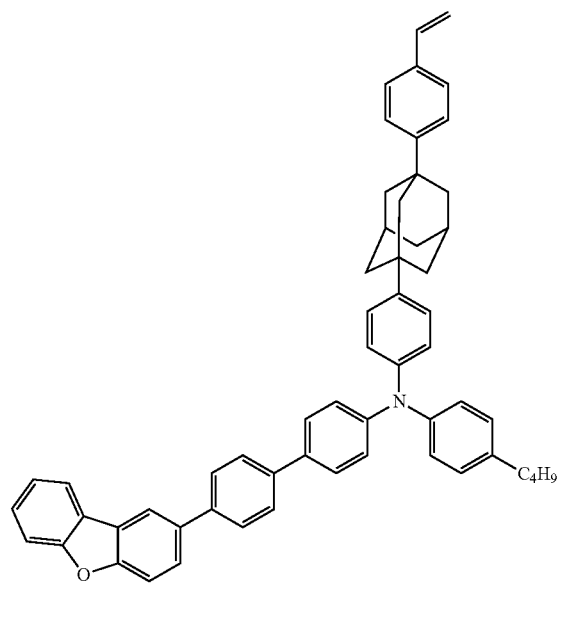
15
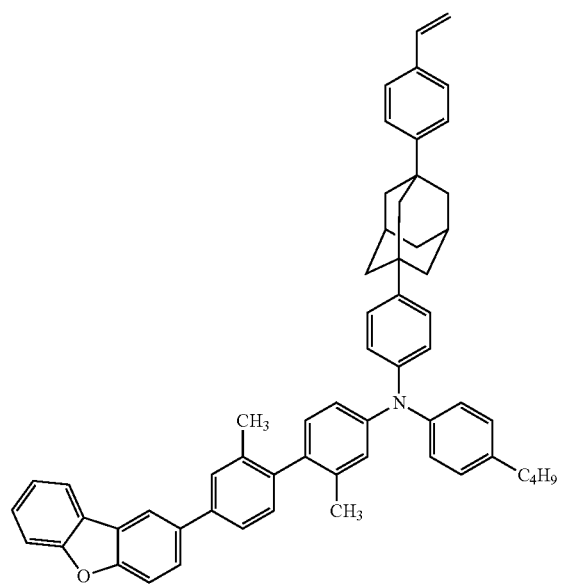
16
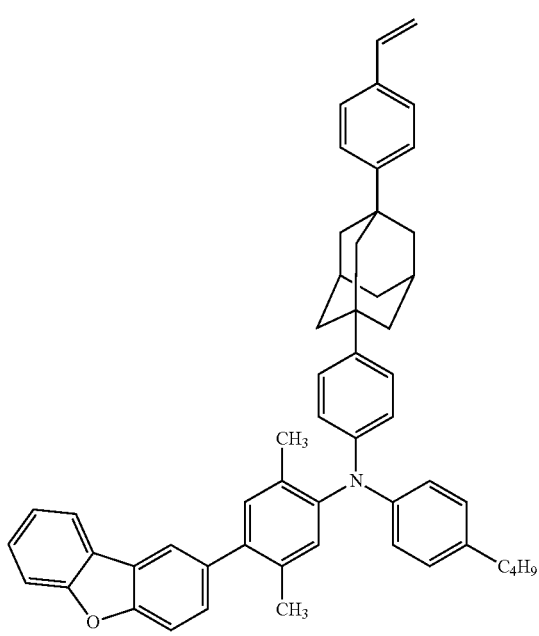
17
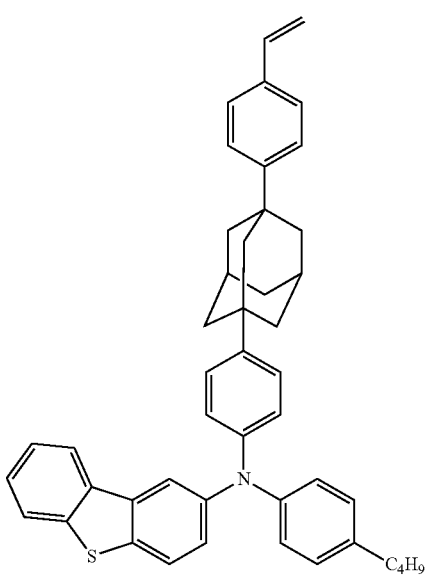

35
-continued
18
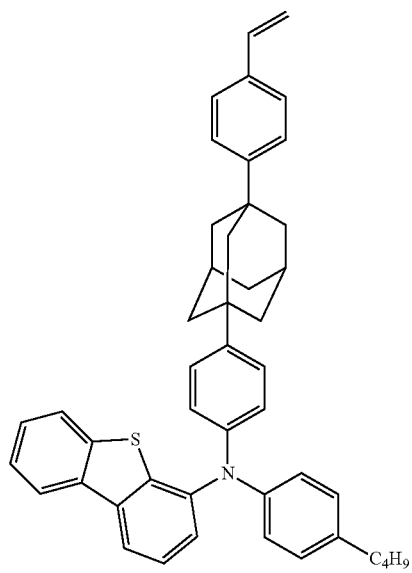
19
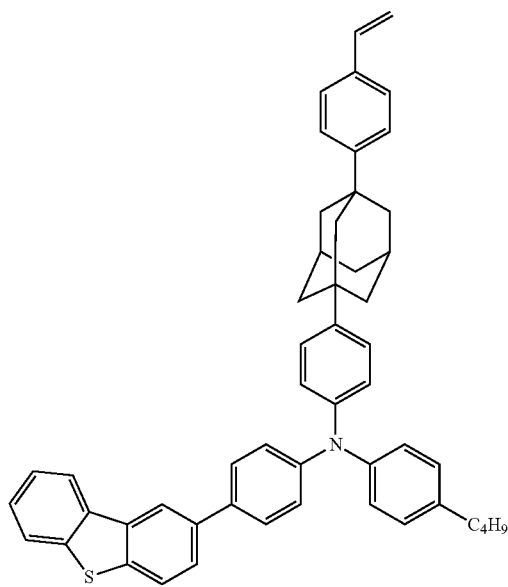
36
-continued
20
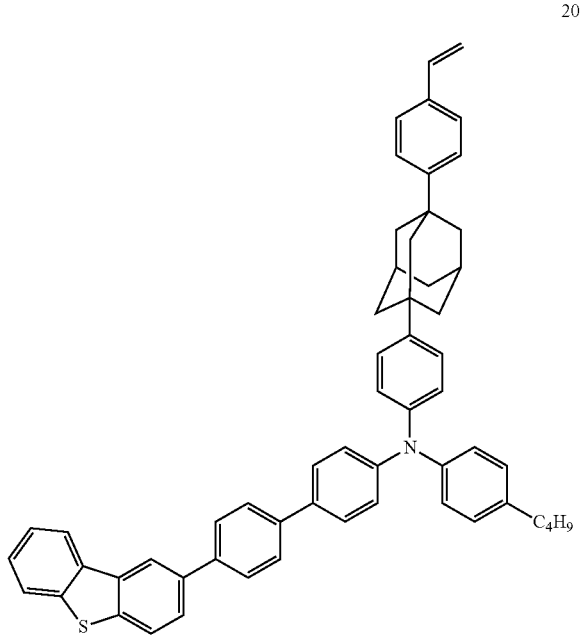
21
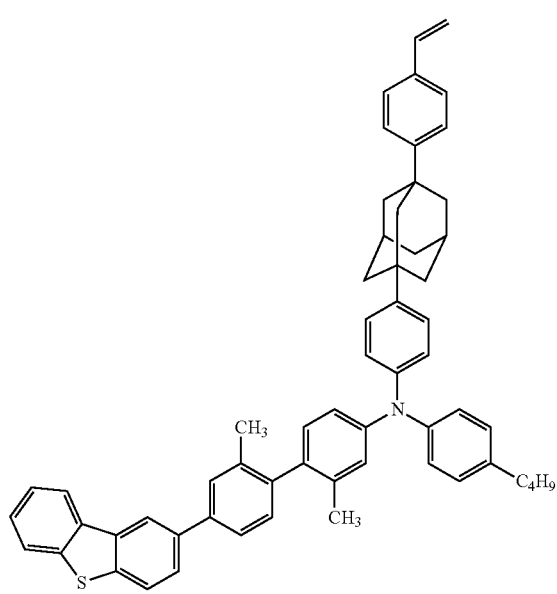

22
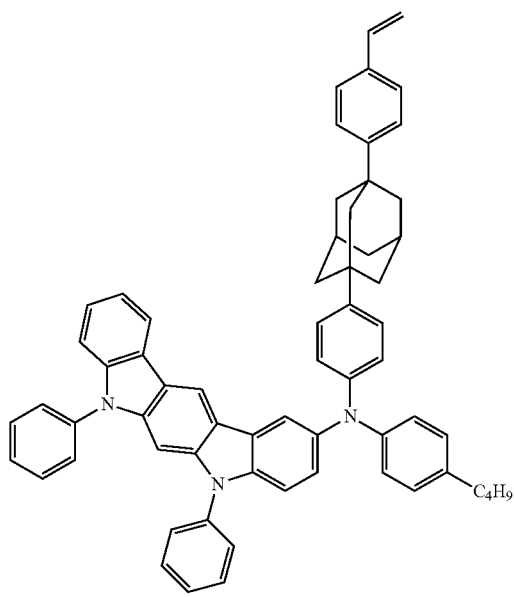
23
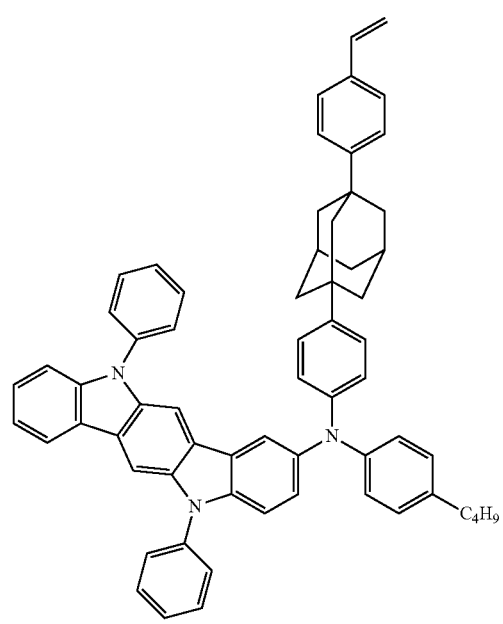
24
25
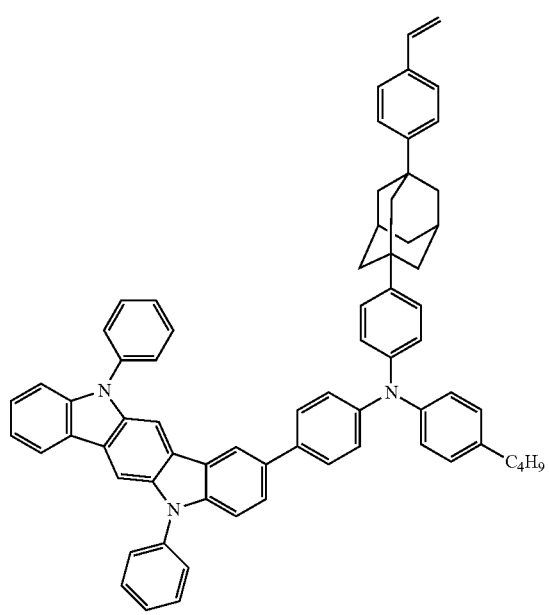

26
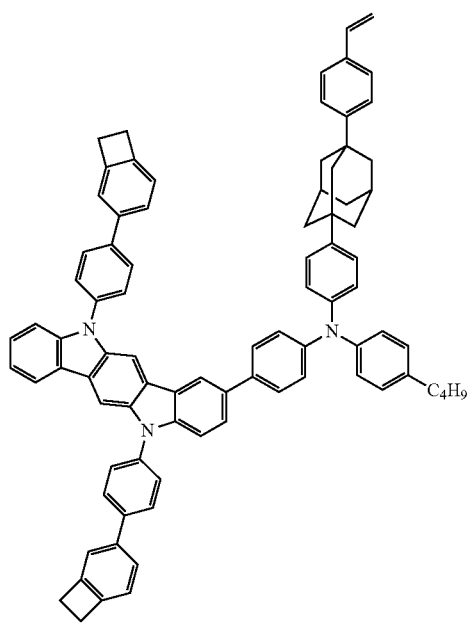
27
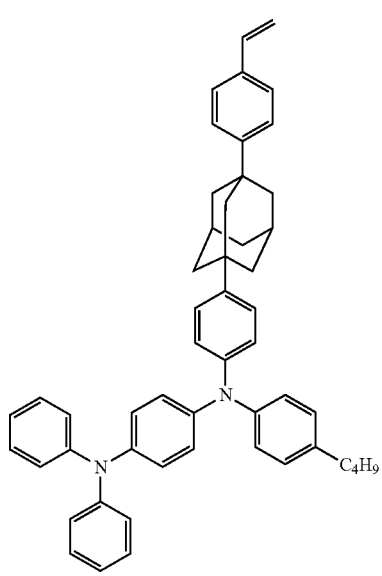
28
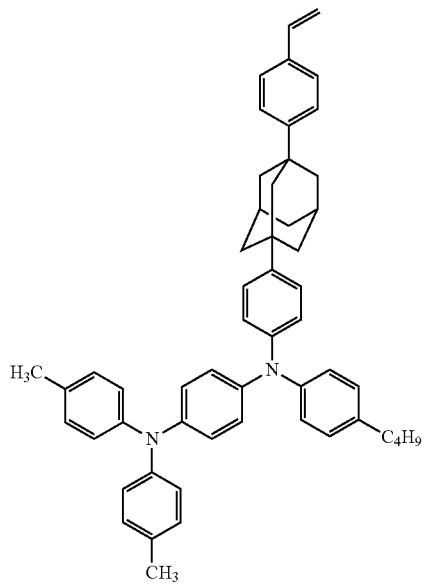
29
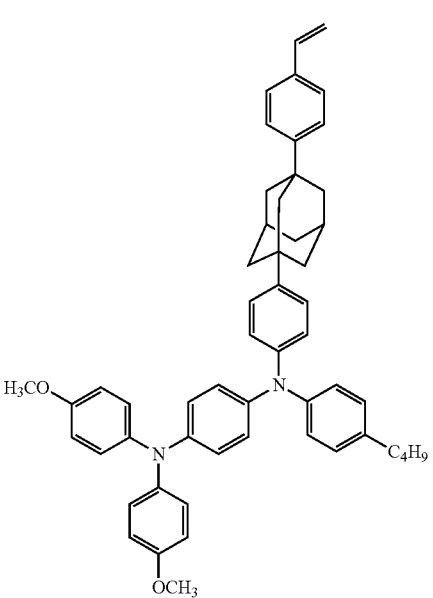

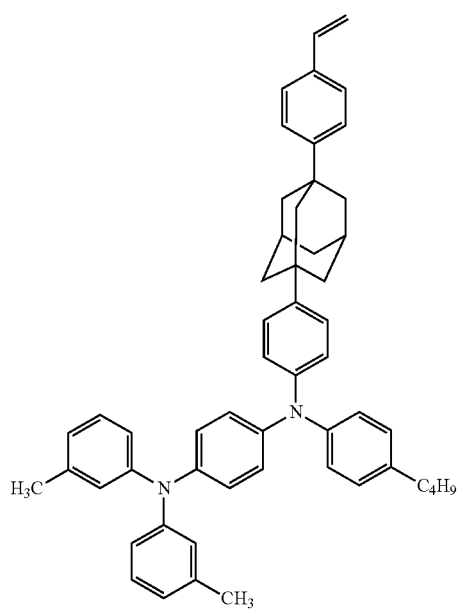
30
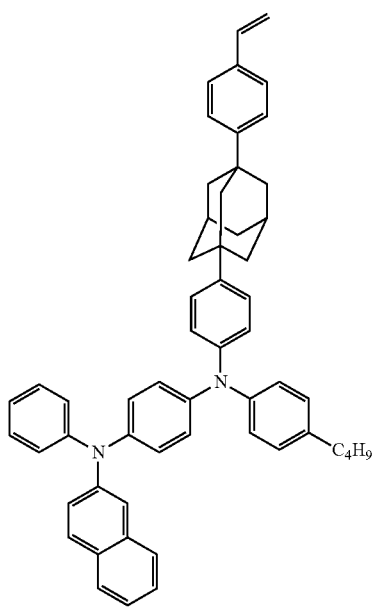
32
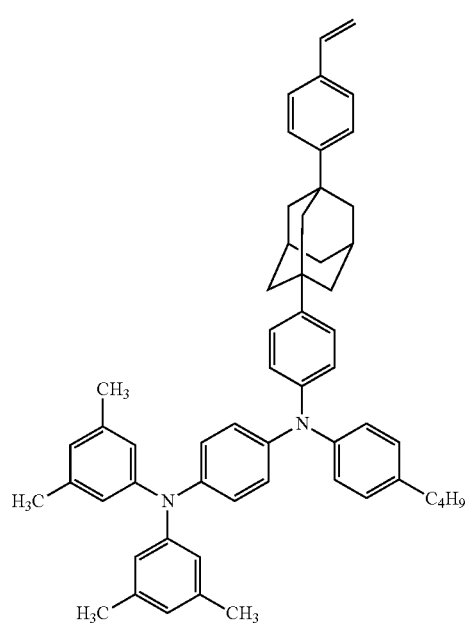
31
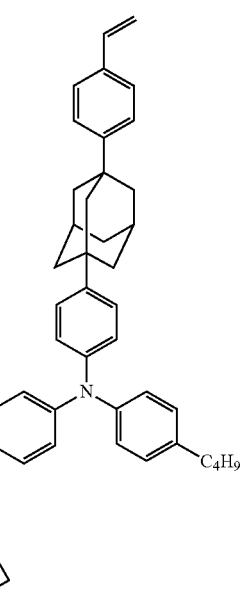
33

-continued
34
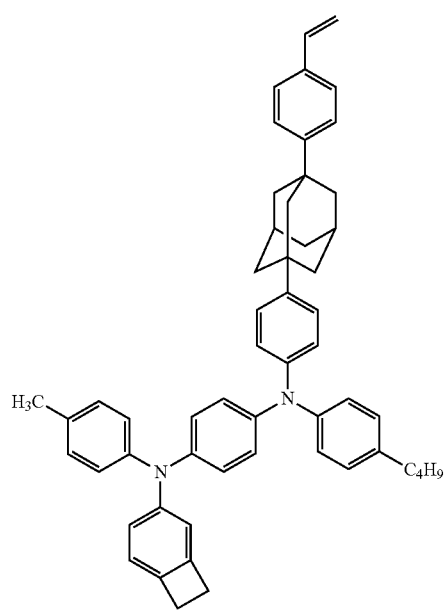
35
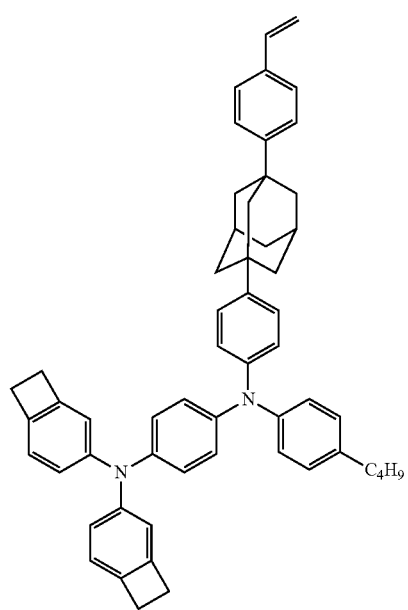
36
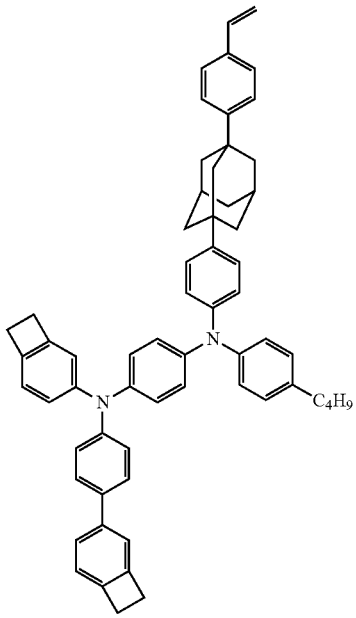
37
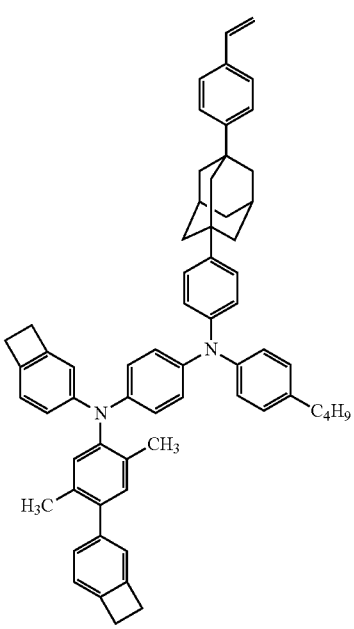

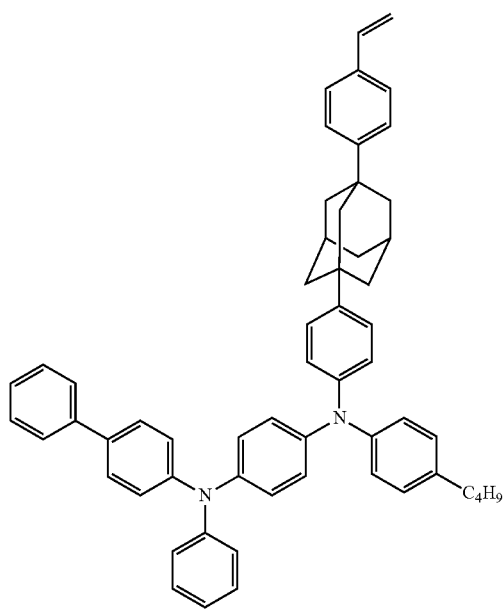
38
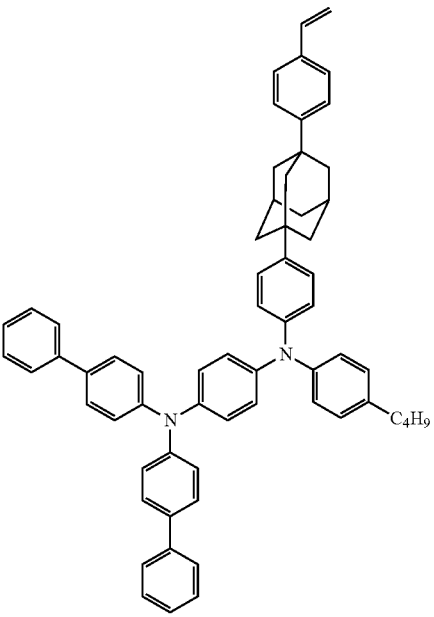
40
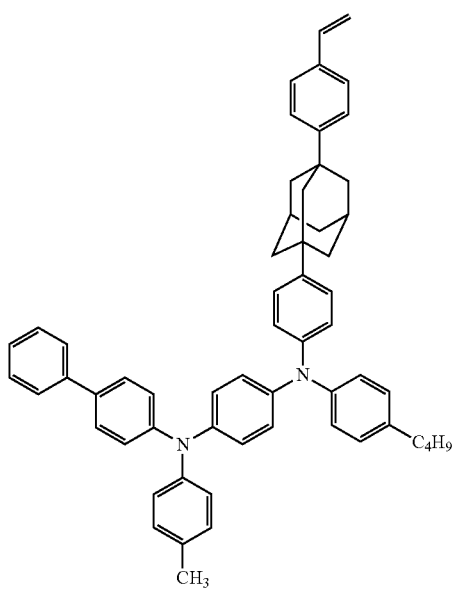
39
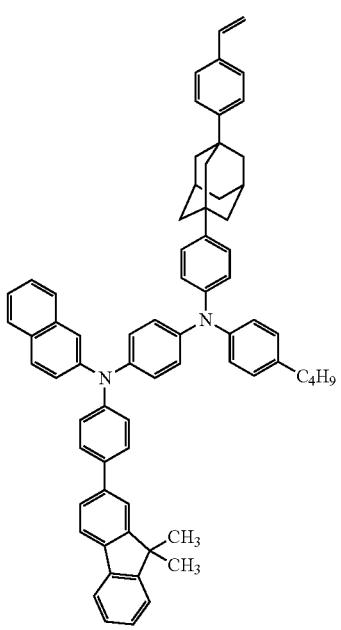
41

42
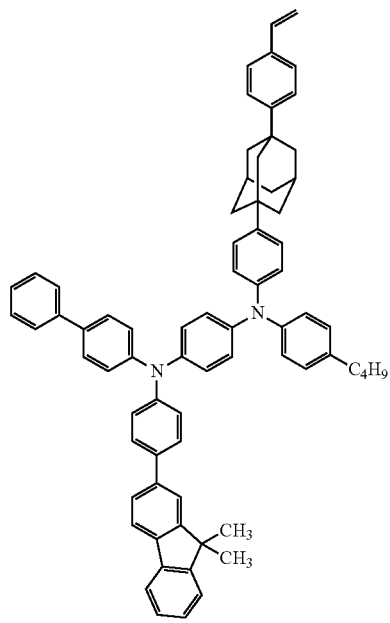
43
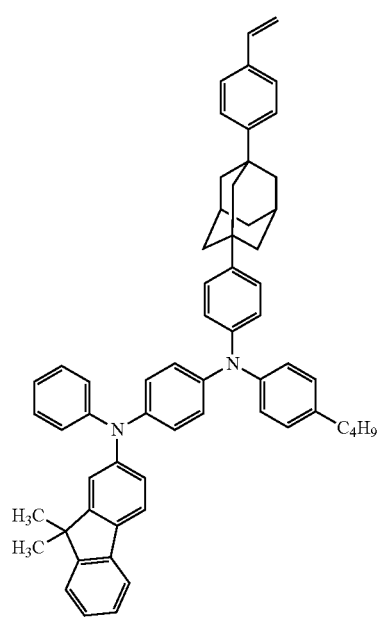
44
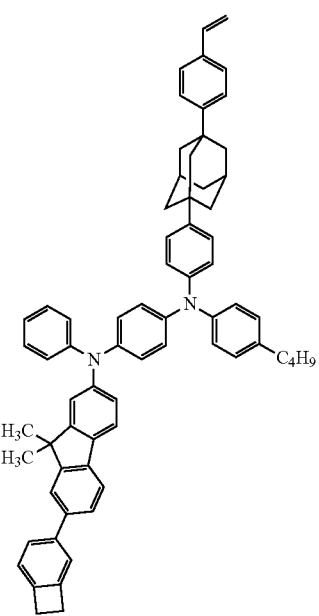
45
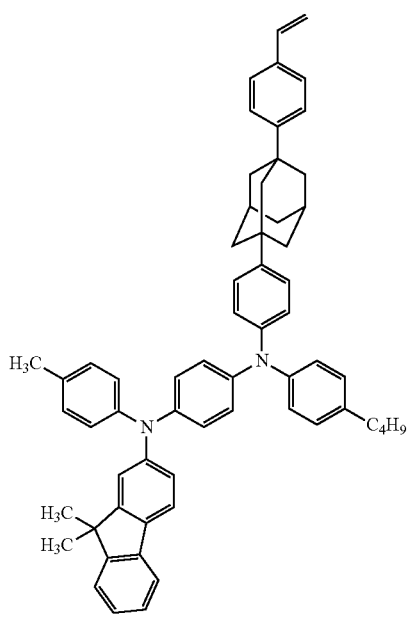

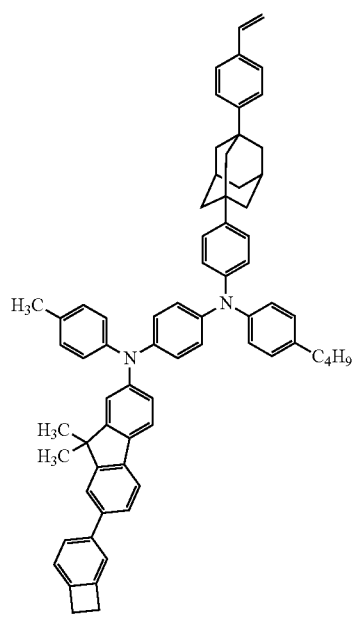
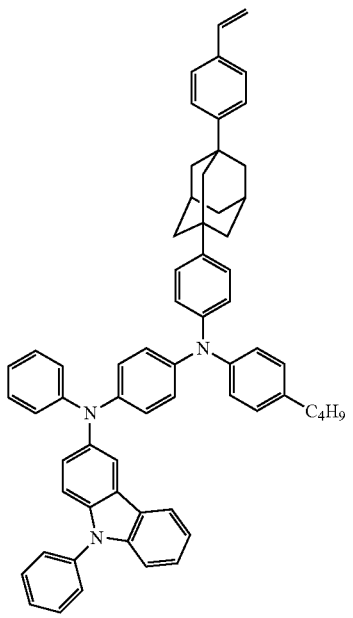

51
-continued
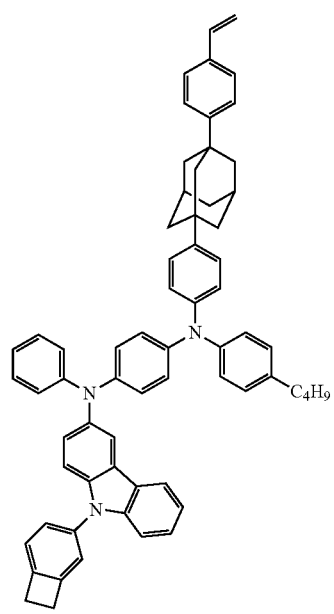
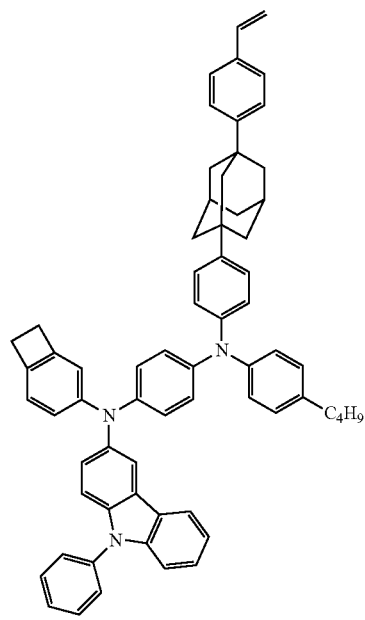
52
-continued
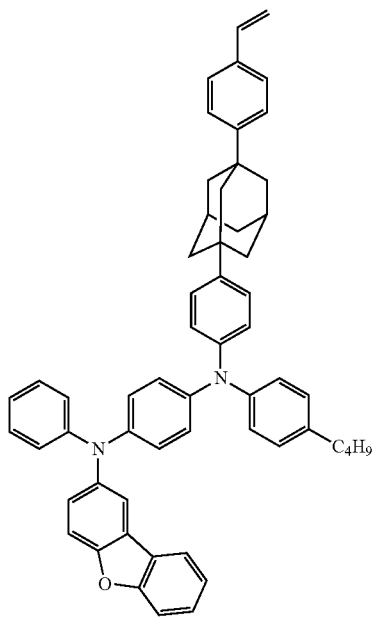
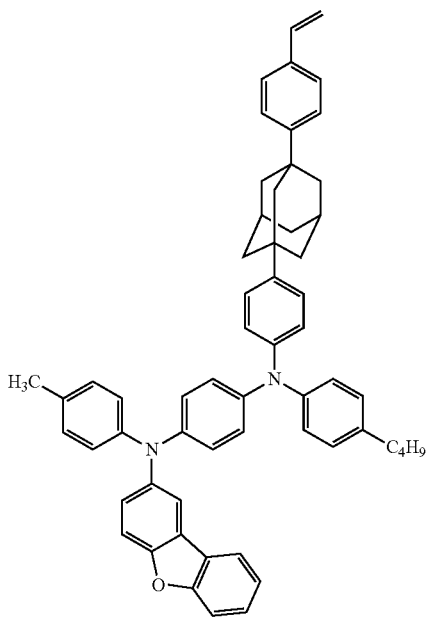

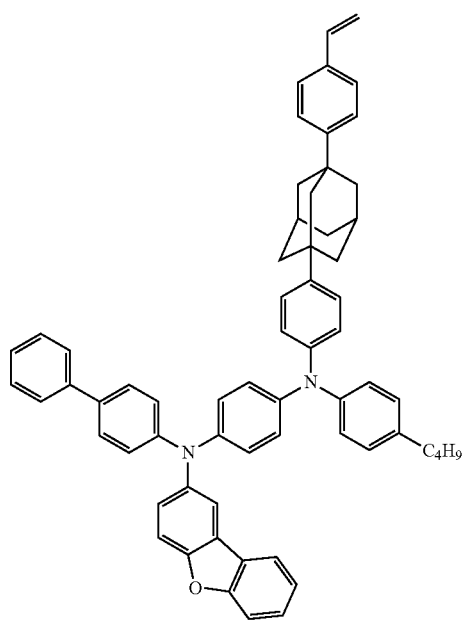
54
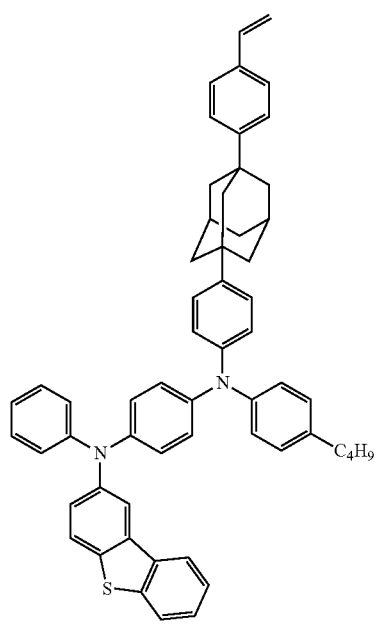
56
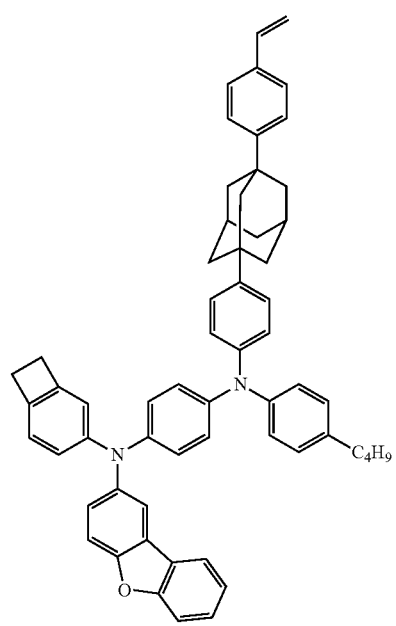
55
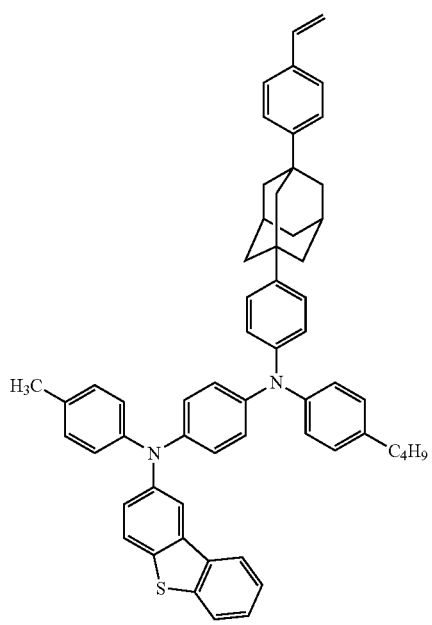
57

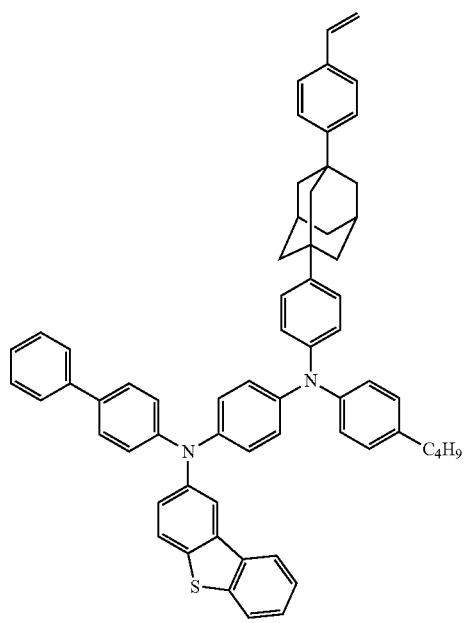
58
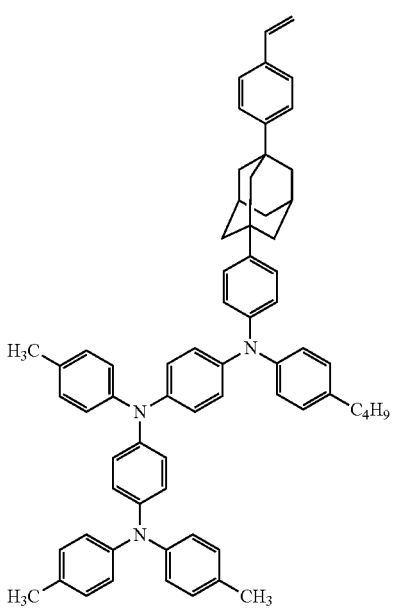
60
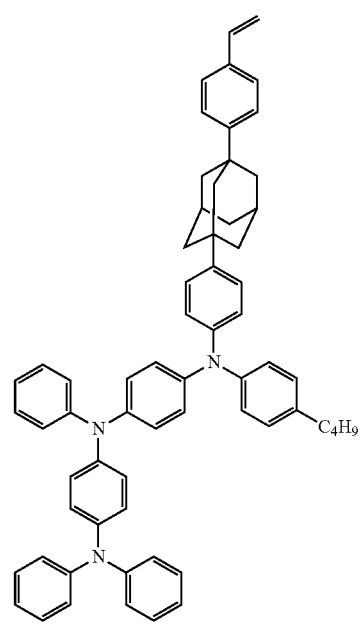
59
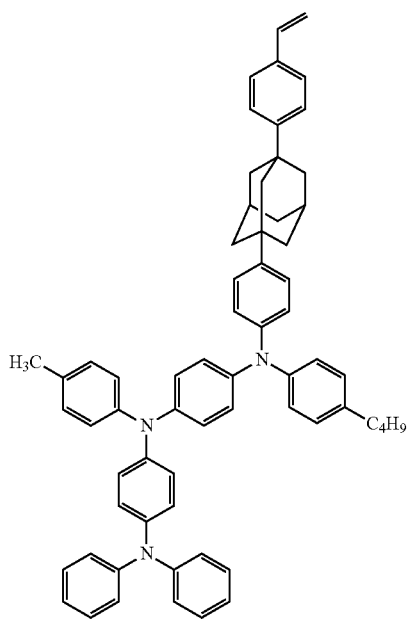
61

62
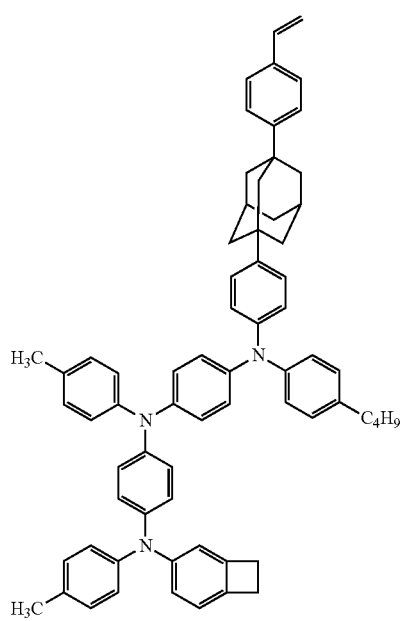
63
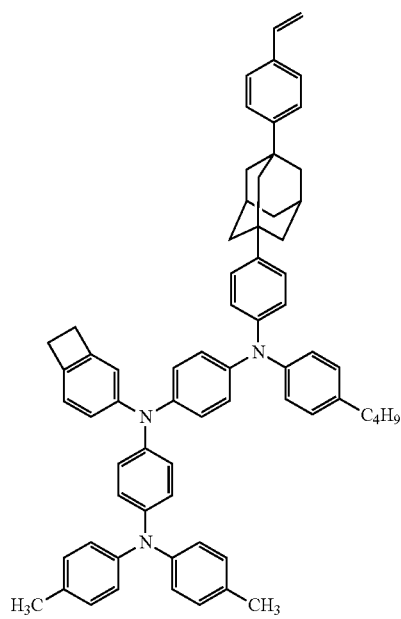
64
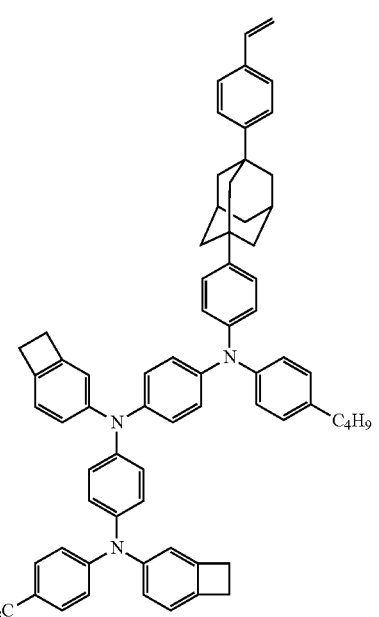
65
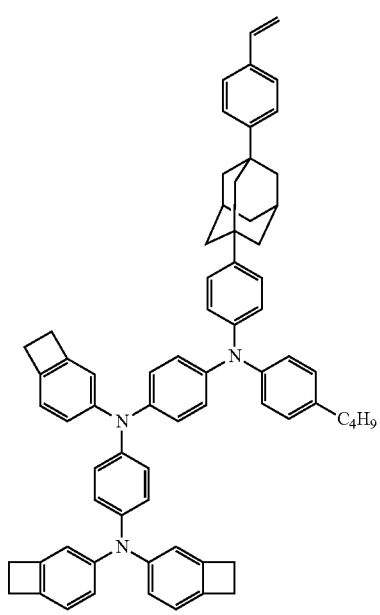

66
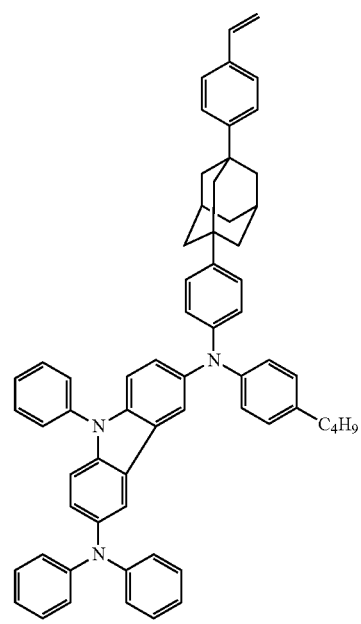
68
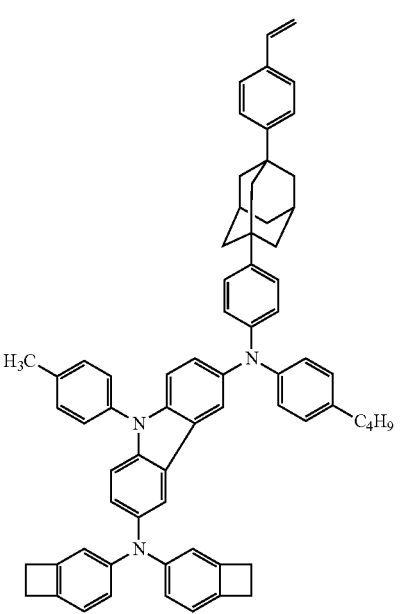
67
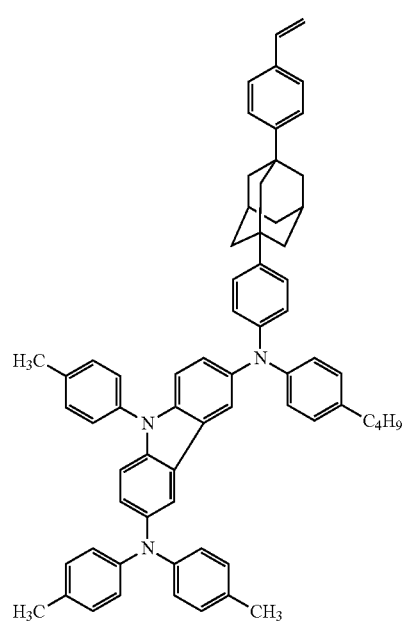
69
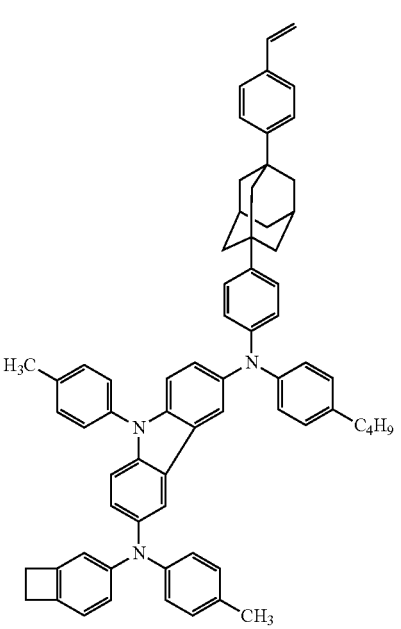

61
62
-continued
-continued
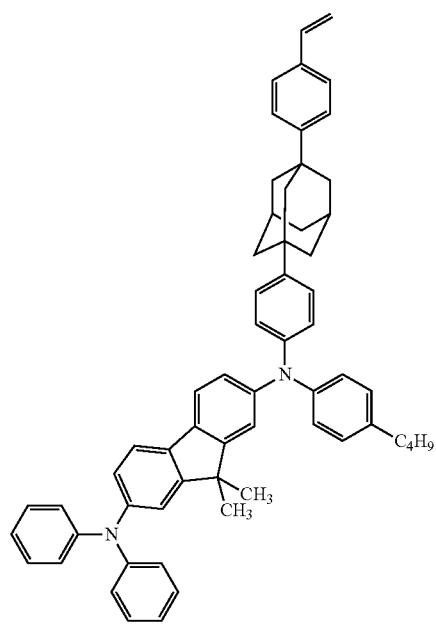
70
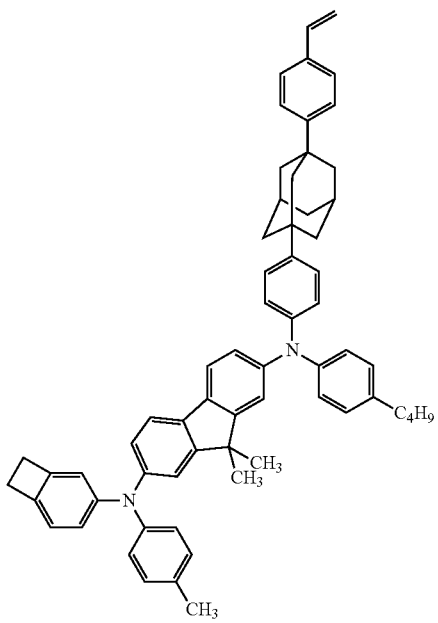
72
71
73

63
74
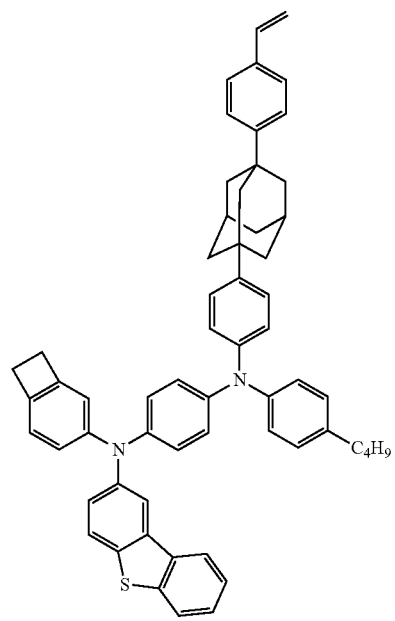
75
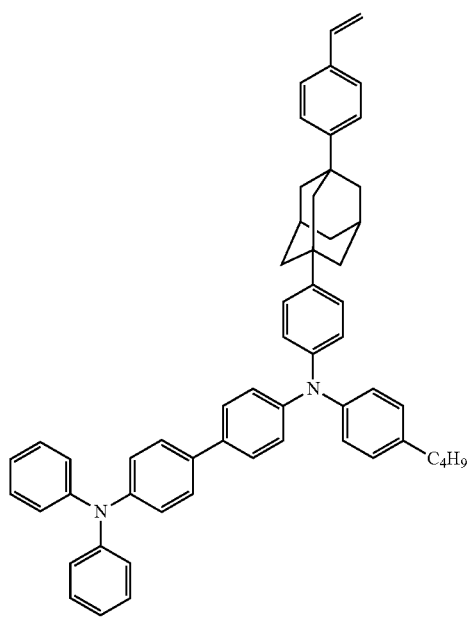
64
76
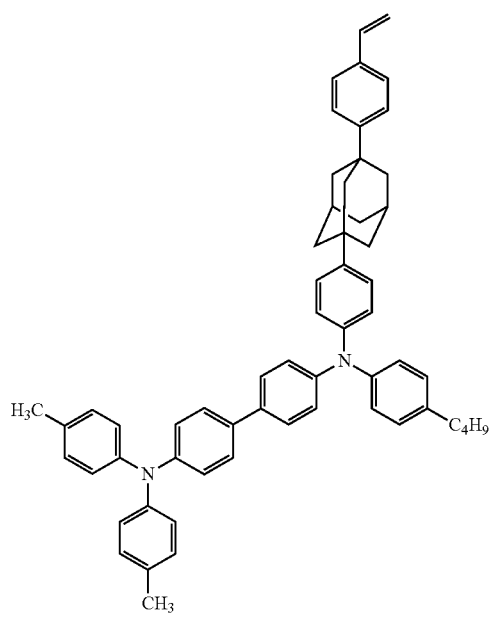
77
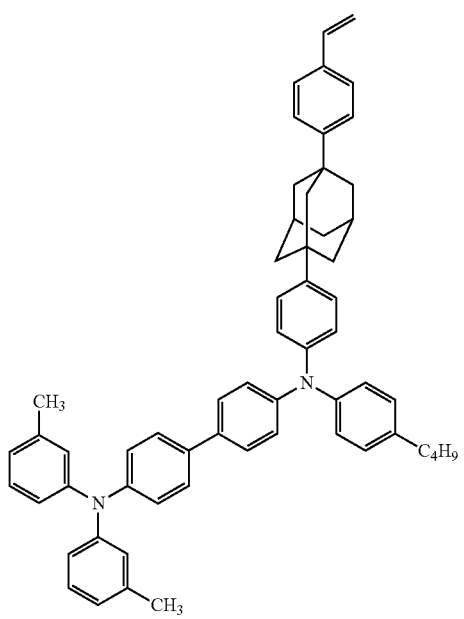

78
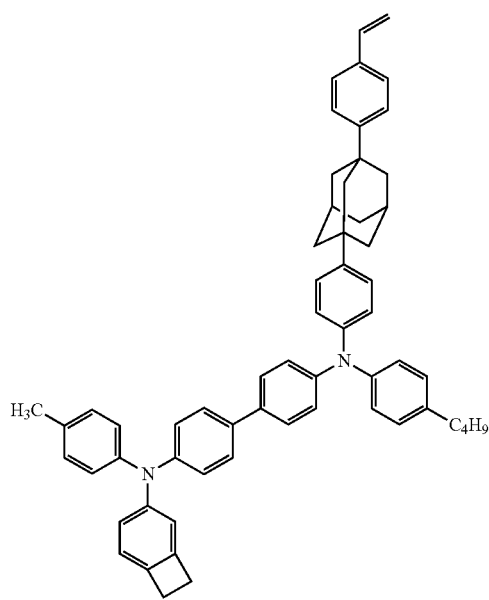
79
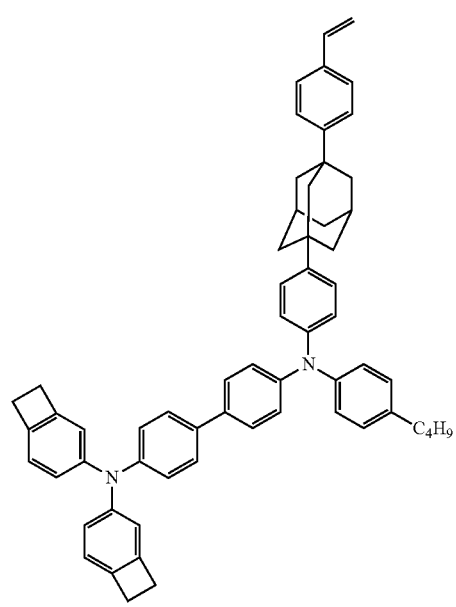
80
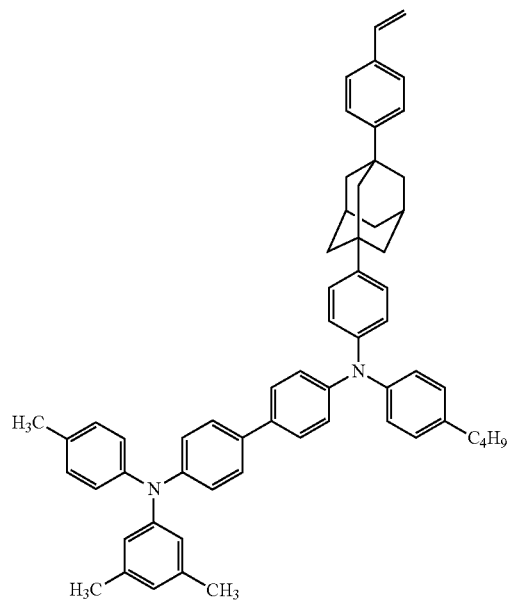
81
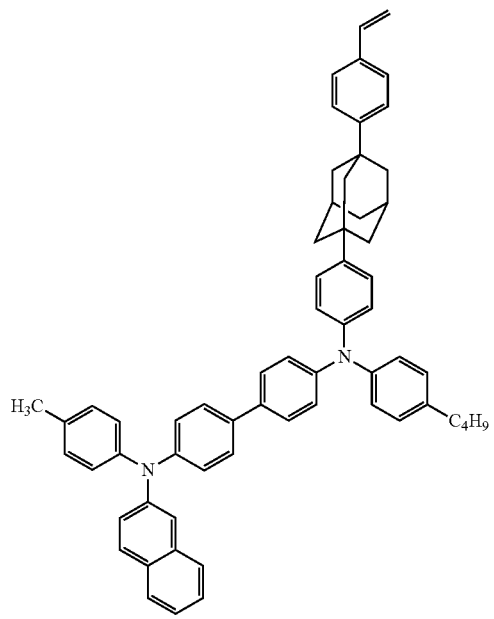

82
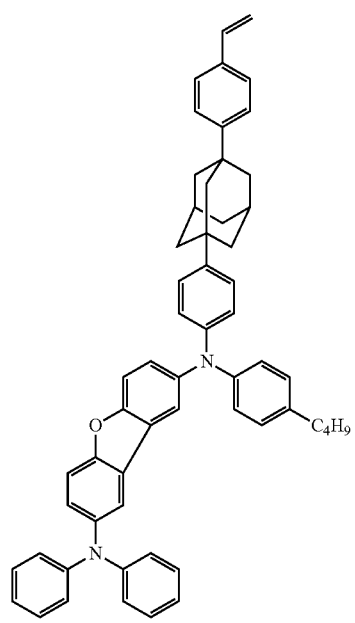
84
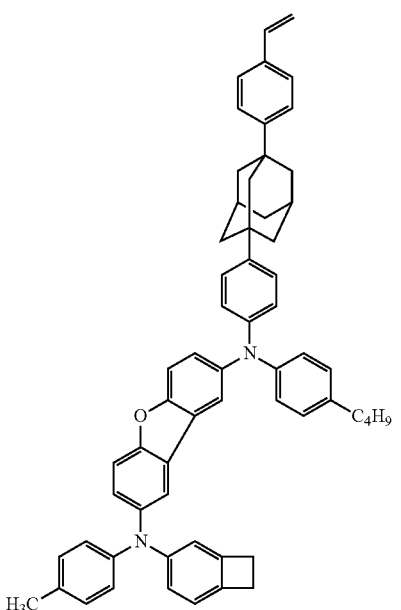
83
85
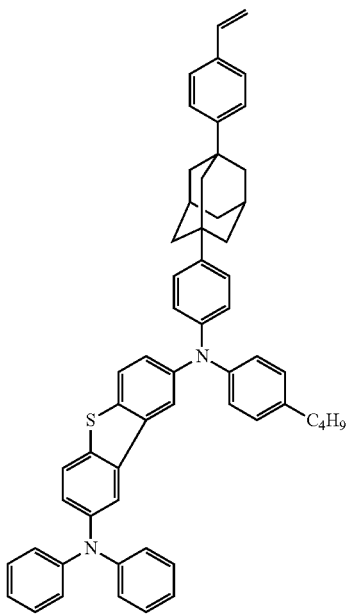

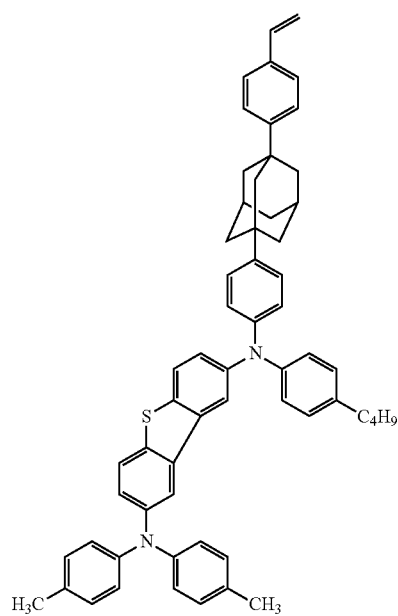
86
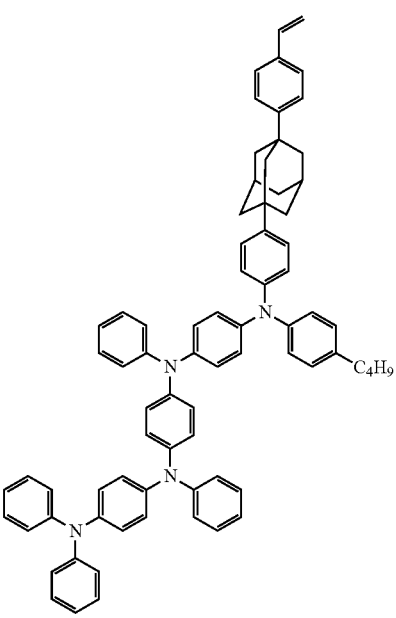
88
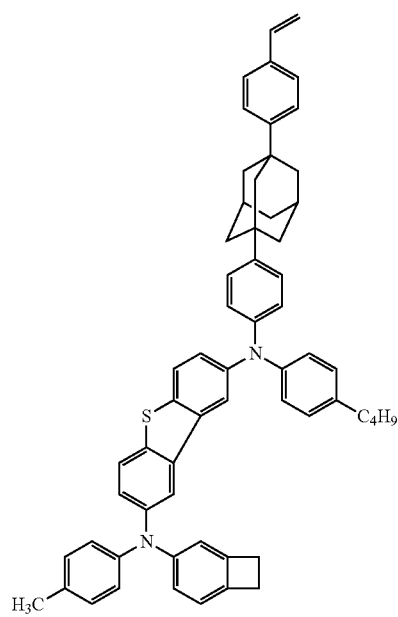
87
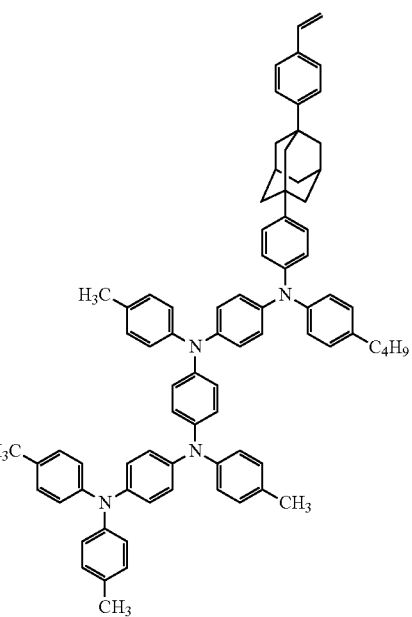
89

71
-continued
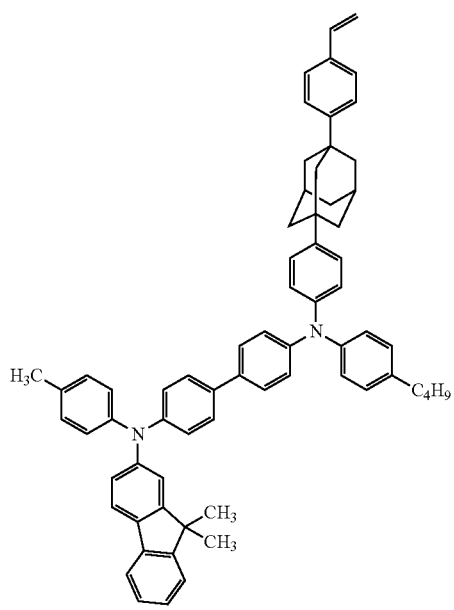
90
72
-continued
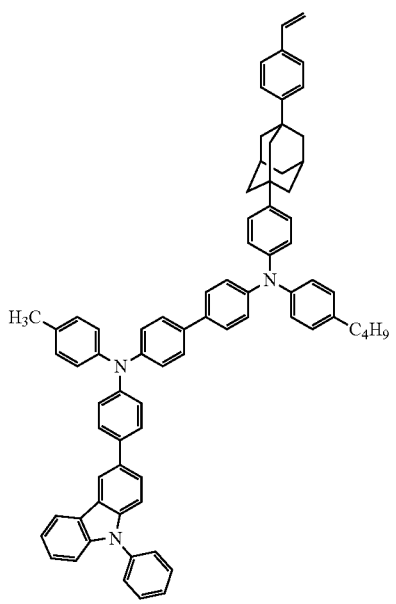
92
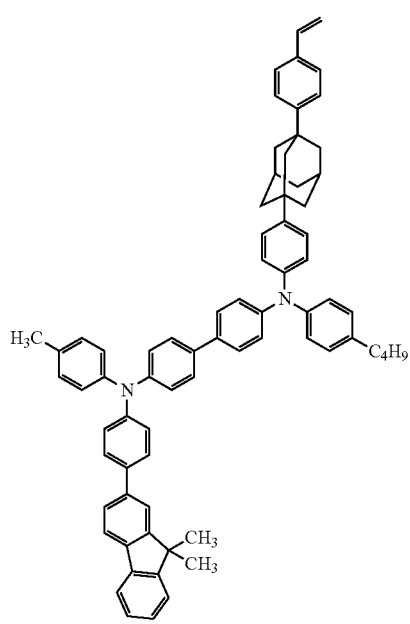
91
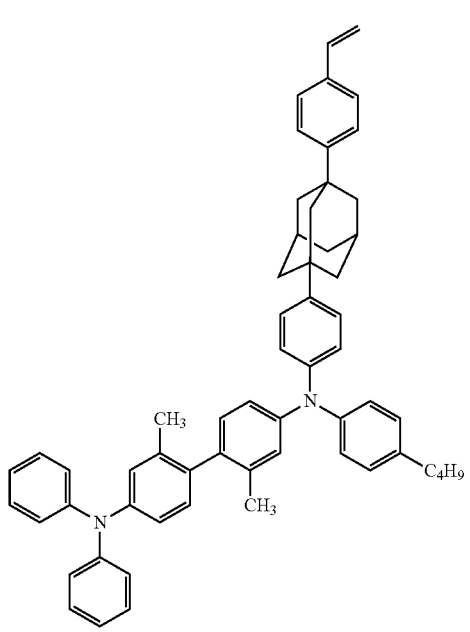
93

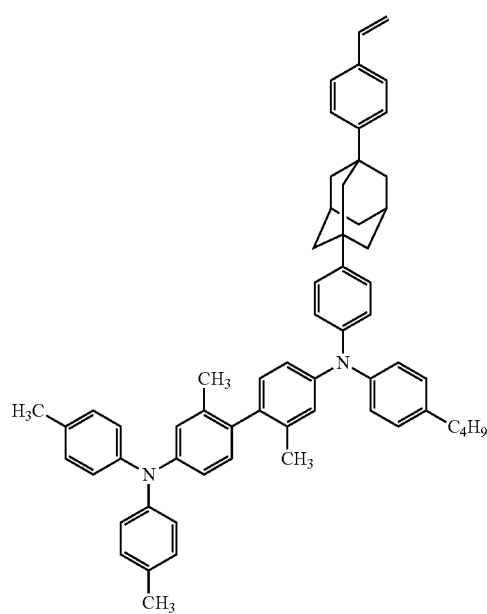
94
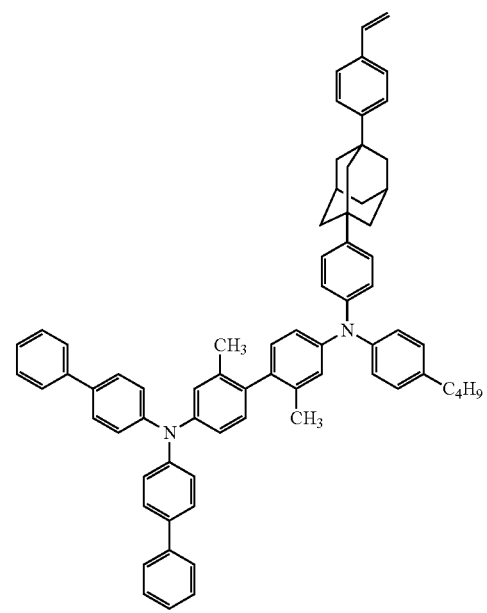
95
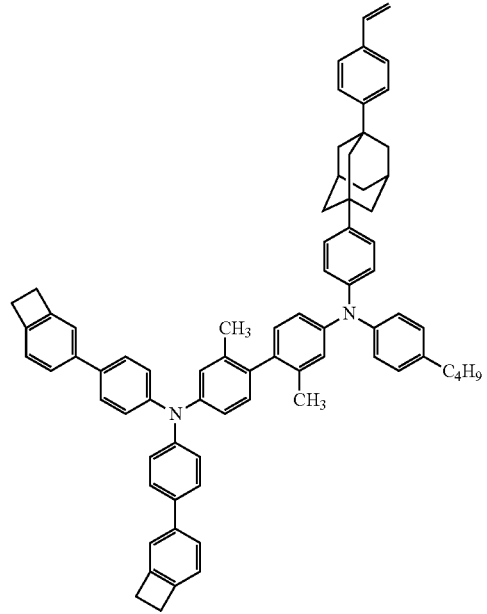
96
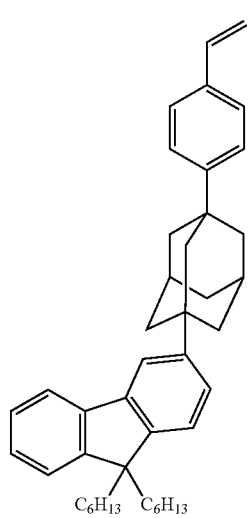
97
98

-continued
99
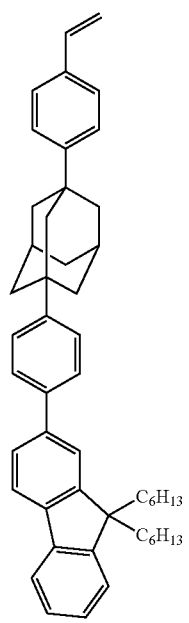
100
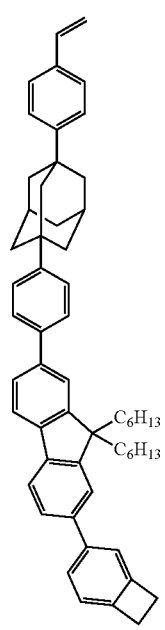
-continued
101
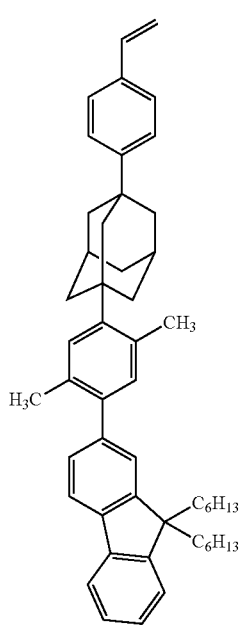
102
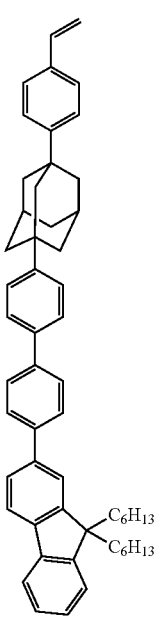

103
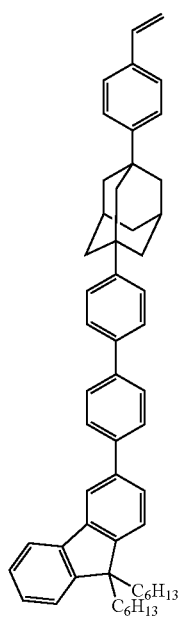
104
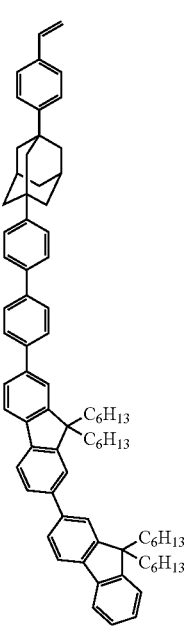
105
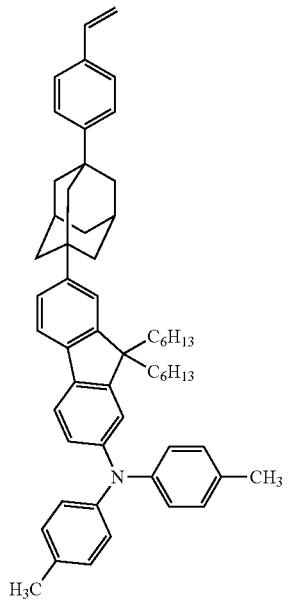
106
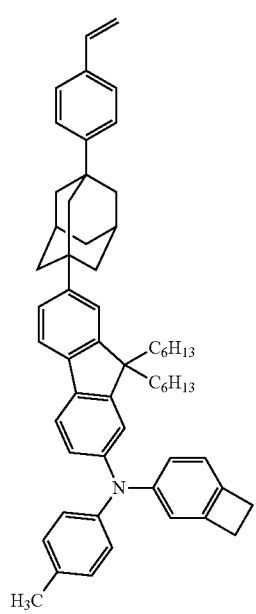

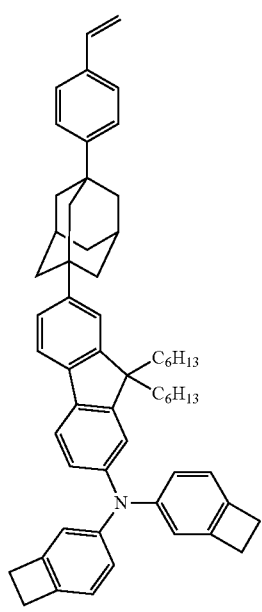
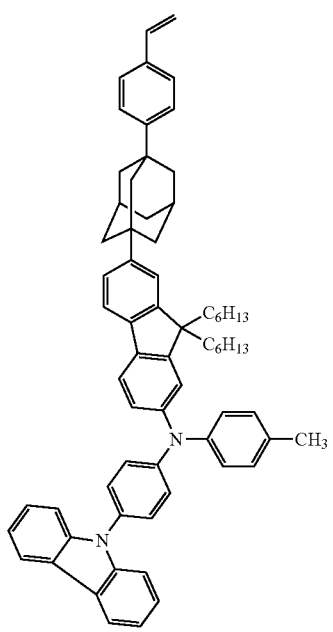
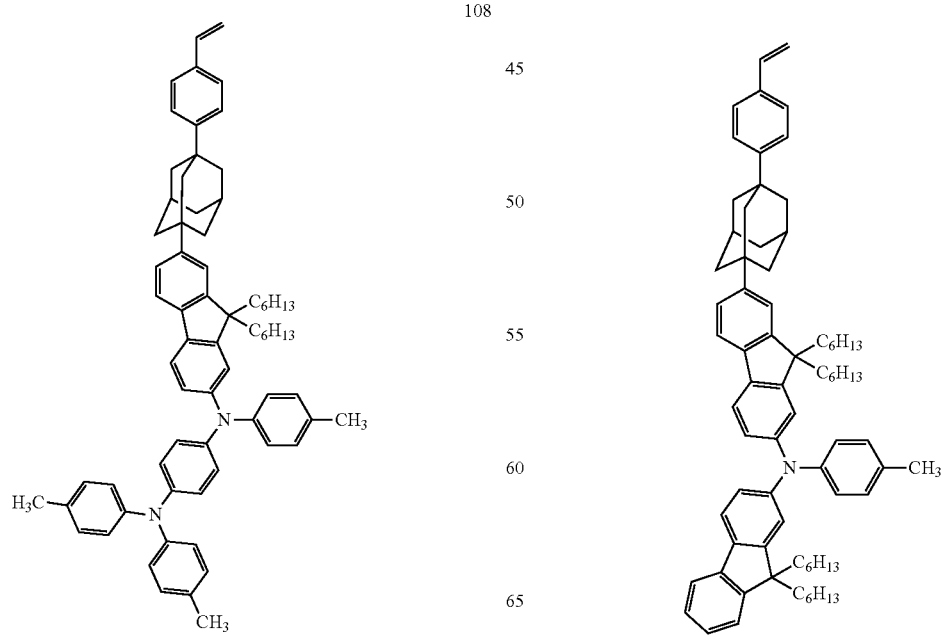

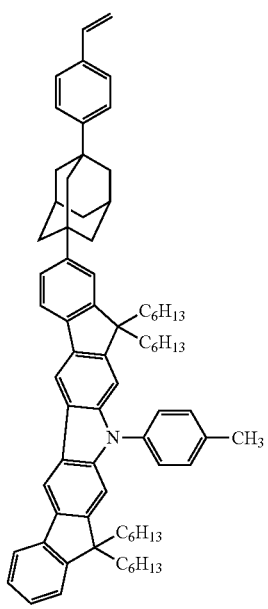
111
112
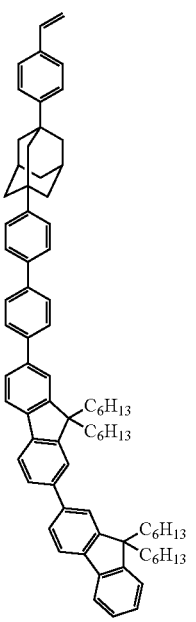
113
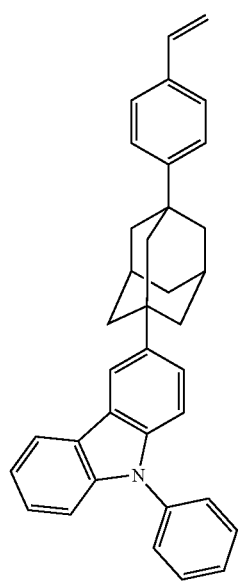
114

-continued
115
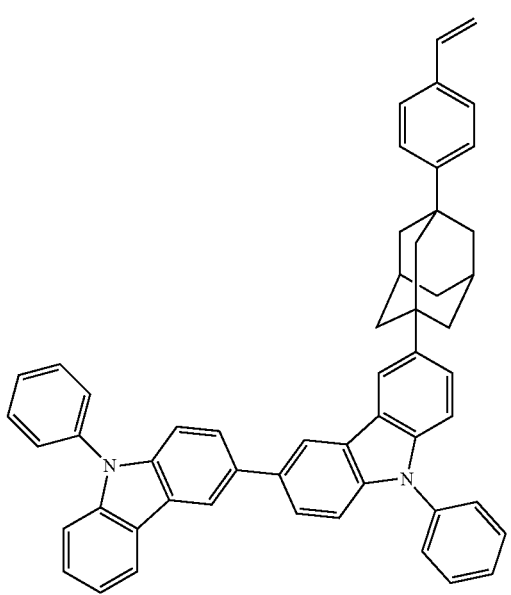
116
117
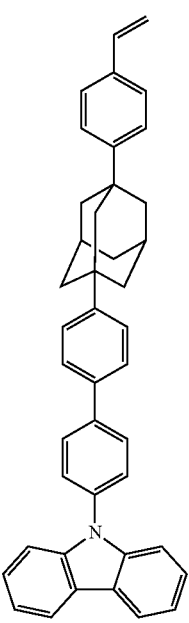
118

85
-continued
119
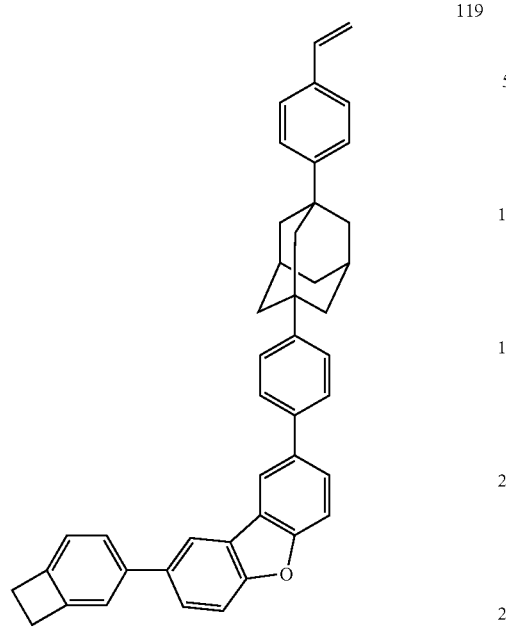
120
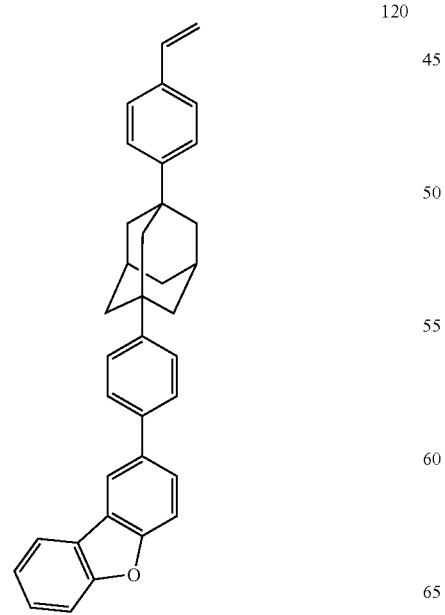
86
-continued
121
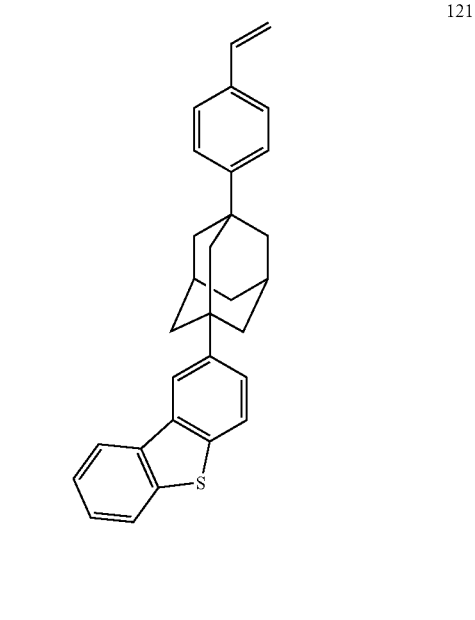
122
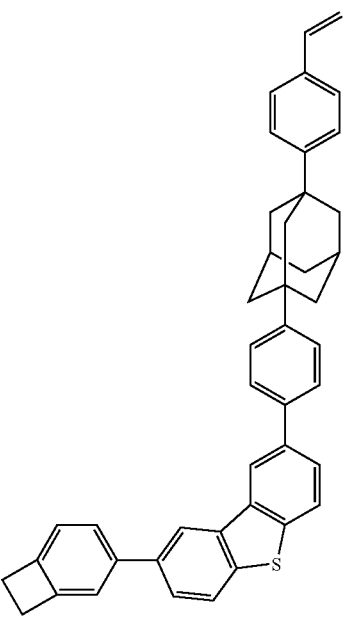

123
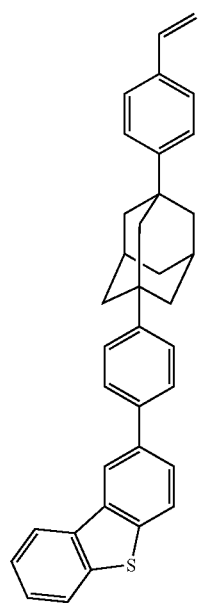
124
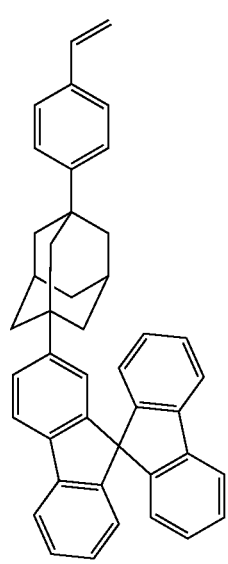
125
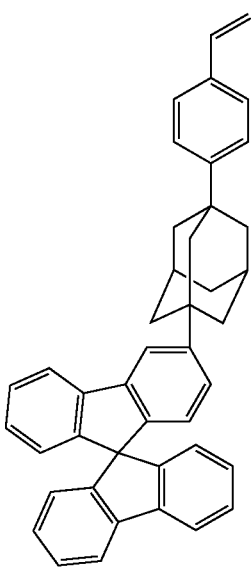
126
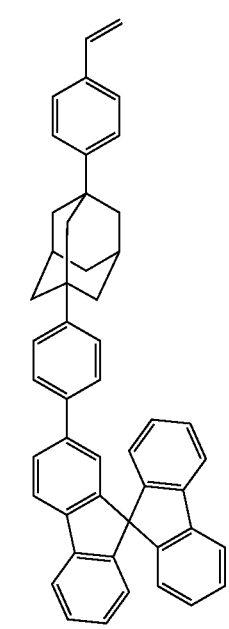

127
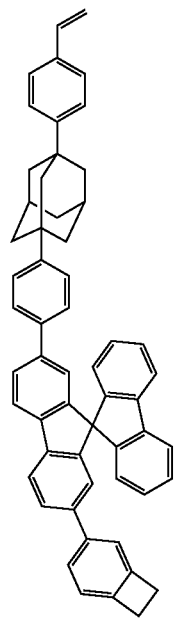
129
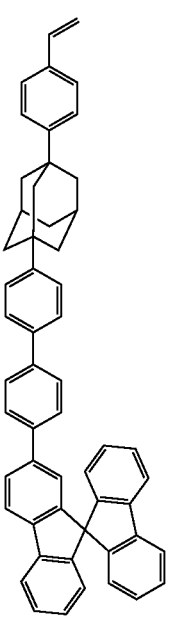
128
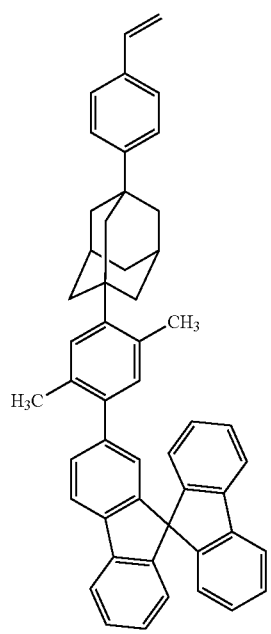
130
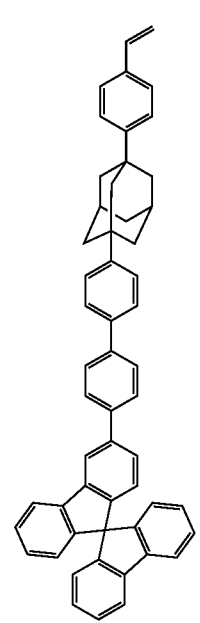

91 92
-continued -continued
131 133
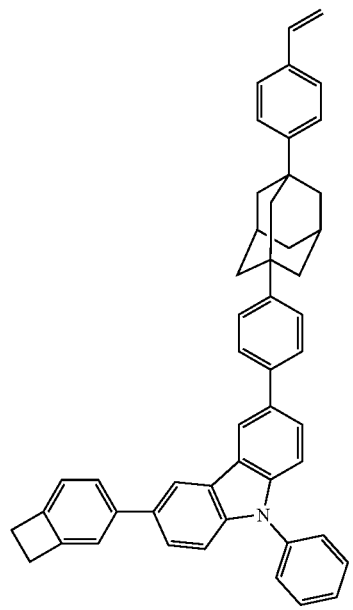
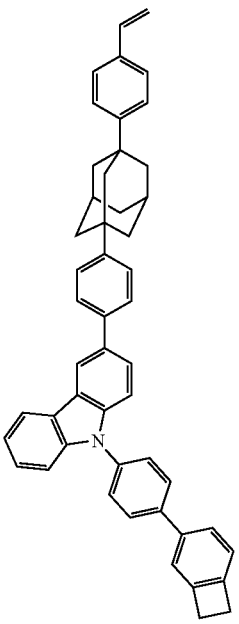
132 134
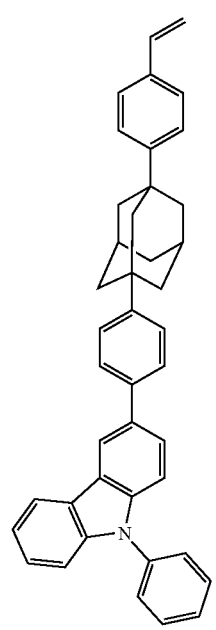
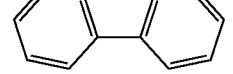

135
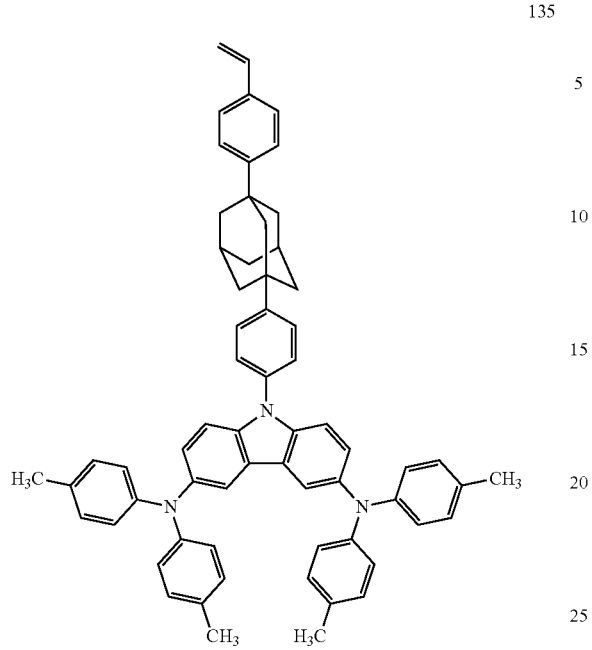
136
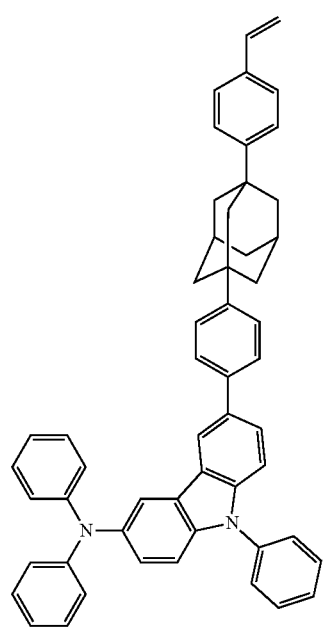
137
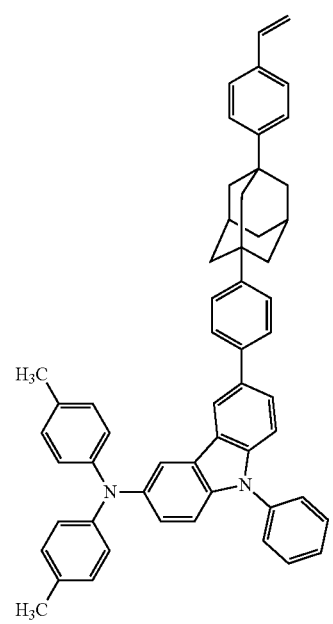
138
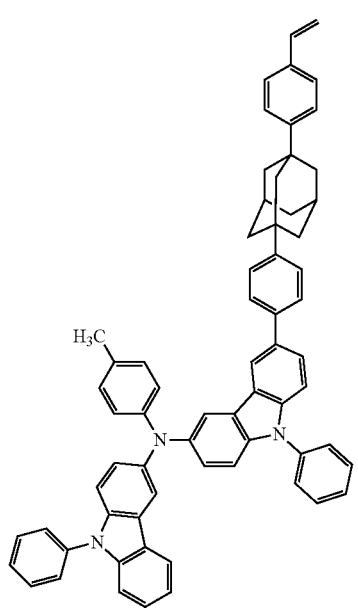

139
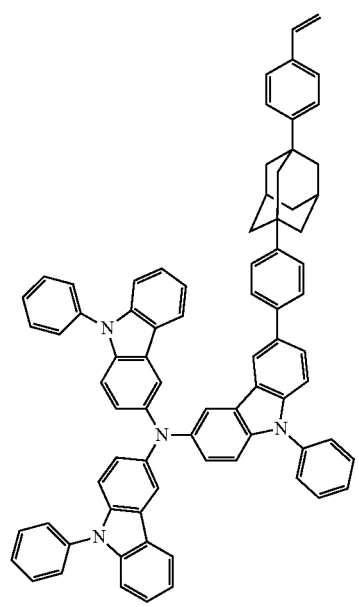
140
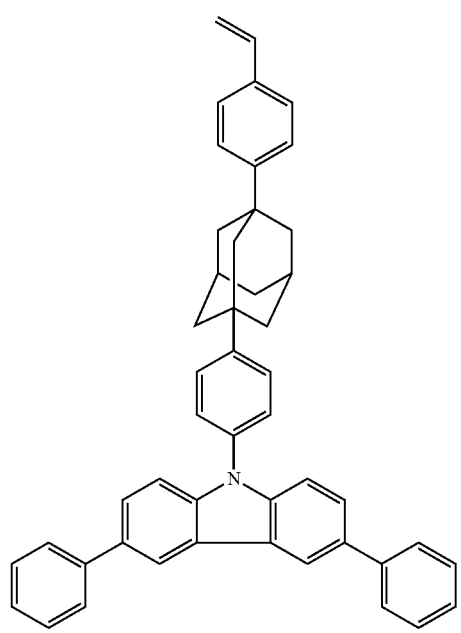
141
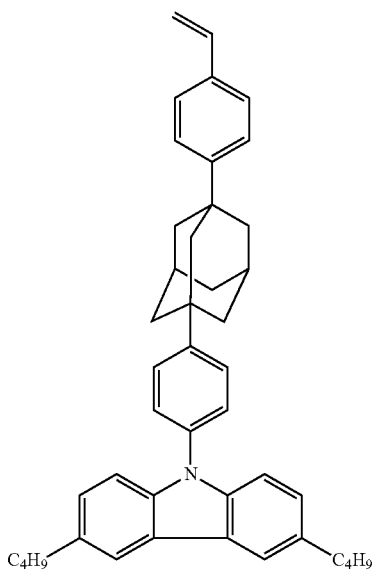
142
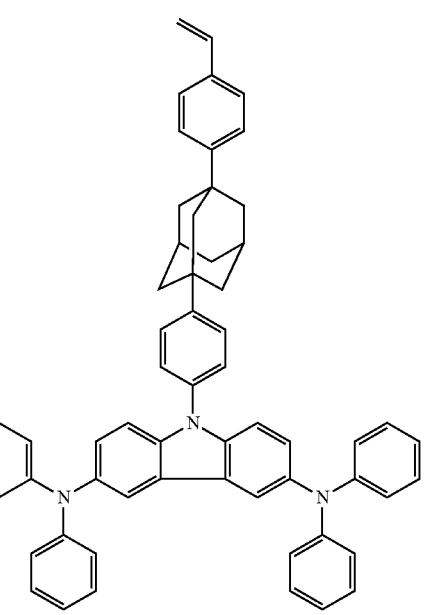

97
-continued
143
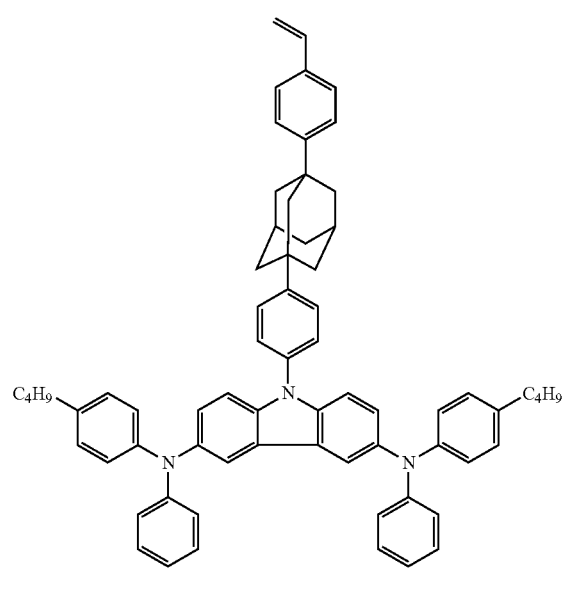
144
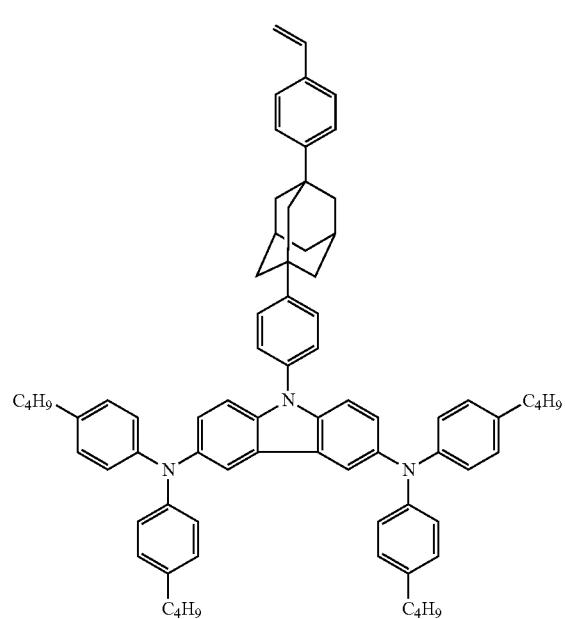
98
-continued
145
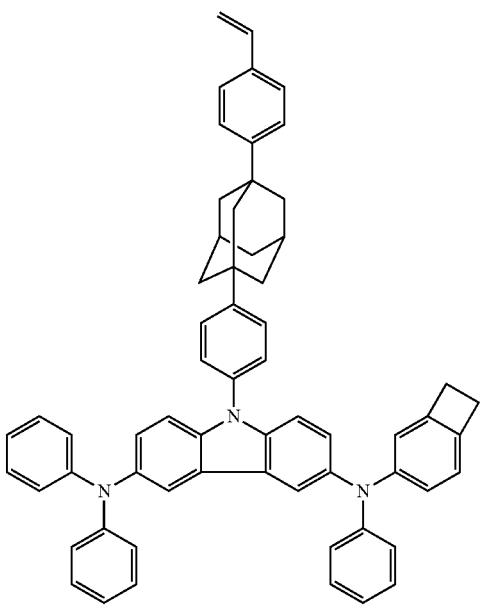
146
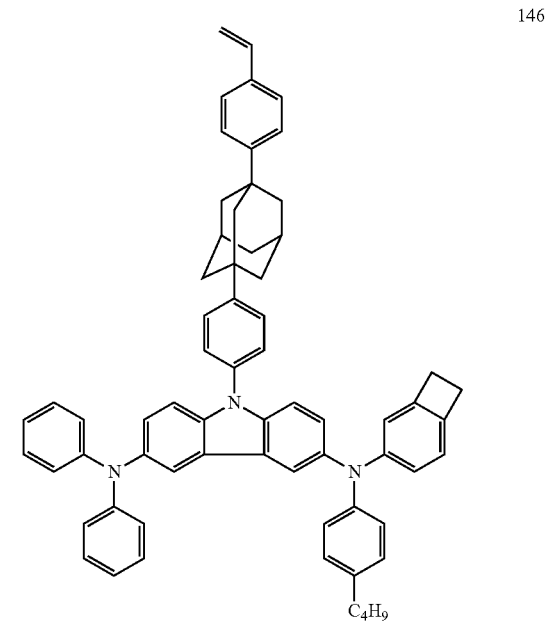

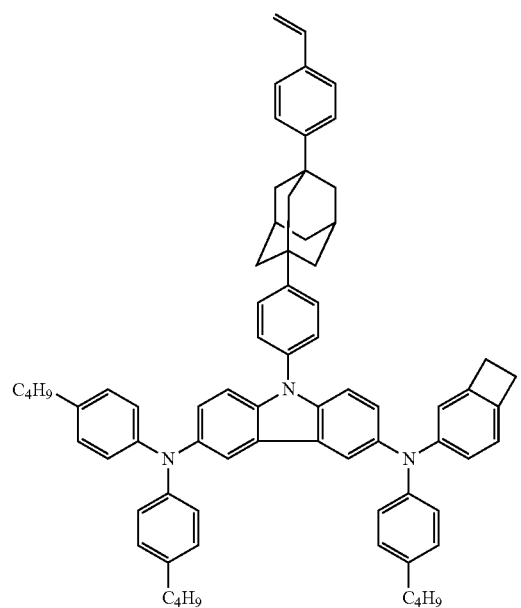
147
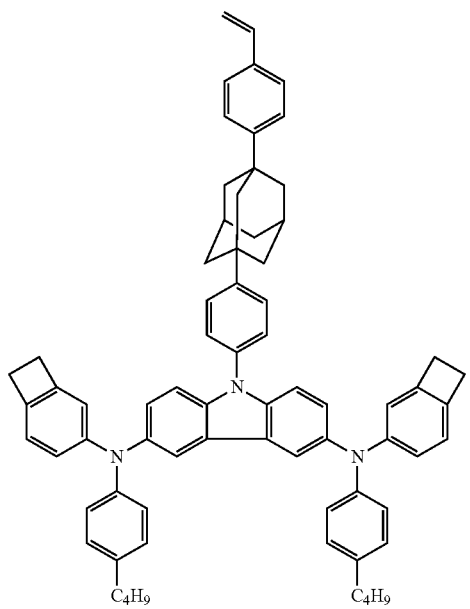
149
148
150

101
-continued
151
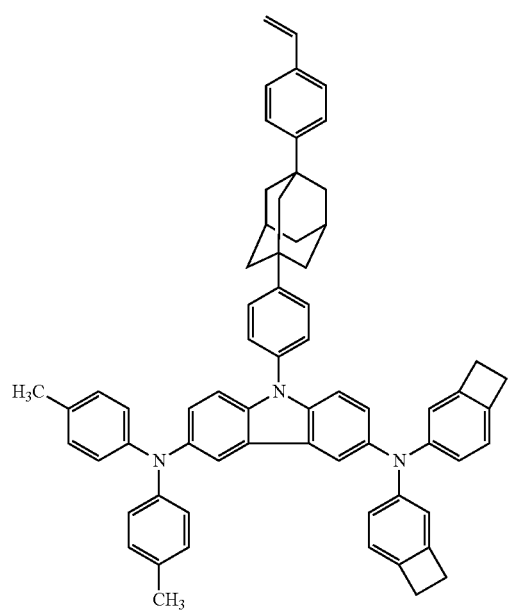
152
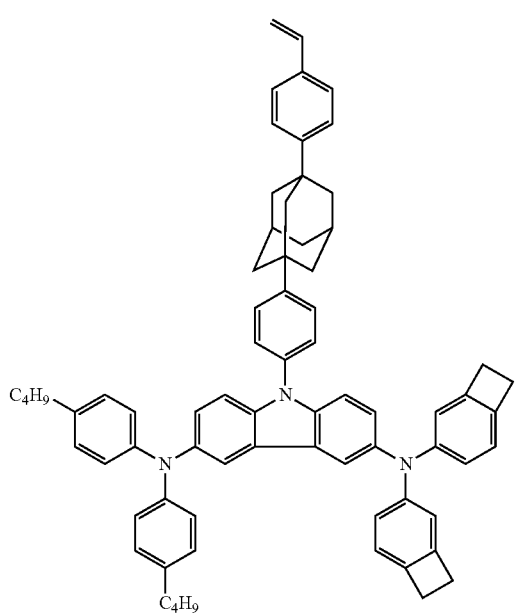
102
-continued
153
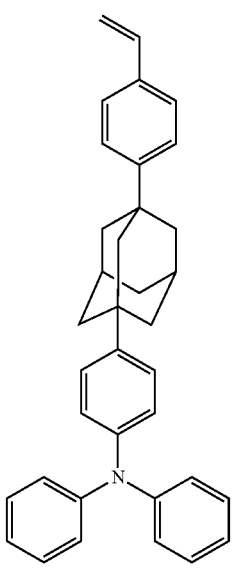
154
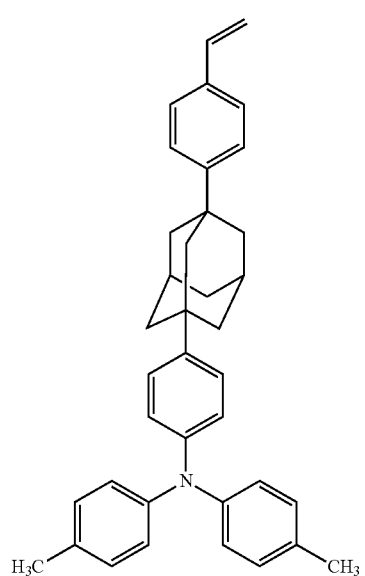

155
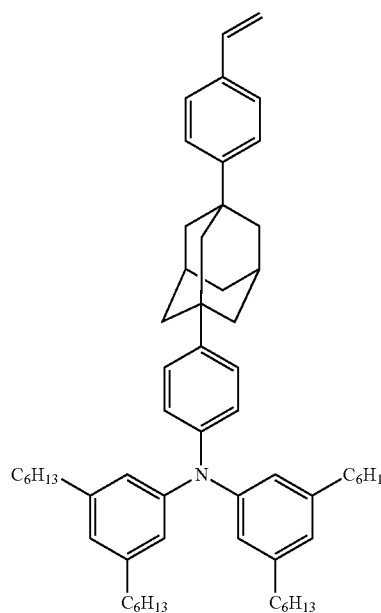
156
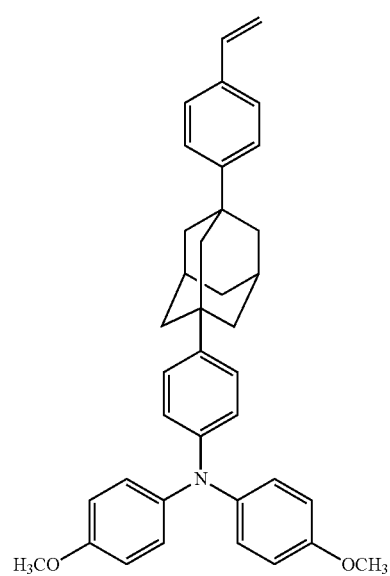
157
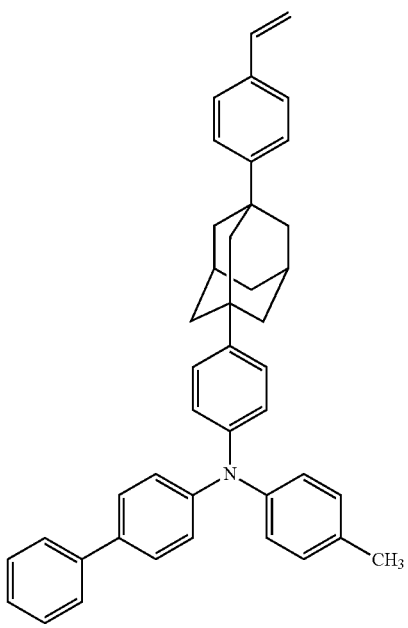
158
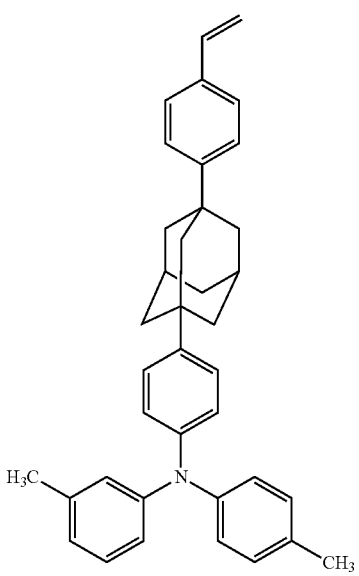

-continued
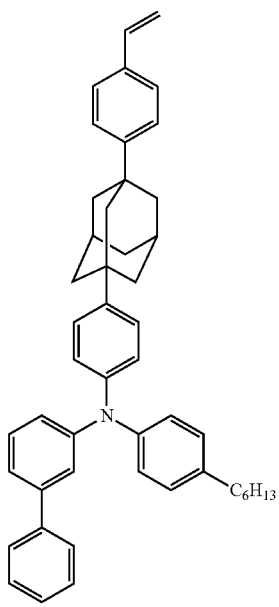
159
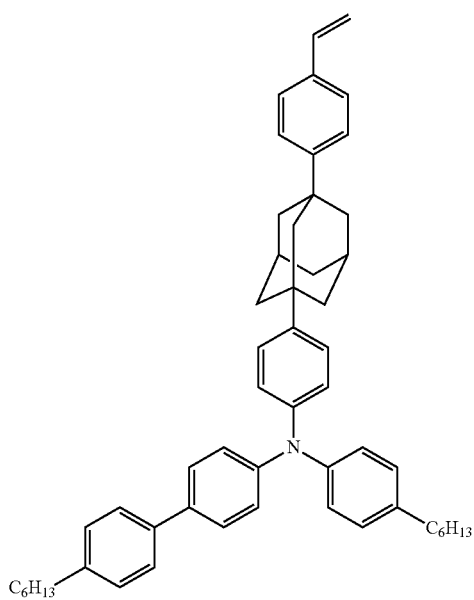
160
-continued
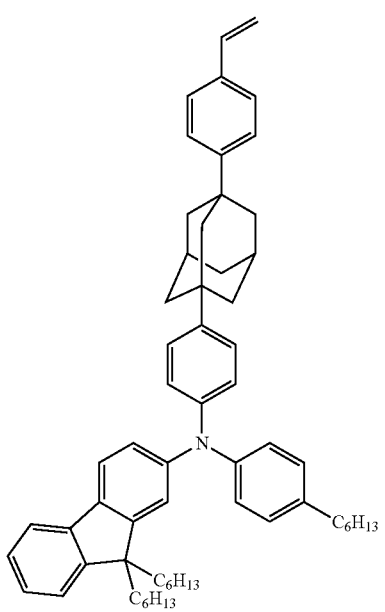
161
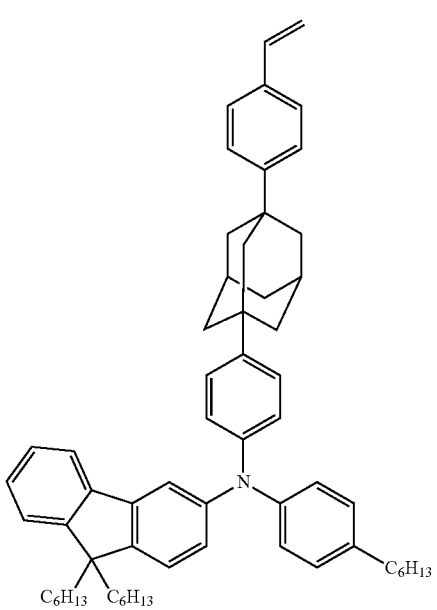
162

163
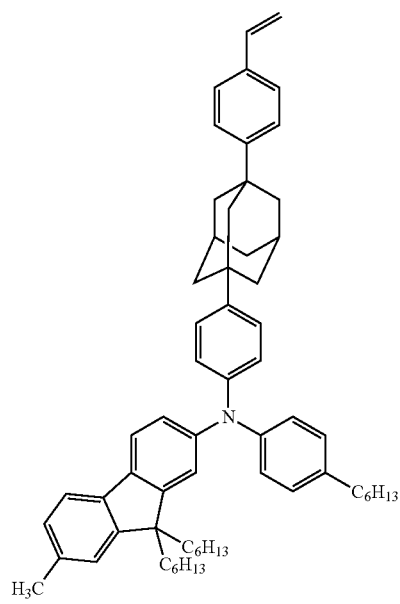
165
164
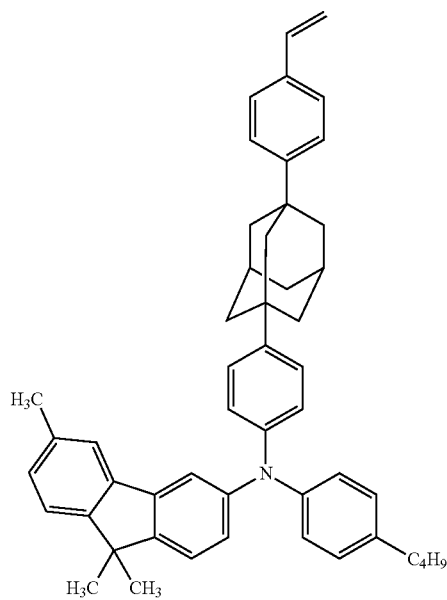
166
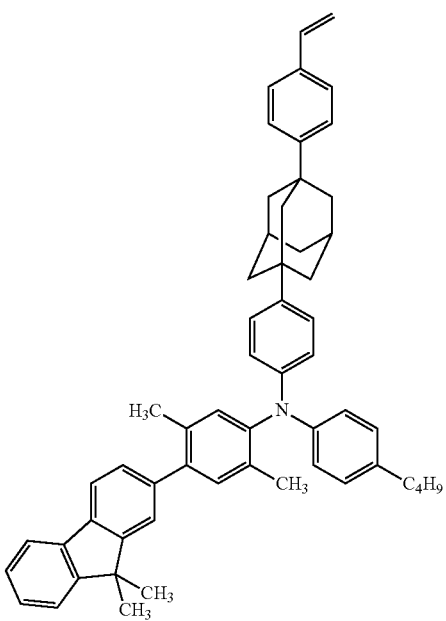

-continued

167

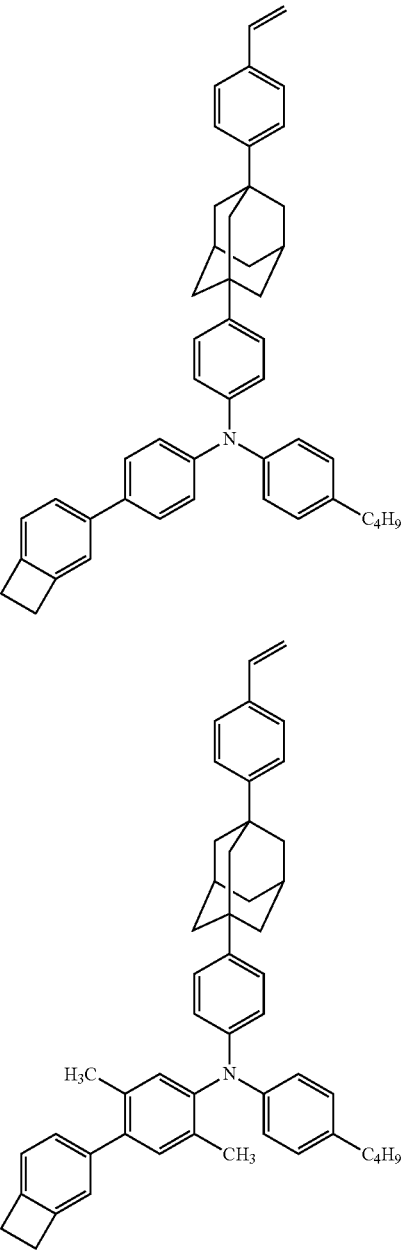

168

When the material for an organic light-emitting device is a copolymer, the material may be prepared by polymerizing at least one selected from example monomers 1 to 170 and an ethylenically unsaturated monomer that constitutes the residual repeating unit. In some embodiments, the material may be prepared by using identical monomers or two or more different monomers selected from example monomers 1 to 170.

The monomers used in preparing the material for an organic light-emitting device may be synthesized by using known synthesis methods, and structures of the monomers may be identified by, for example, NMR and LC-MS.

A polymerization method for the preparation of the material for an organic light-emitting device is not limited, and for example, a known polymerization method, such as radical polymerization, anion polymerization, or cation polymerization, may be used.

A solvent for the polymerization in preparing the material for an organic light-emitting device may be, for example, selected from toluene, xylene, diethyl ether, chloroform, ethyl acetate, methylene chloride, tetrahydrofuran, acetone, acetonitrile, N,N-dimethylformamide, and dimethylsulfoxide. In some embodiments, the solvent may be toluene. These solvents may be used alone or two or more different solvents may be used together.

A concentration of a monomer in the solvent (in the case of a plurality of monomers, the concentration of total monomers) may be in a range of 10 to 90 percent by weight (wt %) based on a total reaction solution. For example, the monomer concentration in the solvent may be in a range of 15 to 80 wt %, but is not limited thereto.

A polymerization temperature may be in a range of 40 to 100° C. when the control of a molecular amount is taken into consideration, but is not limited thereto.

A polymerization reaction may be performed for 30 minutes to 24 hours, but is not limited thereto.

Once a monomer is added to the solvent, the solvent may be subjected to deaeration before a polymerization initiator is added thereto. For example, the deaeration may be a freeze deaeration, or a deaeration using inert gas, such as nitrogen gas, but is not limited thereto.

The polymerization initiator may be any polymerization initiator that is used in the art, and, for example, may be selected from benzophenone, peroxide benzoyl, peroxide acetyl, peroxide lauroyl, and azobisisobutyronitrile, but is not limited thereto. An amount of the polymerization initiator added thereto may be in a range of, for example, 0.0001 to 1 mole (mol), based on 1 mol of total monomers used in preparing the material for an organic light-emitting device, but is not limited thereto.

A synthesis method for the material for an organic light-emitting device including the repeating unit (1) represented by Formula 1 may be apparent to one of ordinary skill in the art by referring to the following Synthesis Examples.

The material for the organic light-emitting device may be used in an organic light-emitting device. Accordingly, another aspect provides an organic light-emitting device including:

a first electrode;
a second electrode; and
an organic layer disposed between the first electrode and the second electrode, wherein the organic layer includes the material for the organic light-emitting device. When long lifespan and high efficiency of the organic light-emitting device are taken into consideration, the material for the organic light-emitting device may be included in at least one of a hole injection layer and a hole transport layer.

FIG. 1 is a cross-sectional view of an organic light-emitting device 100 according to an example embodiment.

The organic light-emitting device 100 of FIG. 1 includes the structure of a first electrode 120/hole injection layer 130/hole transport layer 140/emission layer 150/electron transport layer 160/electron injection layer 170/second electrode 180, but the structure thereof is not limited thereto. In some embodiments, the organic light-emitting device 100 may have a structure of first electrode/single film having a hole injection capability and a hole transport capability/emission layer/electron transport layer/second electrode or first electrode/single film having a hole injection capability and a hole transport capability/emission layer/electron transport layer/electron injection layer/second electrode.

The organic light-emitting device 100 may be a top emission-type device or a bottom emission-type device.

Hereinafter, the organic light-emitting device 100 according to the present embodiment will be described below with reference to FIG. 1.

The organic light-emitting device 100 includes a substrate 110, the first electrode 120 disposed on the substrate 110, the hole injection layer 130 disposed on the first electrode 120, the hole transport layer 140 disposed on the hole injection layer 130, the emission layer 150 disposed on the hole transport layer 140, the electron transport layer 160 disposed on the emission layer 150, the electron injection layer 170 disposed on the electron transport layer 160, and the second electrode 180 disposed on the electron injection layer 170.

The substrate 110 may be a substrate that is used in a conventional organic light-emitting device. For example, the substrate 110 may be a glass substrate, a semiconductor substrate, or a transparent plastic substrate.

The first electrode 120 may be, for example, an anode, and may be formed on the substrate 110 by, for example, deposition or sputtering. For example, the first electrode 120 may be formed as a transmissive electrode by using a metal, an alloy, or a conductive compound, each of which has a large work function. The first electrode 120 may include, for example, indium tin oxide (ITO), indium zinc oxide (IZO), tin oxide ($SnO_2$), zinc oxide (ZnO), each of which has transparency and high conductivity. In some embodiments, the first electrode 120 may be formed as a reflective electrode by using magnesium (Mg) or aluminum (Al).

The hole injection layer 130 may have promote hole-injection from the first electrode 120, and may be formed on the first electrode 120 by, for example, vacuum deposition, spin coating, or ink-jetting. The hole injection layer 130 may have a thickness of about 10 nanometers (nm) to about 1,000 nm, for example, about 10 nm to about 100 nm.

The hole injection layer 130 may be formed by using, instead of the material for an organic light-emitting device including the repeating unit (1) of Formula 1, a known material. Examples of such a known material are a phthalocyanine compound, such as N,N'-diphenyl-N,N'-bis-[4-(phenyl-m-tolyl-amino)-phenyl]-biphenyl4,4'-diamine (DNTPD), or copper phthalocyanine; 4,4',4"-tris(3-methyl phenyl amino) triphenyl amine (m-MTDATA), N,N'-di(1-naphthyl)-N, N'-diphenylbenzidine (NPB), 4,4',4"-tris{N,N-diphenylamino}triphenyl amine (TDATA), 4,4',4"-tris(N,N-2-naphthylphenylamino) triphenyl amine (2-TNATA), PANI/DBSA (polyaniline/dodecylbenzenesulfonic acid: polyaniline/dodecylbenzenesulfonic acid), PEDOT/PSS (poly(3,4-ethylenedioxythiophene)/poly(4-styrenesulfonate)), PANI/CSA (polyaniline/camphor sulfonic acid), and PANI/PSS (polyaniline)/poly(4-styrenesulfonate)).

When the material for an organic light-emitting device is included in a hole injection layer, the amount of the material may be in a range of 50 to 100 wt % (dry weight), for example, 90 to 100 wt % (dry weight), based on the total weight of the hole injection layer.

The hole transport layer 140 may include a hole transport material that has a hole-transport capability, and may be formed on the hole injection layer 130 by vacuum deposition, spin coating, or ink-jetting. The hole transport layer 140 may have a thickness of about 5 nm to about 500 nm, for example, about 100 nm to about 250 nm. The hole transport layer 140 may be formed by using, instead of the material for an organic light-emitting device including the repeating unit (1) of Formula 1, a known material. Examples of such a known material are a carbazole derivative, such as N-phenyl carbazole, polyvinylcarbazole; TPD (N,N'-bis(3-methylphenyl)-N,N'-diphenyl-[1,1-biphenyl]-4,4'-diamine), TCTA (4,4',4"-tris(N-carbazolyl)triphenylamine), and NPB (N,N'-bis(naphthalen-2-yl)-N,N'-bis(phenyl)-benzidine).

When the material for an organic light-emitting device is included in a hole transport layer, the amount of the material may be in a range of 50 to 100 wt % (dry weight), for example, 90 to 100 wt % (dry weight), based on the total weight of the hole transport layer.

The emission layer 150 may be an emission layer that emits phosphorescent light or fluorescent light, and may be formed on the hole transport layer 140 by vacuum deposition, spin coating, or ink-jetting. The emission layer 150 may include a host material and a dopant material, or may include the material for an organic light-emitting device including the repeating unit (1) represented by Formula 1. The emission layer 150 may have a thickness of about 10 nm to about 100 nm, for example, about 20 nm to about 60 nm.

The emission layer 150 may include other host materials, and examples thereof are $Alq_3$ (tris(8-quinolinolate)aluminum), CBP (4,4'-N,N'-dicarbazole-biphenyl), PVK (poly(n-vinylcarbazole)), ADN (9,10-di(naphthalene-2-yl)anthracene), TCTA, TPBI (1,3,5-tris(N-phenylbenzimidazole-2-yl)benzene, 1,3,5-tris(N-phenylbenzimidazole-2-yl)benzene), TBADN (3-tert-butyl-9,10-di(naphth-2-yl)anthracene), DSA (distyrylarylene), dmCBP (4.4'-bis(9-carbazol)-2,2'-dimethylbiphenyl), and 2,4,6-tris(diphenylamino)-1,3,5-triazine.

The emission layer 150 may be formed as an emission layer emitting a particular color of light. For example, the emission layer 150 may be formed as a red emission layer, a green emission layer, and a blue emission layer.

When the emission layer 150 is a blue emission layer, a blue dopant used herein may be a known material, and examples thereof are a perilene and a derivative thereof, and a iridium (Ir) complex, such as bis[2-(4,6-difluorophenyl)pyridinate]picolinateiridium(III) (FIrpic).

When the emission layer 150 is a red emission layer, a red dopant used herein may be a known material, and examples thereof are rubrene and a derivative thereof; DCM (4-(dicyanomethylene)-2-methyl-6-[p-(dimethylamino)styryl]-4H-pyran, 4-(dicyanomethylene)-2-methyl-6-[p-(dimethylamino)styryl]-4H-pyran) and a derivative thereof; an iridium complex, such as $Ir(piq)_2(acac)$ (Bis(1-phenylisoquinoline)(acetylacetonate)iridium(III)); osmium (Os) complex, and platinum complex.

When the emission layer 150 is a green emission layer, a green dopant used herein may be a known material. Examples thereof are coumarin and a derivative thereof; and an iridium complex, such as tris(2-phenylpyridine) iridium (III) $(Ir(ppy)_3)$.

When the material for an organic light-emitting device is included in an emission layer, the amount of the material may be in a range of 50 to 100 wt % (dry weight), for example, 90 to 100 wt % (dry weight), based on the total weight of the emission layer.

The electron transport layer 160 includes an electron transport material that has an electron-transport capability, and may be formed on the emission layer 150 by vacuum deposition, spin coating, or ink-jetting. The electron transport layer 160 may have a thickness of about 10 nm to about 100 nm, for example, about 15 nm to about 50 nm. The electron transport layer 160 may be formed by using, instead of the material for an organic light-emitting device including the repeating unit (1) of Formula 1, a known electron transport material. Examples thereof are Li complex, such as lithium quinolate (LiQ); a quinoline derivative, such as tris(8-quinolinato)aluminum ($Alq_3$); 1,2,4-triazole derivative (TAZ), bis(2-methyl-8-quinolinolato)-(p-phenylphenolat)-aluminum (BAlq), and beryllium bis(benzoquinoline 10-olat) ($BeBq_2$).

When the material for an organic light-emitting device is included in an electron transport layer, the amount of the material may be in a range of 50 to 100 wt % (dry weight), for example, 90 to 100 wt % (dry weight), based on the total weight of the electron transport layer.

The electron injection layer 170 may promote electron-injection from the second electrode 180, and may be formed on the electron transport layer 160, by for example, vacuum deposition. The electron injection layer 170 may have a thickness of about 0.1 nm to about 10 nm, for example, about 0.3 nm to about 9 nm. The electron injection layer 170 may be formed by using, instead of the material for an organic light-emitting device including the repeating unit (1) of Formula 1, a known electron transport material. Examples of such a known electron transport material are lithium fluoride (LiF), sodium chloride (NaCl), cesium fluoride (CsF), lithium oxide ($Li_2O$), and barium oxide (BaO).

When the material for an organic light-emitting device is included in an electron injection layer, the amount of the material may be in a range of 50 to 100 wt % (dry weight), for example, 90 to 100 wt % (dry weight), based on the total weight of the electron injection layer.

The second electrode 180 may be, for example, a cathode, and may be formed on the electron injection layer 170 by deposition or sputtering. For example, the second electrode 180 may be formed as a reflective electrode by using a metal, an alloy of the metal, or a conductive compound, each of which has a low work function. The second electrode 180 may be formed by using, for example, lithium (Li), magnesium (Mg), aluminum (Al), aluminum-lithium (Al—Li), calcium (Ca), magnesium-indium (Mg—In), or magnesium-silver (Mg—Ag). In some embodiments, the second electrode 180 may be formed as a transmissive electrode by using indium tin oxide (ITO) or indium zinc oxide (IZO).

Hereinbefore, an example of the organic light-emitting device 100 according to an embodiment has been described. However, the structure of the organic light-emitting device 100 is not limited thereto. The organic light-emitting device 100 according to an embodiment may have various other known structures for an organic light-emitting device. For example, the organic light-emitting device 100 may include only one layer selected from the hole injection layer 130, the hole transport layer 140, the electron transport layer 160, and the electron injection layer 170. In some embodiments, layers constituting the organic light-emitting device 100 may each be a single layer or have a multi-layered structure.

The organic light-emitting device 100 may include a hole blocking layer between the hole transport layer 140 and the emission layer 150 to prevent diffusion of triplet excitons or holes into the electron transport layer 160. The hole blocking layer may be formed by using, for example, an oxadiazole derivative, a triazole derivative, or a phenanthroline derivative.

A $C_1$-$C_6$ alkyl group as used herein refers to a linear, branched, or cyclic aliphatic hydrocarbon monovalent group having 1 to 6 carbon atoms. Examples thereof are a methyl group, an ethyl group, a propyl group, an iso-propyl group, a cyclopropyl group, an n-butyl group, a sec-butyl group, a tert-butyl group, a cyclobutyl group, an n-pentyl group, an isopentyl group, a sec-pentyl group, a tert-pentyl group, a neopentyl group, a cyclopentyl group, an n-hexyl group, an iso-hexyl group, and a cyclohexyl group.

Hereinafter, Synthesis Examples and Examples will be provided to illustrate a material for an organic light-emitting device according to embodiments and an organic light-emitting device according to embodiments. However, Synthesis Examples and Examples do not limit the scope of the present inventive concept.

EXAMPLE

Synthesis Examples provide various analyses performed by using the following methods.

(1) Measuring Number Average Molecular Amount and Weight Average Molecular Weight Number average molecular amount (Mn) is measured by using polystyrene as standard material and degree of dispersion The degree of dispersion (Mw/Mn) was measured by GPC (a product of Shimadzu Corporation, product name: LC-20AD). 20 microliters (μL) of a solution that had been prepared by dissolving a target polymer in tetrahydrofuran (THF) in such a way that the concentration of the target polymer was about 0.05 percent by weight (wt %), was loaded into GPC. THF was used as a mobile phase for GPC, and provided at a flow rate of 1.0 milliliters per minute (mL/min). A column used herein was PLgel MIXED-B (available from PolymerLabs Company). A detector used herein was a UV-VIS detector (a product of Shimadzu Corporation, product name: SPD-10AV).

(2) NMR Measurement

Unless described otherwise, NMR was measured as follows: 5 milligrams (mg) to 20 mg of a target sample was dissolved in about 0.5 milliliters (mL) of a deuterium chloroform, and measured by NMR (a product of BRUKER, Inc., product name: AVANCE III 300).

(3) LC-MS Measurement

A molecular weight was measured by using LC-MS (a product of Agilent Technology Company, product name: Agilent6130B). A mobile phase as used herein was a mixture of MeOH, water, and THF at a volumetric ratio of 70:5:25. A dry gas temperature was 280° C., and a dry gas flow amount was 6.0 liters per minute (L/min). Ionization was performed by APCI.

(4) Glass Transition Temperature Measurement

A glass transition temperature (° C.) was measured by using DSC (a product of Seiko Instruments Inc., product name: DSC6000). Polymers were heated in an argon atmosphere at a temperature incremental rate of 10° C. per minute, from 30° C. to 250° C., and then, were rapidly cooled down to 50° C. Then, the glass transition temperature (° C.) was measured at a temperature incremental rate of 10° C. per minute up to the temperature of 250° C.

(5) 5% Weight Decrease Temperature Measurement

A 5% weight decrease temperature (Td) was measured by using TG/DTA (a product of Seiko Instruments Inc., product name: TG/DTA6000). Polymers were heated in an argon atmosphere at a temperature incremental rate of 10° C. per minute, from 30° C. to 500° C.

Synthesis Example 1

Synthesis of Monomer A

The following Reaction Scheme shows a synthesis method for monomer A (different ethylenically unsaturated monomer 1):

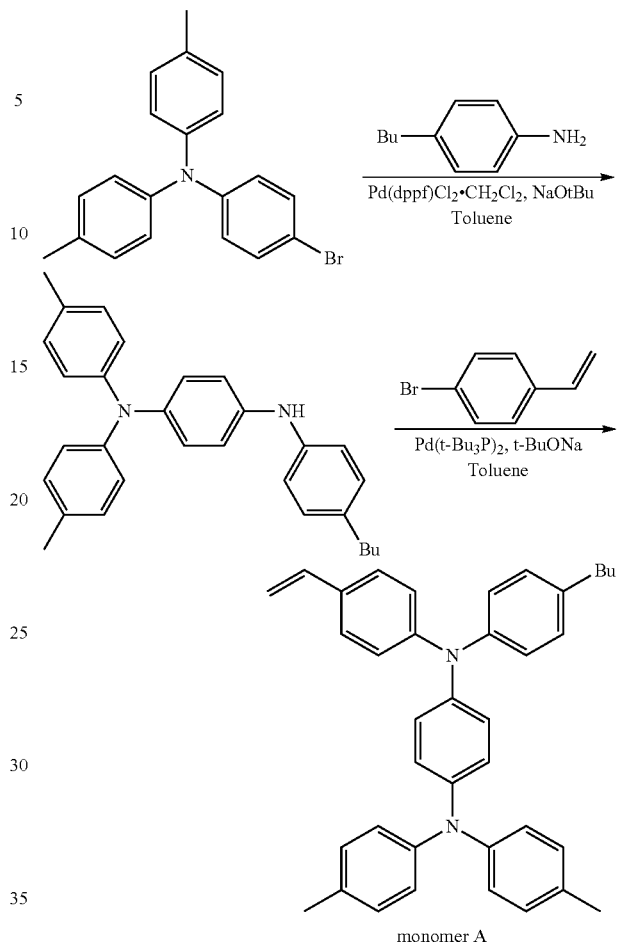

monomer A 4-bromo-4',4"-dimethyltriphenyl amine (10.0 grams (g)), 4-butylaniline (4.66 g), [1,1'-bis(diphenylphosphino)ferrocene]dichloropalladium (1.16 g), sodium tert-butoxide (3.00 g), and toluene (330 mL) were loaded into a 4 neck-flask in the argon atmosphere, and heated at a temperature of 110° C. for 2 hours. The mixture was cooled to room temperature, and the undissolved material was separated therefrom by filtration thorough celite. A solvent was removed from the residual solution by reduced pressure distillation, and the resultant was purified by column chromatography to obtain N-(4-butyl phenyl)-N',N'-dia-(p-tolyl)benzene-1,4-diamine (7.56 g).

N-(4-butyl phenyl)-N',N'-dia-(p-tolyl)benzene-1,4-diamine (2.00 g), 4-bromostyrene (0.900 g), bis(tri-tert-butylphosphine)palladium(0.121 g), sodium tert-butoxide (0.914 g), and toluene (100 mL) were loaded into a 4 neck-flask in the argon atmosphere and heated at a temperature of 110° C. for 6 hours. The mixture was cooled to room temperature, and the undissolved material was separated therefrom by filtration thorough celite. A solvent was removed from the residual solution by reduced pressure distillation, and the resultant was purified by column chromatography and recrystallization to obtain 1.76 g of monomer A.

Structural analysis results of monomer A are as follows:
$^1$H-NMR (300 MHz/CDCl$_3$, δ (ppm): 7.29~6.95 (m, 24H), 6.66 (dd, 1H), 5.62 (d, 1H), 5.14 (d, 1H), 2.58 (t, 2H), 2.32 (s, 6H), 1.64~1.59 (m, 2H), 1.42~1.35 (m, 2H), 0.98 (t, 3H).
LC-MS (APCI-Positive, m/z): [M+H]$^+$=523, 524, 525.

Synthesis Example 2

Synthesis of Monomer B

The following Reaction Scheme shows a synthesis method for monomer B (different ethylenically unsaturated monomer 2):

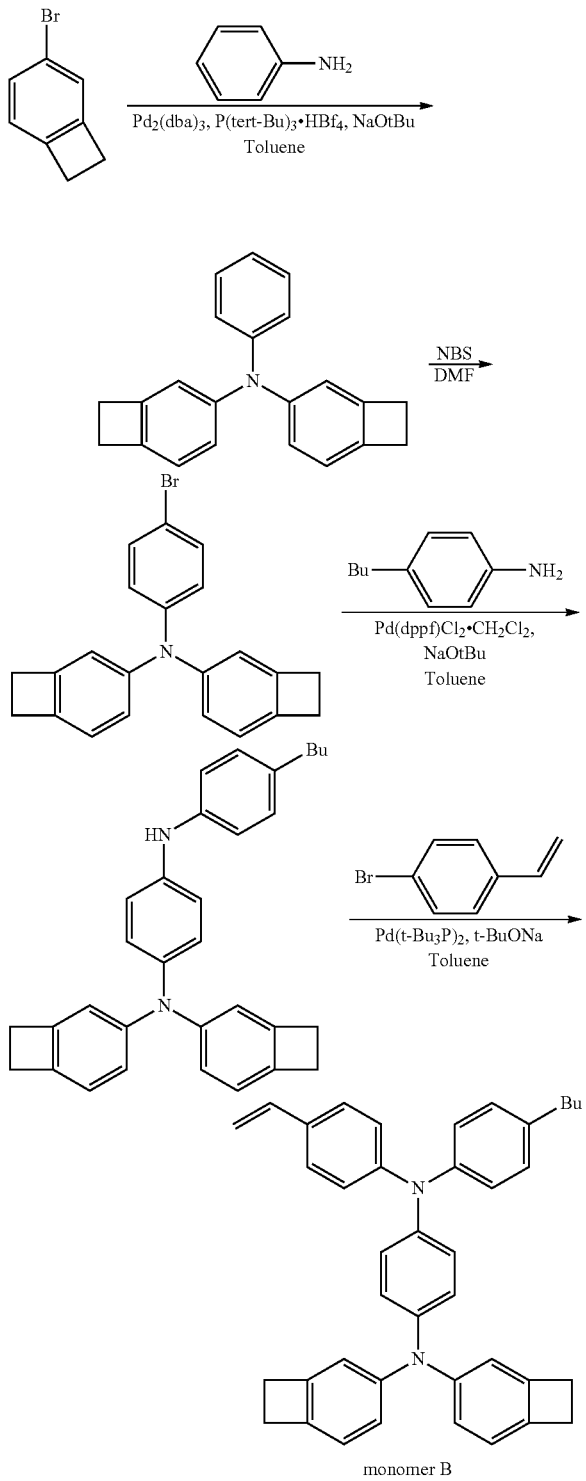

monomer B

Aniline (2.79 g), 4-bromobenzocyclobutene (11.5 g), tris(dibenzylideneacetone)dipalladium (0.549 g), tri-tert-butyl phosphonium bromide tetrafluoroborate (0.696 g), sodium tert-butoxide (8.55 g), and toluene (150 mL) were loaded into a 4 neck-flask in the argon atmosphere and heated at a temperature of 110° C. for 2 hours. The mixture was cooled to room temperature, and the undissolved material was separated therefrom by filtration thorough celite. A solvent was removed from the residual solution by reduced pressure distillation, and the resultant was purified by column chromatography to obtain N-(bicyclo[4.2.0]octa-1,3,5-triene-3-yl)-N-phenyl-bicyclo[4.2.0]octa-1(6),2,4-triene-3-amine (9.16 g).

N-(bicyclo[4.2.0]octa-1,3,5-triene-3-yl)-N-phenyl-bicyclo[4.2.0]octa-1(6),2,4-triene-3-amine (6.12 g) and DMF (41.2 mL) were loaded into a 4 neck-flask in the argon atmosphere and then cooled using iced water. N-bromosuccinimide (3.67 g) dissolved in DMF (20.6 mL) was added dropwise thereto, and the resultant was stirred for 2 hours. Toluene (150 mL) was added thereto, followed by washing using water and drying using magnesium sulfate. A solvent was removed from the residual solution by reduced pressure distillation, and the resultant was purified by column chromatography to obtain N-(bicyclo[4.2.0]octa-1,3, 5-triene-3-yl)-N-(4-bromophenyl)bicyclo[4.2.0]octa-1(6),2,4-triene-3-amine (7.08 g).

N-(bicyclo[4.2.0]octa-1,3,5-triene-3-yl)-N-(4-bromophenyl)bicyclo[4.2.0]octa-1(6),2,4-triene-3-amine (4.88 g), 4-butylaniline (2.12 g), [1,1'-bis(diphenylphosphino)ferrocene]dichloropalladium (0.424 g), sodium tert-butoxide (2.50 g), and toluene (70 mL) were loaded into a 4 neck-flask in the argon atmosphere and heated at a temperature of 120° C. for 6 hours. The mixture was cooled to room temperature, and the undissolved material was separated therefrom by filtration thorough celite. A solvent was removed from the residual solution by reduced pressure distillation, and the resultant was purified by column chromatography and recrystallization to obtain (bicyclo[4.2.0]octa-1(6),2,4-triene-3-yl)N1-bicyclo[4.2.0]octa-1,3,5-triene-3-yl)-N4-(4-butylphenyl)benzene-1,4-diamine (2.98 g).

(Bicyclo[4.2.0]octa-1(6),2,4-triene-3-yl)N1-bicyclo[4.2.0]octa-1,3,5-triene-3-yl)-N4-(4-butylphenyl)benzene-1,4-diamine (2.00 g), 4-bromostyrene (0.640 mL), bis(tri-tert-butylphosphine)palladium (0.0476 g), sodium tert-butoxide (0.850 g), and toluene (23 mL) were loaded into a 4 neck-flask in the argon atmosphere and then heated at a temperature of 110° C. for 6 hours. The mixture was cooled to room temperature, and the undissolved material was separated therefrom by filtration thorough celite. A solvent was removed from the residual solution by reduced pressure distillation, and the resultant was purified by column chromatography and recrystallization to obtain 2.14 g of monomer B.

Structural analysis results of monomer B are as follows:
$^1$H-NMR (300 MHz/CDCl$_3$, δ (ppm): 7.6~6.7 (br, 24H), 6.67 (dd, 1H), 5.61 (d, 1H), 5.10 (d, 1H), 3.09 (s, 8H), 2.8~2.2 (br, 2H), 1.61~1.56 (m, 2H), 1.36 (q, 2H), 0.93 (t, 3H).
LC-MS (APCI-Positive, m/z): [M+H]$^+$=546, 547, 548, 549.

Synthesis Example 3

Synthesis of Monomer C

The following Reaction Scheme shows a synthesis method for monomer C (different ethylenically unsaturated monomer 3):

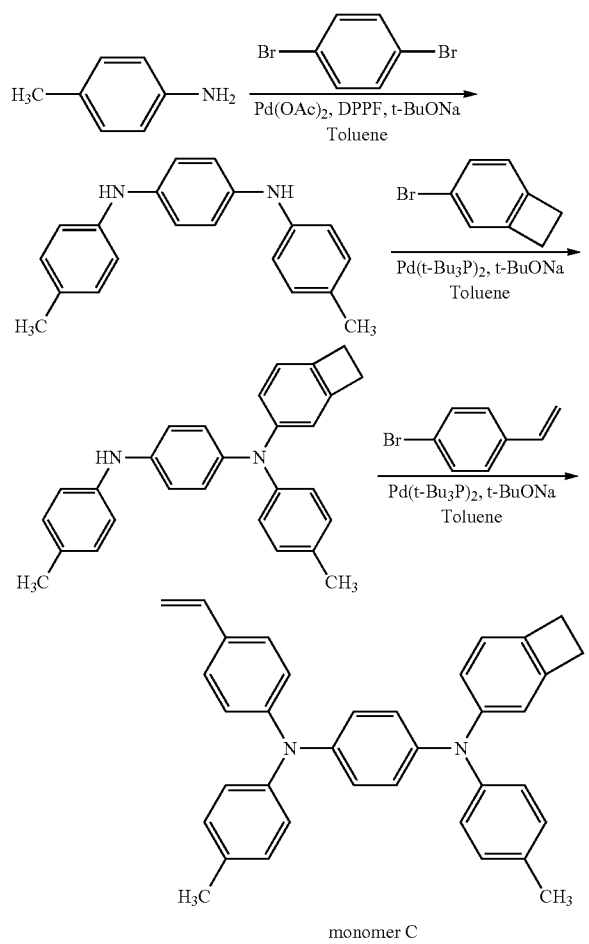

monomer C 4-dibromobenzene (66.1 g), 4-methyl aniline (90.3 g), bisdiphenylphosphinylferrocene (15.7 g), palladium acetate (3.20 g), sodium tert-butoxide (80.7 g), and toluene (680 mL) were loaded into a 4 neck-flask in the argon atmosphere and then heated at a temperature of 110° C. for 15 hours. The mixture was cooled to room temperature, a saturated ammonium chloride aqueous solution (1,000 mL) was added thereto, and an extraction process was performed thereon by using ethyl acetate. The resultant was washed using a saturated saline solution and dried using magnesium sulfate. A solvent was removed therefrom by reduced pressure distillation, thereby obtaining a solid. The solid was washed by using hexane, and purified by column chromatography. The undissolved material was separated therefrom by filtration through celite. The solvent was removed from the residual solution by reduced pressure distillation and the resultant was purified by column chromatography, thereby obtaining N,N'-bis(4-methylphenyl)-1,4-phenylenediamine (50.6 g).

N,N'-bis(4-methylphenyl)-1,4-phenylenediamine (2.50 g), 4-bromobenzocyclobutene (1.59 g), bis(tri-tert-butylphosphine)palladium (0.0890 g), sodium tert-butoxide (1.67 g), and toluene (43 mL) were loaded into a 4 neck-flask in the argon atmosphere and heated at a temperature of 110° C. for 6 hours. The mixture was cooled to room temperature, and the undissolved material was separated therefrom by filtration thorough celite. A solvent was removed from the residual solution by reduced pressure distillation, and the resultant was purified by column chromatography and recrystallization to obtain N1-(bicyclo[4.2.0]octa-1(6),2,4-triene-3-yl)-N1,N4-dia-4-trylbenzene-1,4-diamine (1.35 g).

N1-(bicyclo[4.2.0]octa-1 (6),2,4-triene-3-yl)-N1,N4-dia-4-trylbenzene-1,4-diamine (1.35 g), 4-bromostyrene (0.44 mL), bis(tri-tert-butylphosphine)palladium (0.0349 g), sodium tert-butoxide (0.649 g), and toluene (17 mL) were loaded into a 4 neck-flask in the argon atmosphere and heated at a temperature of 110° C. for 5 hours. The mixture was cooled to room temperature, and the undissolved material was separated therefrom by filtration thorough celite. A solvent was removed from the residual solution by reduced pressure distillation, and the resultant was purified by column chromatography and recrystallization to obtain monomer C (0.500 g).

Structural analysis results of monomer C are as follows:
$^1$H-NMR (300 MHz/CDCl$_3$, δ (ppm): 7.6~6.7 (br, 19H), 6.64 (dd, 1H), 5.60 (d, 1H), 5.11 (d, 1H), 3.10 (s, 4H), 2.31 (s, 6H).
LC-MS (APCI-Positive, m/z): [M+H]$^+$=493, 494, 495.

Synthesis Example 4

Synthesis of Monomer D

The following Reaction Scheme shows a synthesis method for monomer D (different ethylenically unsaturated monomer 4):

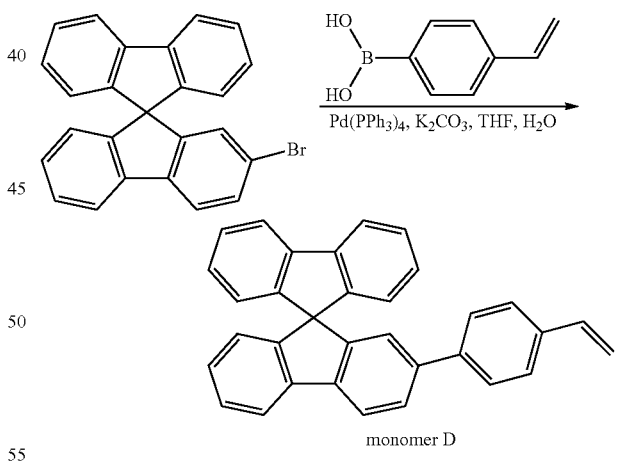

monomer D 2-bromo-9,9'-spirobi[fluorene] (5.00 g), 4-vinyphenylboronic acid (2.24 g), tetrakis(triphenylporphine)palladium (0.731 g), potassium carbonate (3.50 g), THF (50 mL) and H$_2$O (13 mL) were loaded into a 4 neck-flask in the argon atmosphere and heated at a temperature of 65° C. for 8 hours. The mixture was cooled to room temperature, and the undissolved material was separated therefrom by filtration thorough celite. A solvent was removed from the residual solution by reduced pressure distillation, and the resultant was purified by column chromatography to obtain monomer D (4.45 g).

Structural analysis results of monomer D are as follows:
¹H-NMR (300 MHz/CDCl₃, δ (ppm): 7.94~7.81 (m, 4H), 7.67-7.63 (m, 1H), 7.43-7.37 (m, 6H), 7.17~7.11 (m, 3H), 6.97~6.74 (m, 2H), 5.73 (dd, 1H), 5.34 (d, 1H), 5.22 (d, 1H).
LC-MS (APCI-Positive, m/z): [M+H]⁺=418, 419, 420, 421.

Synthesis Example 5

Synthesis of Example Monomer 28

The following Reaction Scheme shows a synthesis method for example monomer 28:

removed therefrom by reduced pressure distillation to obtain a crude product. The crude product was re-crystallized to obtain 1,3-bis(4'-bromophenyl)adamantane (32.3 g).

1,3-bis(4'-bromophenyl)adamantane (3 g), potassium trifluorovinylborate (0.901 g), bis(tri-tert-butylphosphine)palladium (0.220 g), triethylamine (0.680 g), 1-propanol (20 mL), and toluene (80 mL) were loaded into a 4 neck-flask in the argon atmosphere, and heated at a temperature of 110° C. for 6 hours. The mixture was cooled to room temperature, and the undissolved material was separated therefrom by filtration through celite. A solvent was removed from the

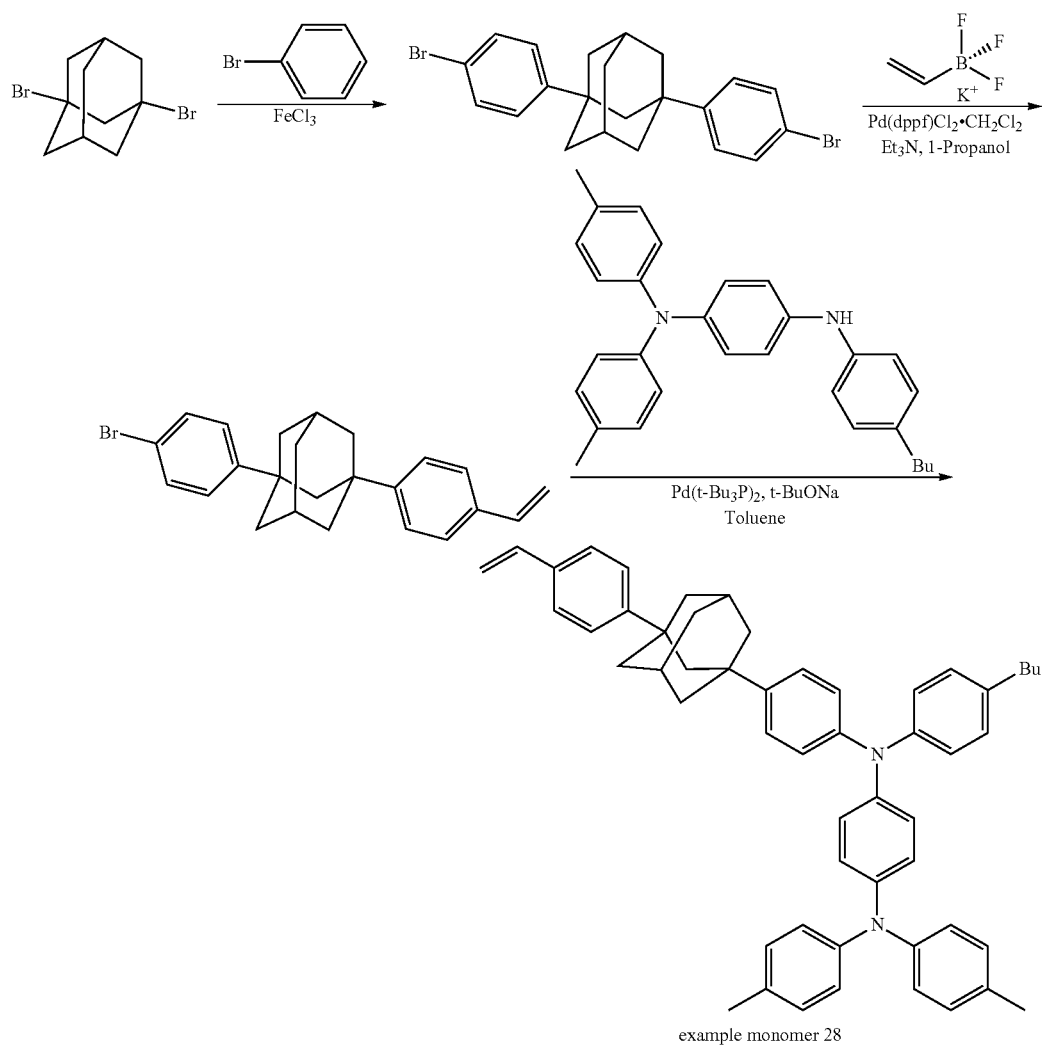

example monomer 28

Iron chloride (III) (450 mg) and bromobenzene (108 g) were loaded into a 4 neck-flask in the argon atmosphere, and heated at a temperature of 60° C. for 10 minutes. 1,3-dibromoadamantane (40.2 g) dissolved in bromobenzene (215 g) was added dropwise thereto, and the mixture was stirred at a temperature of 60° C. for 4 hours. The resultant was cooled to room temperature, and then water (300 mL) was added thereto, and then an extraction process was performed thereon by using toluene, and an organic layer was washed by using a saturated saline solution. The resultant was dried by using sodium sulfate, and a solvent was residual solution by reduced pressure distillation to obtain 1-(4'-bromophenyl)-3-(4'-vinyl phenyl)-adamantane (1.25 g).

N-(4-butylphenyl)-N, N'-dia-p-tolyla benzene)1,4-diamine (1.50 g), 1-(4'-bromophenyl)-3-(4'-vinylphenyl)-adamantane (1.25 g), bis(tri-tert-butylphosphine)palladium (0.0680 g), sodium tert-butoxide (0.512 g), and toluene (55 mL) were loaded into a 4 neck-flask in the argon atmosphere, and heated at a temperature of 110° C. for 6 hours. The mixture was cooled to room temperature, and the undissolved material was separated therefrom by filtration through celite. A solvent was removed from the residual solution by reduced pressure distillation, and the resultant was purified by column chromatography and recrystallization to obtain 0.6 g of example monomer 28.

Structural analysis results of example monomer 28 are as follows:

$^1$H-NMR (300 MHz/CDCl$_3$, δ (ppm): 7.36~6.91 (m, 24H), 6.53 (dd, 1H), 5.71 (d, 1H), 5.19 (d, 1H), 2.57~2.52 (m, 2H), 2.29 (s, 6H), 1.77 (br, 10H), 1.58~1.56 (m, 2H), 1.37~1.34 (m, 2H), 1.21 (d, 2H), 0.93 (t, 3H).

LC-MS (APCI-Positive, m/z): [M+H]$^+$=733, 734, 735.

Synthesis Example 6

Synthesis of Example Monomer 126

The following Reaction Scheme shows a synthesis method for example monomer 126:

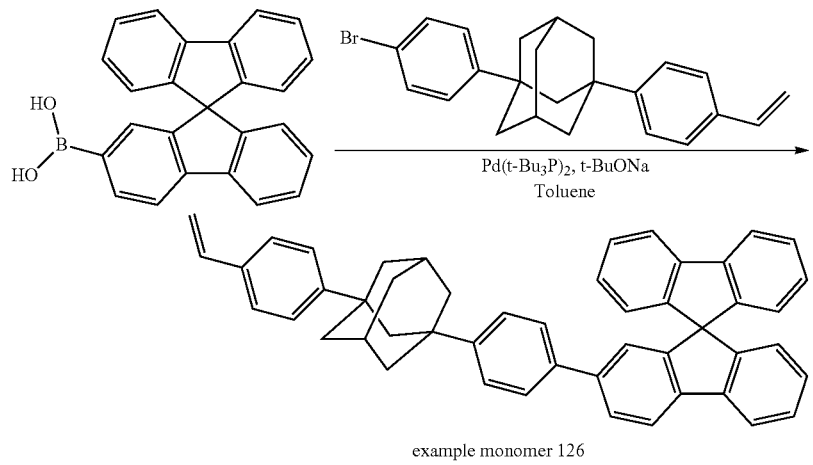

example monomer 126

9,9'-spiro(a fluorene-2-yl)boronic acid (1.10 g), 1-(4'-bromophenyl)-3-(4'-vinylphenyl)-adamantane (1.00 g), tetrakis(triphenylphosphine)palladium(0.0294 g), 2 molar (M) sodium carbonate aqueous solution (10 mL), and xylene (30 mL) were loaded into a 4 neck-flask in the argon atmosphere, and heated at a temperature of 110° C. for 3 hours. The mixture was cooled to room temperature. The mixture was subjected to an extraction process using toluene, followed by drying using sodium sulfate. Then, a solvent was removed therefrom by reduced pressure distillation to obtain a crude product. The crude product was re-crystallized by using THF to obtain example monomer 126 (0.500 g).

Structural analysis results of example monomer 126 are as follows:

$^1$H-NMR (300 MHz/CDCl$_3$, δ (ppm): 7.89~6.62 (m, 24H), 5.70 (d, 1H), 5.19 (d, 1H), 2.33~2.24 (br, 2H), 2.01~1.96 (br, 2H), 1.96~1.85 (br, 8H), 1.80~1.74 (br, 2H).

LC-MS (APCI-Positive, m/z): [M+H]$^+$=628, 629, 630, 631.

Example 1

Synthesis of Polymer 1

Example monomer 28 (0.450 g), azobisisobutyronitrile (1.09 µg), and toluene (0.575 g) were loaded into a Schlenk tube, and the mixture was three times subjected to freeze deaeration. The resultant was heated at a temperature of 70° C. for 6 hours. After cooling to room temperature, the resultant was 5 times subjected to re-precipitation by using THF as a good solvent and excess acetone/methanol (1/1, volume to volume (v/v)) as a bad solvent, and the obtained material was vacuum-dried to obtain polymer 1 (0.200 g). A number average molecular amount (Mn) and a degree of dispersion (Mw/Mn) of polymer 1 were 68,600 and 2.79, respectively. A glass transition temperature (Tg) and 5% weight decrease temperature (Td) of polymer 1 were 173° C. and 436° C., respectively.

Example 2

Synthesis of Polymer 2

Example monomer 28 (0.650 g), monomer C (0.0526 g), azo bisisobutyronitrile (1.70 µg), and toluene (0.937 g) were loaded into a Schlenk tube, and the mixture was three times subjected to freeze deaeration. In this regard, a molar ratio of example monomer 28 to monomer C was 90:10. The resultant was heated at a temperature of 70° C. for 6 hours. After cooling to room temperature, the resultant was 5 times subjected to re-precipitation by using THF as a good solvent and excess acetone/methanol (1/1, v/v) as a bad solvent, and the obtained material was vacuum-dried to obtain polymer 2 (0.340 g) (the repeating unit (1) in an amount of 90 mole percent (mol %) of total constituting units). Mn and Mw/Mn of polymer 2 were 43,500 and 3.21, respectively. Tg and Td of polymer 2 were 152° C. and 433° C., respectively.

Example 3

Synthesis of Polymer 3

Example monomer 28 (1.40 g), monomer A (0.448 g), monomer D (0.293 g), monomer B (0.785 g), azobisisobutyronitrile (0.0351 g), and toluene (7.78 g) were loaded into a Schlenk tube, and the mixture was three times subjected to freeze deaeration. The resultant was heated at a temperature of 70° C. for 6 hours. After cooling to room temperature, the resultant was 5 times subjected to re-precipitation by using THF as a good solvent and excess acetone/methanol (1/1, v/v) as a bad solvent, and the obtained material was vacuum-dried to obtain polymer 3 (2.10 g) (the repeating unit (1) in an amount of 50 mol % of total constituting units). Mn and Mw/Mn of polymer 3 were 17,800 and 2.15, respectively. Tg and Td of polymer 3 were 150° C. and 411° C., respectively.

Example 4

Synthesis of Polymer 4

Example monomer 126 (0.600 g), azobisisobutyronitrile (6.52 µg) and toluene (1.09 g) were loaded into a Schlenk tube, and the mixture was three times subjected to freeze deaeration. The resultant was heated at a temperature of 70° C. for 6 hours. After cooling to room temperature, the resultant was 5 times subjected to re-precipitation by using THF as a good solvent and excess acetone/methanol (1/1, v/v) as a bad solvent, and the obtained material was vacuum-dried to obtain polymer 4 (0.288 g). Mn and Mw/Mn of polymer 4 were 6,300, and 2.48, respectively. Tg and Td of polymer 4 were 164° C. and 423° C., respectively.

Example 5

Synthesis of Polymer 9

Polymer 9 was prepared in the same manner as in Example 3, except that monomer 126 (0.435 g) was used instead of monomer D. Mn and Mw/Mn of polymer 9 were 20,800 and 2.25, respectively. Tg and Td of polymer 9 were 159° C. and 421° C., respectively.

Comparative Example 1

Synthesis of Polymer 5

Monomer A (0.700 g), azobisisobutyronitrile (2.19 µg), and toluene (1.29 g) were loaded into a Schlenk tube, and the mixture was three times subjected to freeze deaeration. The resultant was heated at a temperature of 70° C. for 6 hours. After cooling to room temperature, the resultant was 5 times subjected to re-precipitation by using THF as a good solvent and excess acetone/methanol (1/1, v/v) as a bad solvent, and the obtained material was vacuum-dried to obtain polymer 5 (0.510 g). Mn and Mw/Mn of polymer 5 were 4,100 and 2.46, respectively. Tg and Td of polymer 5 were 152° C. and 402° C., respectively.

Comparative Example 2

Synthesis of Polymer 6

Monomer A (0.65 g), monomer C (0.0613 g), azobisisobutyronitrile (2.94 µg), and toluene (1.33 g) were loaded into a Schlenk tube, and the mixture was three times subjected to freeze deaeration. In this regard, a molar ratio of monomer A to monomer C was 91:9. The resultant was heated at a temperature of 70° C. for 6 hours. After cooling to room temperature, the resultant was 5 times subjected to re-precipitation by using THF as a good solvent and excess acetone/methanol (1/1, v/v) as a bad solvent, and the obtained material was vacuum-dried to obtain polymer 6 (0.501 g). Mn and Mw/Mn of polymer 6 were 39,200 and 2.27, respectively. Tg and Td of polymer 6 were 131° C. and 409° C., respectively.

Comparative Example 3

Synthesis of Polymer 7

Monomer A (0.650 g), monomer D (8.93 mg), monomer B (0.0467 g), azobisisobutyronitrile (8.76 mg), and toluene (1.42 g) were loaded into a Schlenk tube, and the mixture was three times subjected to freeze deaeration. In this regard, a molar ratio of monomer A:monomer D:monomer B was 90:2:8. The resultant was heated at a temperature of 70° C. for 6 hours. After cooling to room temperature, the resultant was 5 times subjected to re-precipitation by using THF as a good solvent and excess acetone/methanol (1/1, v/v) as a bad solvent, and the obtained material was vacuum-dried to obtain polymer 7 (0.58 g). Mn and Mw/Mn of polymer 7 were 55,000 and 3.04, respectively. Tg and Td of polymer 7 were 129° C. and 399° C., respectively.

Comparative Example 4

Synthesis of Polymer 8

Monomer D (0.700 g), azobisisobutyronitrile (13.7 µg) and THF (5.99 g) were loaded into a Schlenk tube, and the mixture was three times subjected to freeze deaeration. The resultant was heated at a temperature of 70° C. for 6 hours. After cooling to room temperature, the resultant was 5 times subjected to re-precipitation by using THF as a good solvent and excess acetone/methanol (1/1, v/v) as a bad solvent, and the obtained material was vacuum-dried to obtain polymer 8 (0.420 g). Mn and Mw/Mn of polymer 8 were 5,800 and 2.24, respectively. Tg and Td of polymer 8 were 139° C. and 402° C., respectively.

TABLE 1

|  | Polymer | Number of repeating units (1) (n) | Number average molecular amount (Mn) | Degree of dispersion (Mw/Mn) | Glass transition temperature (° C.) | 5% weight decrease temperature (° C.) |
| --- | --- | --- | --- | --- | --- | --- |
| Example 1 | polymer 1 | 261 | 68,600 | 2.79 | 173 | 436 |
| Comparative Example 1 | polymer 5 | 19 | 4,100 | 2.46 | 152 | 402 |
| Example 2 | polymer 2 | 177 | 43,500 | 3.21 | 152 | 433 |
| Comparative Example 2 | polymer 6 | 154 | 39,200 | 2.27 | 131 | 409 |
| Example 3 | polymer 3 | 31 | 17,800 | 2.15 | 150 | 411 |
| Comparative Example 3 | polymer 7 | 293 | 55,000 | 3.04 | 129 | 399 |

TABLE 1-continued

| Polymer | Number of repeating units (1) (n) | Number average molecular amount (Mn) | Degree of dispersion (Mw/Mn) | Glass transition temperature (° C.) | 5% weight decrease temperature (° C.) |
|---|---|---|---|---|---|
| Example 4 polymer 4 | 24 | 6,300 | 2.48 | 164 | 423 |
| Comparative polymer 8 Example 4 | 31 | 5,800 | 2.24 | 139 | 402 |
| Example 5 polymer 9 | 31 | 20,800 | 2.25 | 159 | 421 |

Polymer 1, polymer 2, polymer 3, polymer 4, and polymer 9, each including the repeating unit (1) represented by Formula 1, have a higher decomposition temperature than polymer 5, polymer 6, polymer 7, and polymer 8. Accordingly, polymer 2, polymer 3, polymer 4, and polymer 9 are suitable for the material for an organic light-emitting device, for example, a hole transport material. Polymer 1, polymer 2, polymer 3, polymer 4, and polymer 9, each including the repeating unit (1) represented by Formula 1 may have high decomposition temperature and high glass transition temperature at the same time.

Example 6

An organic light-emitting device having the structure of FIG. 1 was manufactured as follows.

A hole injection layer was formed by using PEDOT/PSS (a product of Sigma-Aldrich Inc.) on an ITO glass substrate including a stripe-type ITO (thickness of 150 nm). Specifically, a solution obtained by filtering a suspension of PEDOT/PSS through a 0.2 micrometers (μm) membrane filter was used, and the solution was spin-coated to form a thin film having a post-drying thickness of 30 nanometers (nm). Then, the resultant was dried for 10 minutes on a hot plate at a temperature of 200° C. to form a hole injection layer having a thickness of 30 nm.

Then, polymer 2 (3 percent by weight (wt %) xylene solution) was spin-coated on the hole injection layer in the nitrogen atmosphere, and heat treated on a hot plate at a temperature of 230° C. for 1 hour to form a hole transport layer having a thickness of 110 nm.

Then, a xylene solution (solid content: 3 wt %) including Compound PH-1 and PH-2 (mixed at a weight ratio of 3:7) was a host and Compound PD-1 (10 wt % based on the host) as a dopant were spin-coated on the hole transport layer, and heat treated on a hot plate at a temperature of 100° C. for 30 minutes to form an emission layer having a thickness of 30 nm.

The resultant substrate including the emission layer was introduced to a vacuum deposition device, and Alq$_3$ was deposited thereon to form an electron transport layer having a thickness of 36 nm, and LiF was deposited thereon to form an electron injection layer having a thickness of 0.8 nm.

Subsequently, aluminum was deposited on the electron injection layer to form a cathode having a thickness of 100 nm, thereby completing manufacture of an organic light-emitting device.

A voltage was applied to the organic light-emitting device to identify green light emitted therefrom based on iridium complex.

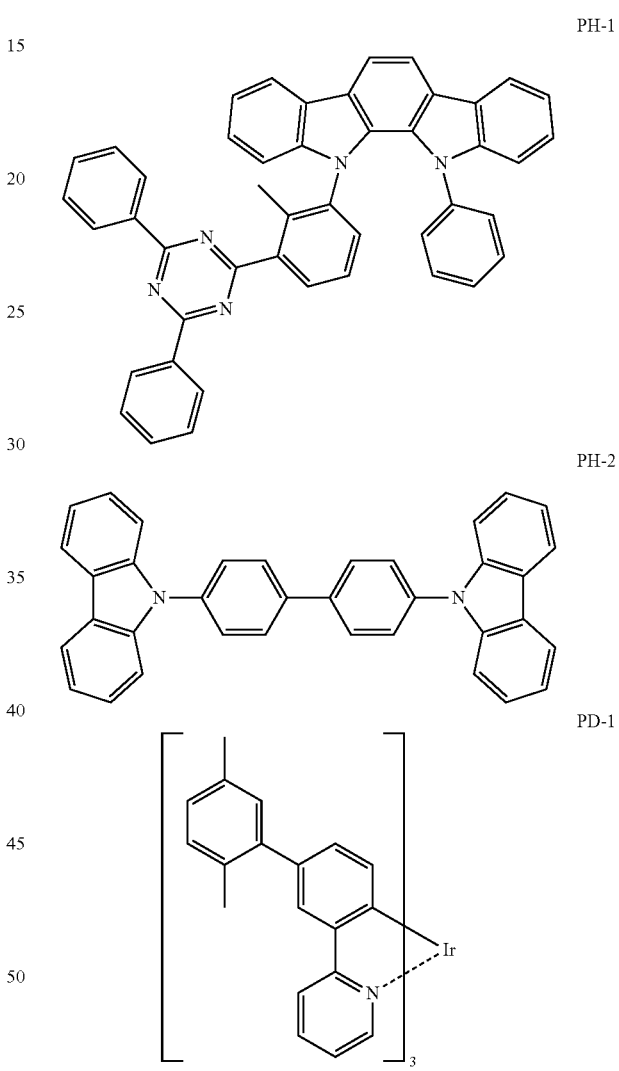

Example 7

An organic light-emitting device was manufactured in the same manner as in Example 6, except that polymer 9 was used instead of polymer 2.

Comparative Example 5

An organic light-emitting device was manufactured in the same manner as in Example 6, except that polymer 6 was used instead of polymer 2.

Evaluation Example 1

Evaluating Organic Light-emitting Device

A direct-current driving test was performed on the organic light-emitting devices manufactured according to Examples 6 and 7 and Comparative Example 5 at 1,000 candelas per square meter (cd/m²) to measure characteristics and initial luminance thereof, and results thereof are shown in Table 2. Time (driving lifespan) that elapses when the initial luminance is reduced by 5% is shown in Table 2, and the luminance was measured by using a luminance measuring device (for example, SR-3: a product of Topcon Corporation). A current efficiency (candelas per ampere, cd/A) was measured as follows: a current value (current density) per unit area of the organic light-emitting device was calculated, and luminance (cd/m²) was divided by the current value (current density). Power efficiency was measured by using an external quantum efficiency measuring device "C9920-12" (a product of Hamamatsu Photonics Inc.).

TABLE 2

| | | Relative values obtained using Comparative Example 5 as 1 (1000 cd/m²) | | |
|---|---|---|---|---|
| | Polymer | Current efficiency | Power efficiency | Driving lifespan |
| Example 6 | polymer 2 | 1.2 | 1.2 | 1.8 |
| Example 7 | polymer 9 | 1.3 | 1.3 | 2.1 |
| Comparative Example 5 | polymer 6 | 1 | 1 | 1 |

A material for an organic light-emitting device has excellent electric characteristics and high thermal stability. Accordingly, an organic light-emitting device including the material may have high efficiency and a long lifespan.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope of the present disclosure as defined by the following claims.

What is claimed is:

1. A material for an organic light-emitting device, the material comprising
a repeating unit represented by Formula 1:

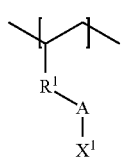

Formula 1 wherein, in Formula 1,
$R^1$ is selected from a single bond, a phenylene group, and a group represented by one of Formulae a1 to a9:

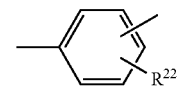
a1

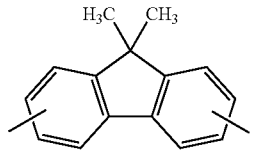
a2

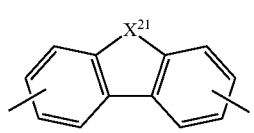
a3

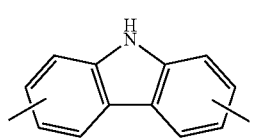
a4

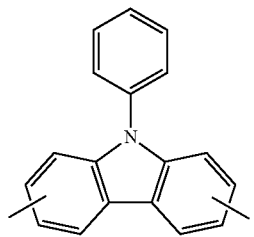
a5

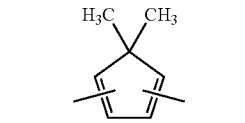
a6

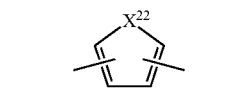
a7

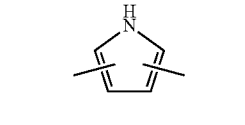
a8

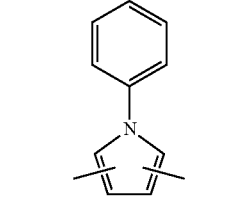
a9 wherein, in Formulae a1 to a9,
$R^{22}$ is a $C_1$-$C_6$ alkyl group,
$X^{21}$ and $X^{22}$ are each independently selected from an oxygen atom and a sulfur atom;
A is selected from an adamantylene group, a diadamantylene group, a triadamantylene group, and a tetraadamantylene group; and
$X^1$ is a charge transport unit represented by one of Formulae b1 to b13:

b1 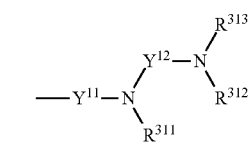
b2 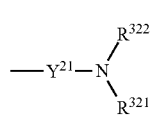
b3 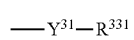
b4 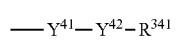
b5 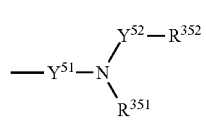
b6 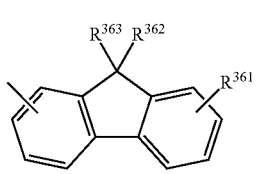
b7 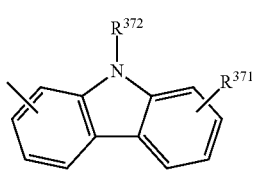
b8 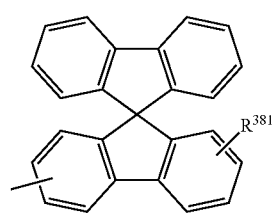
b9 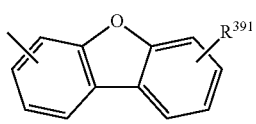
b10 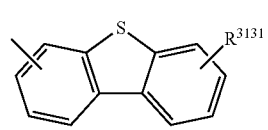
b11 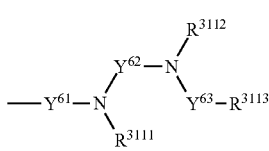
b12 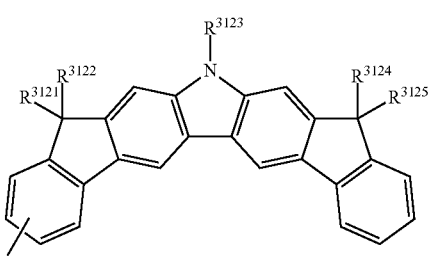
b13 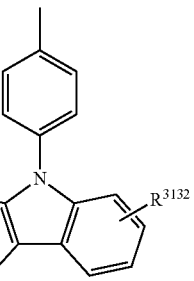
wherein, in Formulae b1 to b13,
$R^{311}$, $R^{312}$, $R^{313}$, $R^{321}$, $R^{322}$, $R^{331}$, $R^{341}$, $R^{351}$, $R^{352}$, $R^{361}$, $R^{362}$, $R^{363}$, $R^{371}$, $R^{372}$, $R^{381}$, $R^{391}$, $R^{3101}$, $R^{3111}$, $R^{3112}$, $R^{3113}$, $R^{3121}$, $R^{3122}$, $R^{3123}$, $R^{3124}$, $R^{3125}$, $R^{3131}$ and $R^{3132}$ are each independently selected from a hydrogen atom, a $C_1$-$C_6$ alkyl group, and a group represented by one of Formulae c1 to c16:
c1 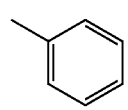
c2 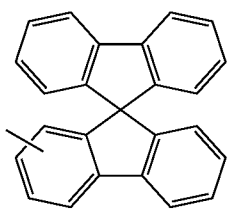
c3 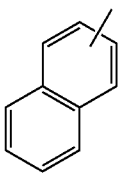
c4 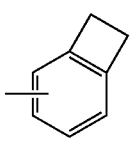
c5 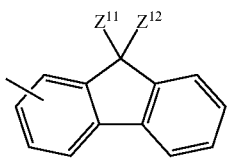

-continued
c6 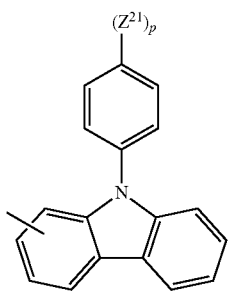
c7 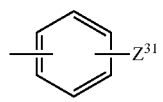
c8 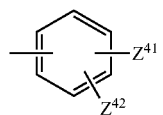
c9 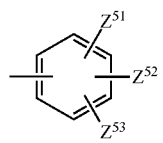
c10 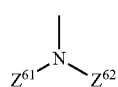
c11 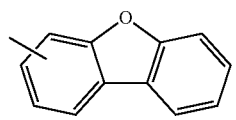
c12 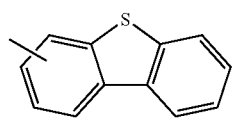
c13 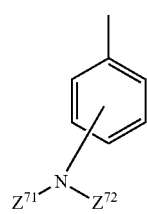
c14 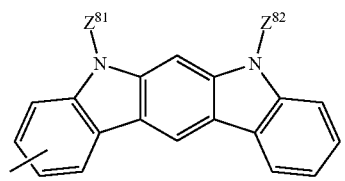
c15 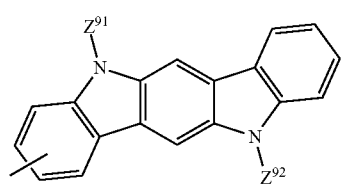
c16 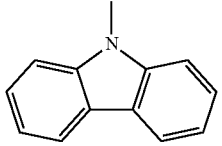
wherein, in Formulae c1 to c16,
p is 0 or 1; and
$Z^{11}$, $Z^{12}$, $Z^{21}$, $Z^{31}$, $Z^{41}$, $Z^{42}$, $Z^{51}$, $Z^{52}$, $Z^{53}$, $Z^{61}$, $Z^{62}$, $Z^{71}$, $Z^{72}$, $Z^{81}$, $Z^{82}$, $Z^{91}$, and $Z^{92}$ are each independently selected from a $C_1$-$C_6$ alkyl group, a methoxy group, and a group represented by one of Formulae d1 to d7:
d1 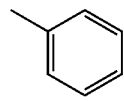
d2 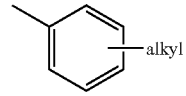
d3 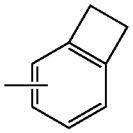
d4 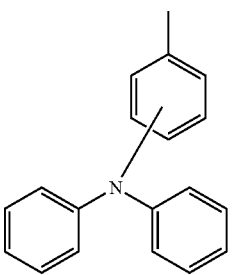
d5 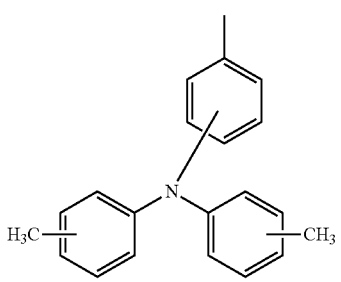
d6 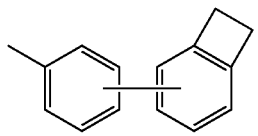

-continued d7 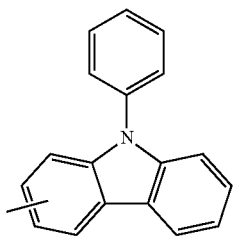

wherein, in Formulae d1 to d7,
alkyl indicates a $C_1$-$C_6$ alkyl group;
$Y^{11}$, $Y^{12}$, $Y^{21}$, $Y^{31}$, $Y^{41}$, $Y^{42}$, $Y^{51}$, $Y^{52}$, $Y^{61}$, $Y^{62}$, and $Y^{63}$ are each independently a group represented by one of Formulae e1 to e11:

e1 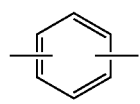

e2 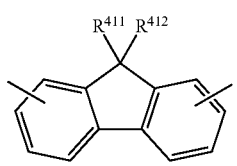

e3 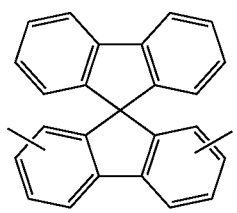

e4 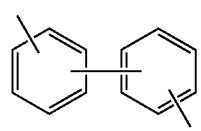

e5 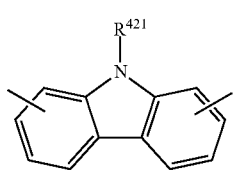

e6 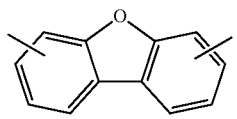

e7 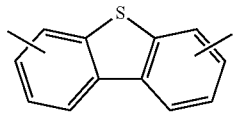

-continued e8 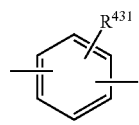

e9 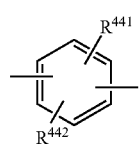

e10 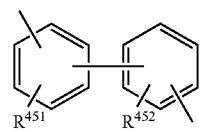

e11 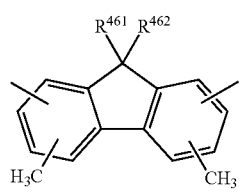

wherein, in Formulae e1 to e11,
$R^{411}$, $R^{412}$, $R^{421}$, $R^{431}$, $R^{441}$, $R^{442}$, $R^{451}$, $R^{452}$, $R^{461}$, and $R^{462}$ are each independently selected from a hydrogen atom, a $C_1$-$C_6$ alkyl group, a phenyl group, and a tolyl group.

2. The material of claim 1, wherein
$R^1$ is selected from a phenylene group and a group represented by one of Formulae a1 to a9.

3. The material of claim 1, wherein
$R^1$ is selected from a phenylene group and a group represented by Formula a1.

4. The material of claim 1, wherein
$R^1$ is a phenylene group.

5. The material of claim 1, wherein
$X^1$ is selected from an arylamine moiety, a fluorene moiety, a carbazole moiety, a dibenzofurane moiety, a dibenzothiophene moiety, each optionally forming a fused ring system or a spiro ring system; a fluorenone moiety, a quinone moiety, an anthraquinone moiety, a diphenylquinone moiety, a thiopyrandioxide moiety, an oxazole moiety, an oxadiazole moiety, a triazole moiety, an imidazole moiety, an anthrone moiety, a bipyridine moiety, and a phenanthroline moiety.

6. The material of claim 1, wherein
$X^1$ is a group represented by one of Formulae b1 to b5, b8, and b11.

7. The material of claim 1, wherein
$X^1$ is a group represented by one of Formulae b1 and b11.

8. The material of claim 1, wherein
the repeating unit represented by Formula 1 is represented by Formula 1a:

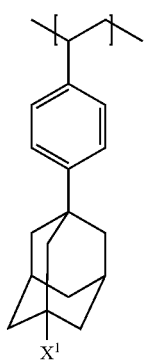

Formula 1a wherein, in Formula 1a,
X¹ is the same as in Formula 1.

9. The material of claim 1, wherein
the material for the organic light-emitting device comprises 20 to 500 repeating units in total.

10. The material of claim 1, wherein
the material comprises the repeating unit represented by Formula 1 in an amount of 10 to 100 mol %.

11. The material of claim 1, wherein
the material comprises the repeating unit represented by Formula 1 in an amount of 30 to 100 mol %.

12. The material of claim 1, further comprising
a repeating unit represented by Formula 2:

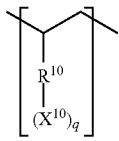

Formula 2 wherein, in Formula 2,
$R^{10}$ is the same as $R^1$ in claim 1;
$X^{10}$ is the same as $X^1$ in claim 1; and
q is 0 or 1.

13. The material of claim 1, wherein
the material for the organic light-emitting device is represented by Formula 3:

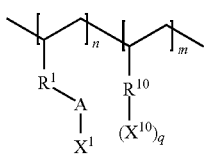

Formula 3 wherein, in Formula 3,
$R^1$ and $R^{10}$ are each independently defined as $R^1$ in Formula 1;
A is the same as A in Formula 1;
$X^1$ and $X^{10}$ are each independently defined as $X^1$ in Formula 1;
q is 0 or 1;
n is an integer of 20 to 500; and
m is an integer of 1 to 180.

14. The material of claim 13, wherein
n and m satisfy the condition of $0.1 \leq n/(n+m) \leq 1$.

15. The material of claim 13, wherein
n and m satisfy the condition of $20 \leq n+m \leq 500$.

16. An organic light-emitting device comprising:
a first electrode;
a second electrode; and
an organic layer disposed between the first electrode and the second electrode;
wherein the organic layer comprises the material comprising:
a repeating unit represented by Formula 1:

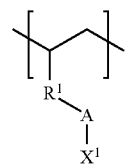

Formula 1 wherein, in Formula 1,
$R^1$ is selected from a single bond, a phenylene group, and a group represented by one of Formulae a1 to a9:

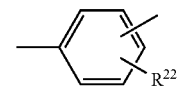

a1

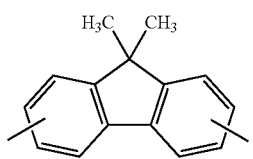

a2

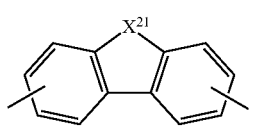

a3

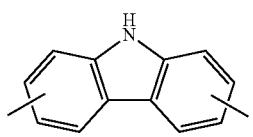

a4

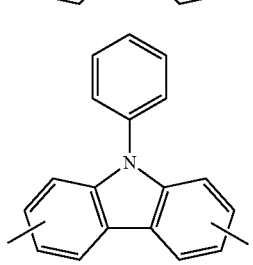

a5

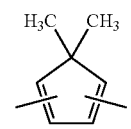

a6

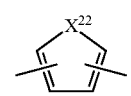

a7

-continued

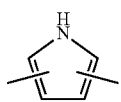
a8

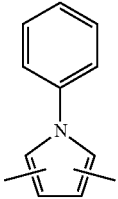
a9 wherein, in Formulae a1 to a9,
R$^{22}$ is a C$_1$-C$_6$ alkyl group,
X$^{21}$ and X$^{22}$ are each independently selected from an oxygen atom and a sulfur atom;
A is selected from an adamantylene group, a diadamantylene group, a triadamantylene group, and a tetraadamantylene group; and
X$^1$ is a charge transport unit represented by one of Formulae b1 to b13:

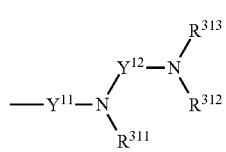
b1

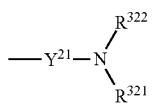
b2

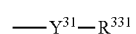
b3

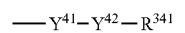
b4

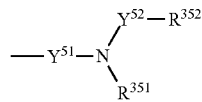
b5

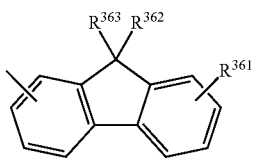
b6

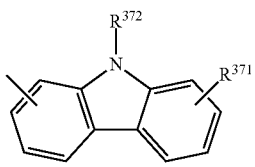
b7

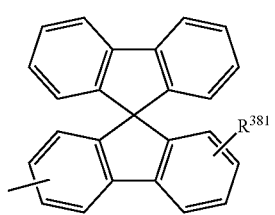
b8

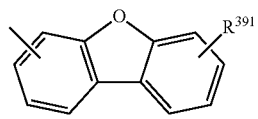
b9

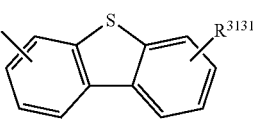
b10

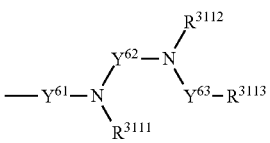
b11

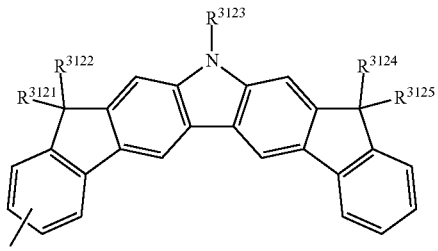
b12

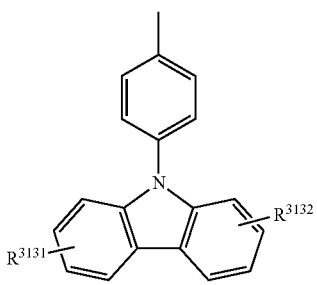
b13 wherein, in Formulae b1 to b13,
R$^{311}$, R$^{312}$, R$^{313}$, R$^{321}$, R$^{322}$, R$^{331}$, R$^{341}$, R$^{351}$, R$^{352}$, R$^{361}$, R$^{362}$, R$^{363}$, R$^{371}$, R$^{372}$, R$^{381}$, R$^{391}$, R$^{3101}$, R$^{3111}$, R$^{3112}$, R$^{3113}$, R$^{3121}$, R$^{3122}$, R$^{3123}$, R$^{3124}$, R$^{3125}$, R$^{3131}$ and R$^{3132}$ are each independently selected from a hydrogen atom, a C$_1$-C$_6$ alkyl group, and a group represented by one of Formulae c1 to c16:

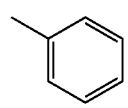
c1

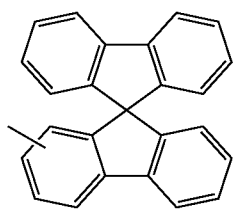
c2

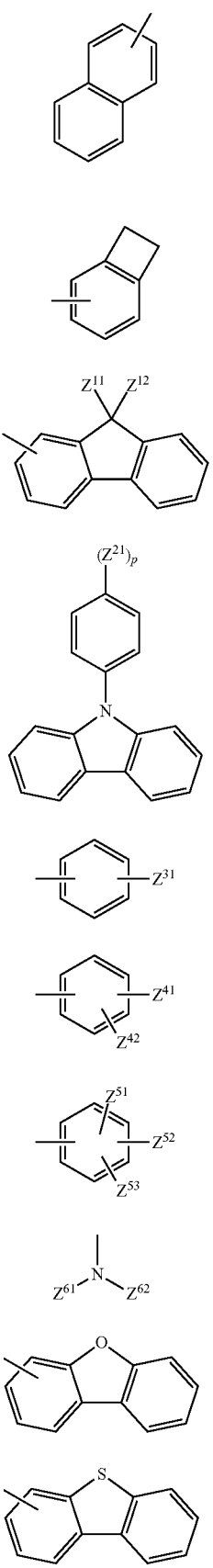
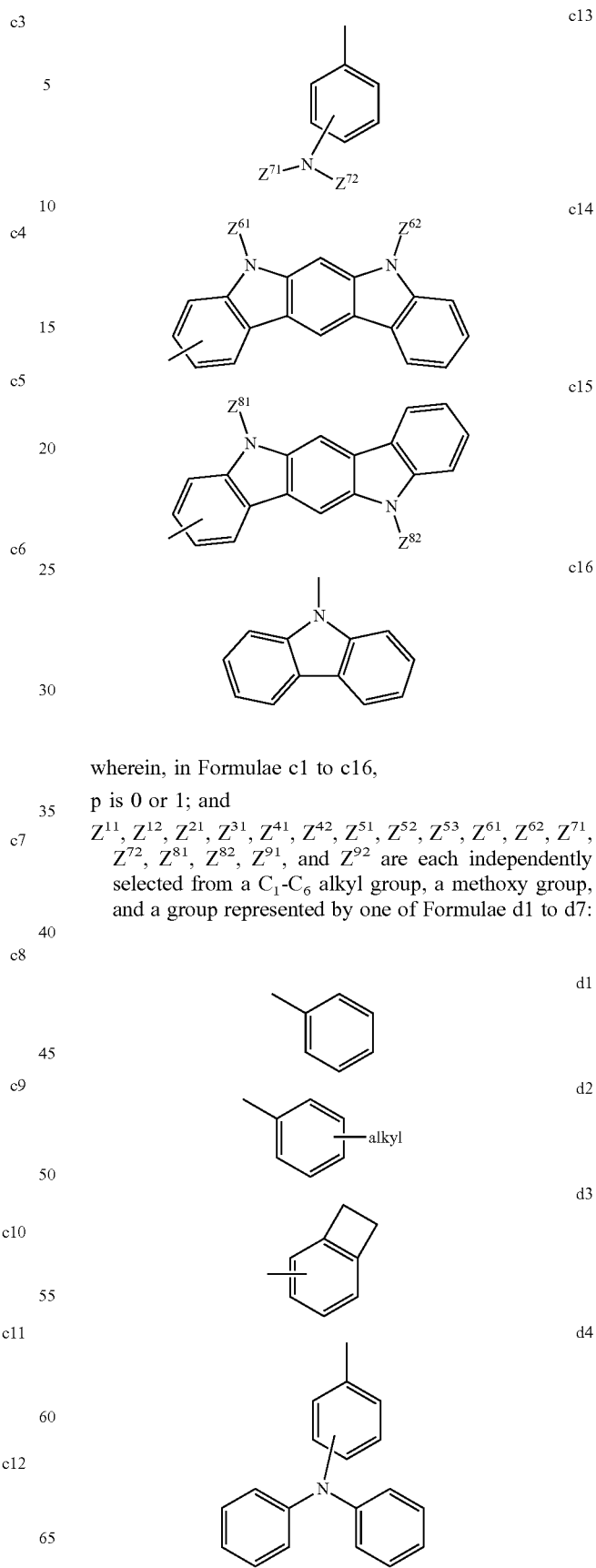
wherein, in Formulae c1 to c16,
p is 0 or 1; and
$Z^{11}$, $Z^{12}$, $Z^{21}$, $Z^{31}$, $Z^{41}$, $Z^{42}$, $Z^{51}$, $Z^{52}$, $Z^{53}$, $Z^{61}$, $Z^{62}$, $Z^{71}$, $Z^{72}$, $Z^{81}$, $Z^{82}$, $Z^{91}$, and $Z^{92}$ are each independently selected from a $C_1$-$C_6$ alkyl group, a methoxy group, and a group represented by one of Formulae d1 to d7:

-continued

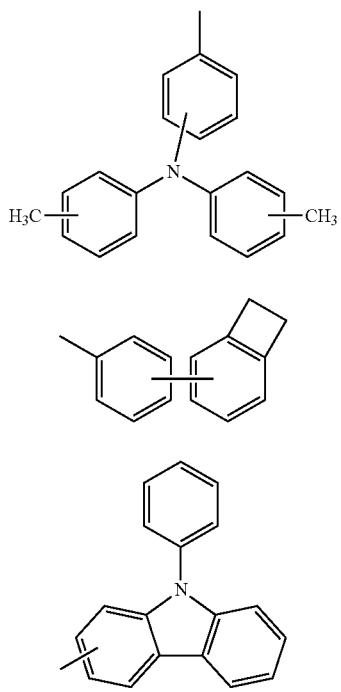

d5 d6 d7 wherein, in Formulae d1 to d7,
alkyl indicates a $C_1$-$C_6$ alkyl group;
$Y^{11}$, $Y^{12}$, $Y^{21}$, $Y^{31}$, $Y^{41}$, $Y^{42}$, $Y^{51}$, $Y^{52}$, $Y^{61}$, $Y^{62}$, and $Y^{63}$ are each independently a group represented by one of Formulae e1 to e11:

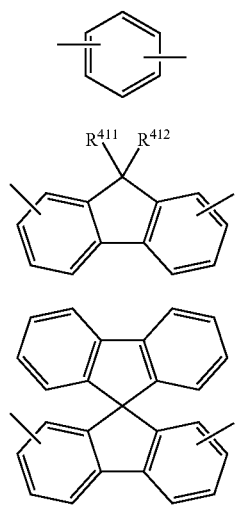

e1 e2 e3

-continued

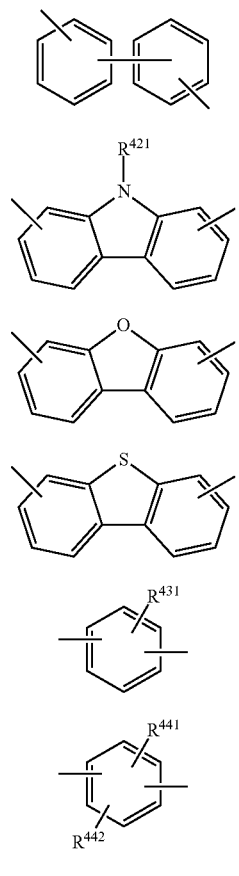

e4 e5 e6 e7 e8 e9 e10

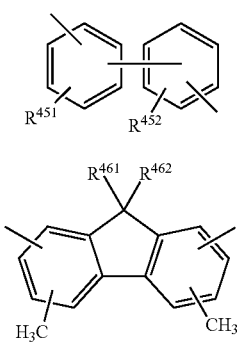

e11 wherein, in Formulae e1 to e11,
$R^{411}$, $R^{412}$, $R^{421}$, $R^{431}$, $R^{441}$, $R^{442}$, $R^{451}$, $R^{452}$, $R^{461}$, and $R^{462}$ are each independently selected from a hydrogen atom, a $C_1$-$C_6$ alkyl group, a phenyl group, and a tolyl group.

17. The organic light-emitting device of claim 16, wherein the organic film comprises at least one layer selected from a hole injection layer and a hole transport layer; and the at least one layer comprises the material.

* * * * *